United States Patent
Uzuka et al.

(10) Patent No.: US 6,690,584 B2
(45) Date of Patent: Feb. 10, 2004

(54) INFORMATION-PROCESSING DEVICE HAVING A CROSSBAR-BOARD CONNECTED TO BACK PANELS ON DIFFERENT SIDES

(75) Inventors: Yoshinori Uzuka, Kawasaki (JP); Yoshihiro Morita, Kawasaki (JP); Koji Hanada, Kawasaki (JP); Hajime Murakami, Kawasaki (JP); Yasushi Masuda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/811,694

(22) Filed: Mar. 20, 2001

(65) Prior Publication Data

US 2002/0018339 A1 Feb. 14, 2002

(30) Foreign Application Priority Data

Aug. 14, 2000 (JP) ........................................ 2000-246007

(51) Int. Cl.⁷ ................................................ H05K 7/18
(52) U.S. Cl. ................... 361/796; 361/778; 361/788; 361/810; 361/785; 439/65; 439/75
(58) Field of Search ................... 361/796, 788, 361/774, 778, 828, 832, 781, 784, 785, 810; 439/65, 75

(56) References Cited

U.S. PATENT DOCUMENTS

| 5,122,691 A | | 6/1992 | Balakrishnan | |
|---|---|---|---|---|
| 5,211,565 A | * | 5/1993 | Krajewski et al. | 361/735 |
| 5,335,146 A | * | 8/1994 | Stucke | 174/260 |
| 5,341,509 A | * | 8/1994 | Takashima | 361/749 |
| 5,352,123 A | | 10/1994 | Sample et al. | |
| 5,519,584 A | | 5/1996 | Siroky | |
| 5,733,137 A | | 3/1998 | Knoop | |
| 5,795,177 A | | 8/1998 | Hirono | |

FOREIGN PATENT DOCUMENTS

| JP | 61-179599 | 8/1986 |
|---|---|---|
| JP | 62-47193 | 3/1987 |
| JP | 63-100891 | 6/1988 |
| JP | 2-237199 | 9/1990 |
| JP | 5-314068 | 11/1993 |
| JP | 6-17289 | 3/1994 |
| JP | 6-77675 | 3/1994 |
| JP | 6-177561 | 6/1994 |
| JP | 6-334368 | 12/1994 |
| JP | 8-236969 | 9/1996 |
| JP | 9-130067 | 5/1997 |
| JP | 10-65368 | 3/1998 |
| JP | 10-504937 | 5/1998 |
| JP | 11-53077 | 2/1999 |
| JP | 11-135910 | 5/1999 |

* cited by examiner

Primary Examiner—David Martin
Assistant Examiner—Hung Bui
(74) Attorney, Agent, or Firm—Staas & Halsey LLP

(57) ABSTRACT

An information-processing device comprises at least one crossbar-board; a plurality of back panels detachably connected electrically and mechanically to different sides of the crossbar-board; and at least one motherboard detachably connected electrically and mechanically to each of the back panels. The crossbar-board has a switching element mounted thereon. The motherboard has an information-processing semiconductor element mounted thereon.

12 Claims, 41 Drawing Sheets

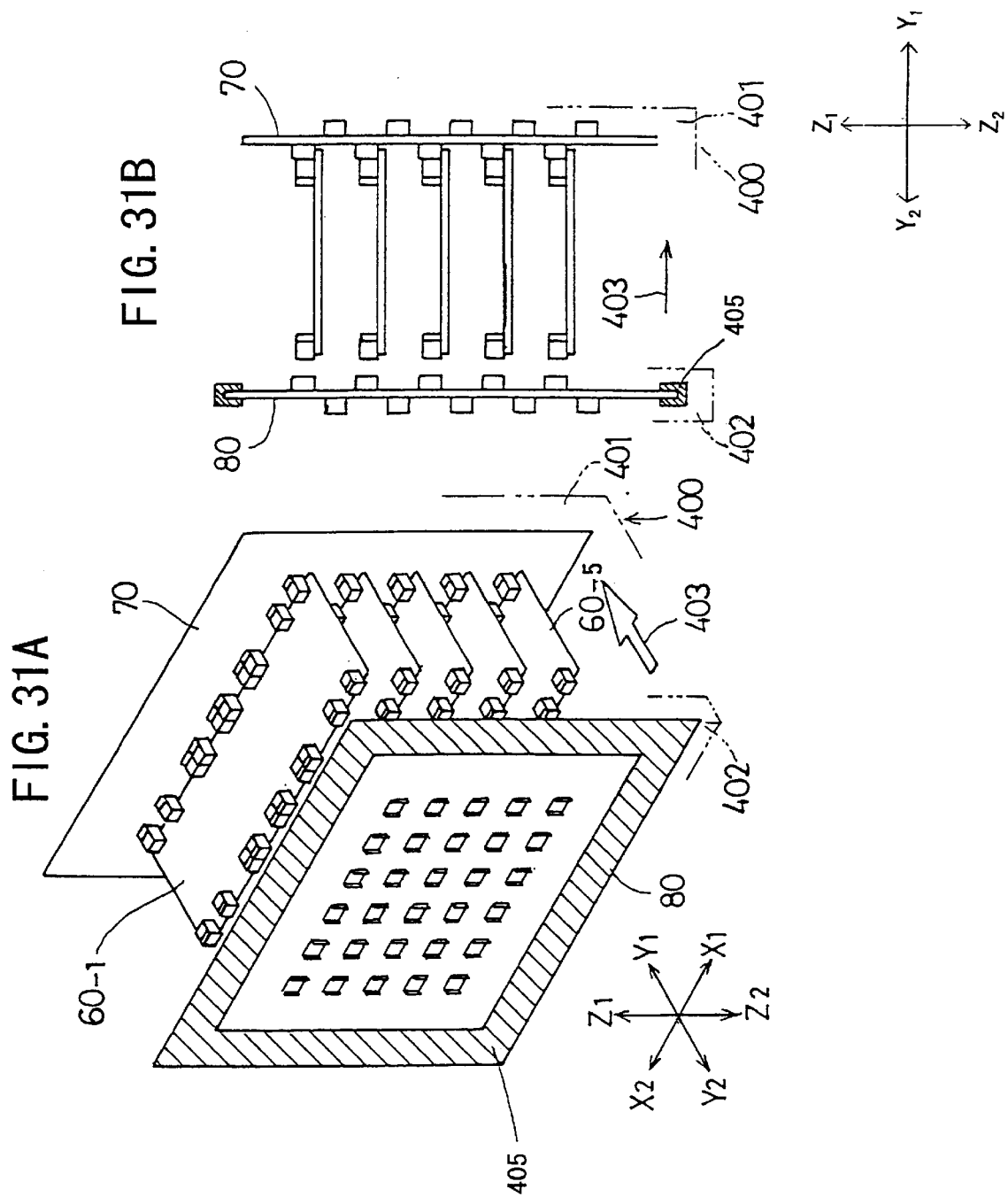

FIG. 35A
FIG. 35B
FIG. 35C
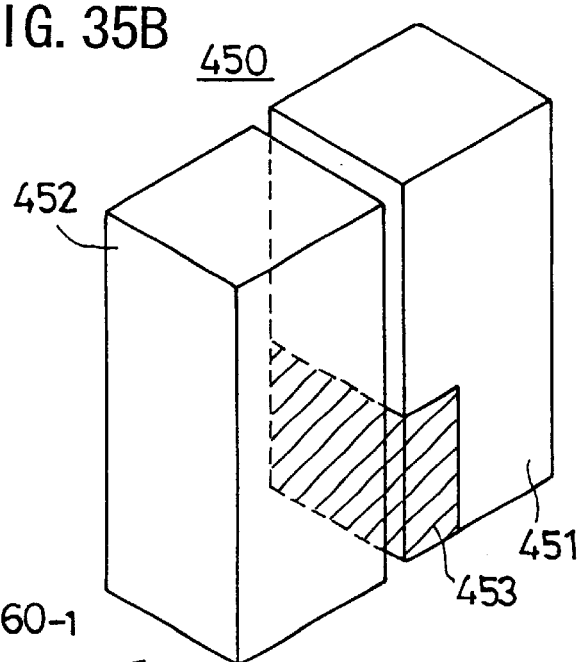
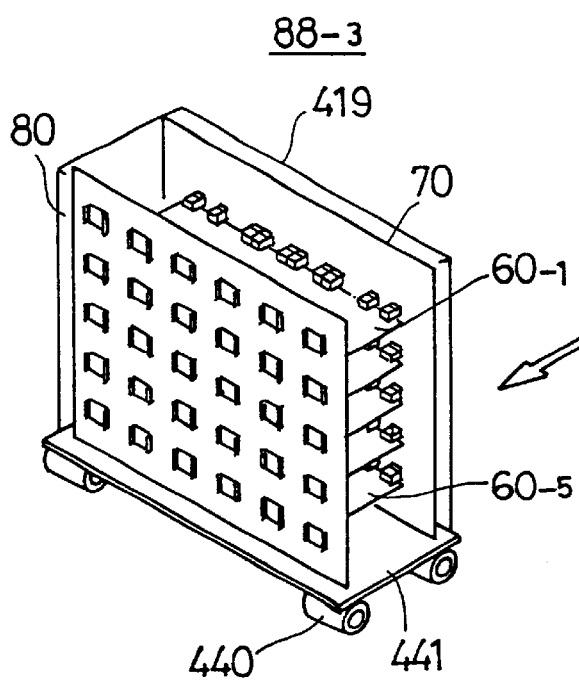
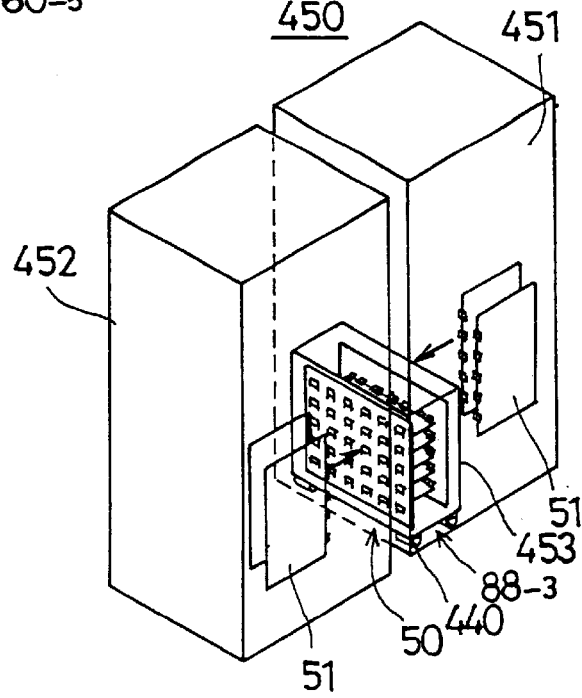

INFORMATION-PROCESSING DEVICE HAVING A CROSSBAR-BOARD CONNECTED TO BACK PANELS ON DIFFERENT SIDES

BACKGROUND OF THE INVENTION

1. Field of the Invention

The present invention generally relates to an information processing device and, more particularly, to a multiprocessor incorporated in a server.

Recently, as the Internet has rapidly become prevalent, the electronic commerce is undergoing a rapid expansion. In the electronic commerce, one has to exchange information with many and unspecified people or businesses, and has to process such information, necessitating a server capable of processing information at high speed. Such a server is required to be highly reliable, and further, to be as small as possible.

Such a server comprises a multiprocessor. Therefore, such a multiprocessor is required to be capable of processing information at high speed, to be highly reliable, and further, to be as small as possible.

One type of such a multiprocessor is an SMP (Symmetric Multiprocessor) wherein all of its CPUs share all of its memories and each of the CPUs accesses each of the memories at the same speed.

The SMP is further classified into a bus type and a crossbar-interconnect type. The bus type is a system wherein all of its CPUs share a single bus. The crossbar-interconnect type is a system wherein all of its CPUs are crossbar-connected to all of its memories, enabling a plurality of the CPUs to simultaneously access different memories. Thus, the crossbar-interconnect type has a better access property than the bus type.

2. Description of the Related Art

FIG. 1 is an illustration of a conventional multiprocessor 10 of the crossbar-interconnect type.

In general, a multiprocessor basically comprises: a backboard; a plurality of crossbar-boards connected to a backside thereof by connectors; and a plurality of motherboards plugged in and connected to a front of the backboard by the connectors. Since a backboard is limited in size due to reasons deriving from a manufacturing process thereof, the maximum number of motherboards connected to the backboard is eight, for example.

The above-mentioned multiprocessor 10 is capable of processing numerous information, and thus requires 16 motherboards, for example. Therefore, the multiprocessor 10 comprises two units 11 and 21 each having a backboard proper in size, the two units 11 and 21 being connected to each other by a multitude of cables 30.

The unit 11 comprises: a backboard 12; a plurality of crossbar-boards 13 connected to a backside thereof by connectors; and eight motherboards 14 plugged in and connected to a front of the backboard 12 by the connectors. The unit 21, in the same manner as the unit 11, comprises: a backboard 22; a plurality of crossbar-boards 23 connected to a backside thereof by connectors; and eight motherboards 24 plugged in and connected to a front of the backboard 22 by the connectors. Each of the motherboards 14 and 24 comprises: a board; and a CPU 15 and a memory module 16 each mounted thereon. Each of the plurality of crossbar-boards 13 and 23 comprises a board and a switching circuit 17 mounted thereon.

The plurality of crossbar-boards 13 of the unit 11 and the plurality of crossbar-boards 23 of the unit 21 are connected by the multitude of cables 30.

The CPUs 15 of the motherboards 14 of the unit 11 are connected to one another by wiring patterns on the crossbar-boards 13. Therefore, a transmission distance of signals between any two of the motherboards 14 is short. However, the CPUs 15 of the motherboards 14 of the unit 11 are connected to the CPUs 15 of the motherboards 24 of the unit 21 by the wiring patterns on the crossbar-boards 13, the cables 30 and wiring patterns on the crossbar-boards 23. Therefore, a transmission distance of signals between any one of the motherboards 14 and any one of the motherboards 24 is long, increasing the likelihood of causing distortion of transmitting signals. The distortion of transmitting signals occurs as an error when raising a transfer rate of signals. Therefore, the transfer rate of signals could not be raised, rather has to be kept low to avoid causing the distortion of transmitting signals. In this way, the multiprocessor 10 has a hindering problem in processing information at high speed.

Additionally, as described above, the multiprocessor 10 comprises the two units 11 and 21 connected to each other by the multitude of cables 30. Thus, manufacturing the multiprocessor 10 requires steps of connecting the multitude of cables 30 one by one. These steps of connecting are not only cumbersome but also prone to error. Further, when even a single cable of the multitude of cables 30 causes a poor connection, the multiprocessor 10 cannot operate normally. These respects arouse another problem in reliability.

Besides, as described above, the multiprocessor 10 comprises the two units 11 and 21 connected to each other by the cables 30, the cables increasing the size of the multiprocessor 10. This is a problem of inevitably increasing the size of a server comprising the multiprocessor 10.

SUMMARY OF THE INVENTION

It is a general object of the present invention to provide an improved and useful information processing device in which device the above-mentioned problems are eliminated.

A more specific object of the present invention is to provide an information processing device which can process information at high speed, with a reduced size and increased reliability.

In order to achieve the above-mentioned objects, there is provided according to one aspect of the present invention an information-processing device comprising:

- at least one crossbar-board having a switching element mounted thereon;
- a plurality of back panels detachably connected electrically and mechanically to different sides of the crossbar-board; and
- at least one motherboard detachably connected electrically and mechanically to each of the back panels, the motherboard having an information-processing semiconductor element mounted thereon.

Additionally, in the information-processing device according to the present invention, the crossbar-board may be arranged perpendicular to a surface of each of the back panels. Also, the motherboard may be arranged crosswise to the crossbar-board. Further, the back panels may be connected to the different sides of the crossbar-board by connectors. Likewise, the motherboard may be connected to each of the back panels by connectors.

According to the present invention, since the information-processing device does not comprise the cables, transmission distances of signals in the information-processing device become short by the length of the cables, reducing the likelihood of causing distortion of the transmitting signals. Thereby, a conventional limitation restricting a transfer rate of signals is eased, and accordingly, the transfer rate of the signals can be raised higher than a conventional information-processing device. In this way, the information-processing device according to the present invention can process information at a higher speed than a conventional information-processing device. Additionally, also since the information-processing device according to the present invention does not use the cables, the information-processing device can have a small structure in size. Further, since the information-processing device according to the present invention does not suffer a malfunction due to a poor connection of the cables, the information-processing device is more reliable than a conventional information-processing device.

In order to achieve the above-mentioned objects, there is provided according to another aspect of the present invention an information-processing device comprising:

a crossbar board-back panel assembly comprising a plurality of crossbar-boards each having a switching element mounted thereon, and a plurality of back panels detachably connected electrically and mechanically to different sides of each of the crossbar-boards; and a plurality of motherboards detachably connected electrically and mechanically to each of the back panels, each of the motherboards having an information-processing semiconductor element mounted thereon.

According to the present invention, the information-processing device can process information at a higher speed than a conventional information-processing device. Additionally, the information-processing device according to the present invention can have a small structure in size. Further, the information-processing device is more reliable than a conventional information-processing device.

Additionally, in the information-processing device according to the present invention, the crossbar-board further comprises wiring patterns connecting the switching element and the connectors, the wiring patterns being formed to have an equal length.

According to the present invention, transmission distances of signals between the motherboards are always the same, achieving an optimal SMP if the information-processing device is a multiprocessor.

Additionally, in the information-processing device according to the present invention, the crossbar-board may have a rectangular shape, and the back panels may be connected to longitudinal sides of the crossbar-board, the back panels opposing each other.

According to the present invention, the information-processing device can have a small structure in size.

Additionally, in the information-processing device according to the present invention, the crossbar-board may further comprise connectors connecting the longitudinal sides of the crossbar-board to the back panels, each of the connectors having a connecting face parallel to a surface of the crossbar-board, and the back panels may further comprise connectors respectively connecting the back panels to the longitudinal sides of the crossbar-board, each of the connectors having a connecting face perpendicular to a surface of each of the back panels, wherein the crossbar-board is movable in a direction perpendicular to the surface thereof so as to connect the connectors thereof to the connectors of the back panels.

According to the present invention, the crossbar-board can be replaced without disassembling the crossbar-board back panel assembly, enhancing a maintainability of the information-processing device.

Additionally, in the information-processing device according to the present invention, the crossbar-board may further comprise at least one extension crossbar-board connected at an end of the crossbar-board in a longitudinal direction.

According to the present invention, connecting the extension crossbar-board to the crossbar-board can provide an extra-long crossbar-board without using special facilities.

Additionally, in the information-processing device according to the present invention, the crossbar-board may have a polygonal shape, and the back panels may be connected to the different sides of the crossbar-board, the back panels being more than two.

According to the present invention, a number of the motherboards can be increased with maintaining a small structure, enhancing a capacity of the information-processing device to process information.

Additionally, in the information-processing device according to the present invention, each of the back panels may be formed by a plurality of strip panels arranged at positions corresponding to the motherboards, the strip panels crossing the crossbar-boards.

According to the present invention, each of the strip panels can be connected to the crossbar-boards smoothly. Consequently, the information-processing device can also be assembled smoothly.

Additionally, in the information-processing device according to the present invention, each of the back panels may be formed by a plurality of strip panels arranged at positions corresponding to the crossbar-boards, the motherboards crossing the strip panels.

According to the present invention, since each of the strip panels can be connected to the crossbar-boards smoothly, the information-processing device can also be assembled smoothly.

In order to achieve the above-mentioned objects, there is provided according to another aspect of the present invention a method of manufacturing a crossbar board-back panel assembly of an information-processing device comprising: the crossbar board-back panel assembly comprising a plurality of crossbar-boards arranged in parallel, and a plurality of back panels detachably connected electrically and mechanically to different sides of each of the crossbar-boards; and a plurality of motherboards detachably connected electrically and mechanically to each of the back panels, each of the motherboards having an information-processing semiconductor element mounted thereon, the method comprising the steps of:

holding each of the back panels while allowing the held back panel to move slightly in directions parallel to a surface thereof; and pressing the held back panel to one of the different sides of each of the crossbar-boards so that the held back panel is connected to the one of the different sides of each of the crossbar-boards.

According to the present invention, since each of the back panels are held while being allowed to move slightly in directions parallel to a surface thereof, connectors on the held back panel are smoothly connected to connectors on the different sides of the crossbar-boards. Therefore, the information-processing device can also be assembled smoothly.

Additionally, in the information-processing device according to the present invention, the strip panels may be supplied with different voltages.

According to the present invention, each of the motherboards can easily be supplied with different voltages.

In order to achieve the above-mentioned objects, there is provided according to another aspect of the present invention an information-processing device comprising:

- a crossbar board-back panel assembly comprising a plurality of rectangular crossbar-boards arranged in parallel, and two opposing back panels detachably connected electrically and mechanically to longitudinal sides of each of the crossbar-boards; and
- a plurality of motherboards detachably connected electrically and mechanically to each of the two opposing back panels, each of the motherboards having an information-processing semiconductor element mounted thereon,
- wherein the two opposing back panels are formed by a plurality of pairs of two opposing strip panels arranged at positions corresponding to each of the rectangular crossbar-boards, and
- the crossbar board-back panel assembly includes a plurality of crossbar board-strip panel assemblies piled up on each other, each of the crossbar board-strip panel assemblies comprising one of the rectangular crossbar-boards, and one of the pairs of the two opposing strip panels detachably connected electrically and mechanically to the longitudinal sides of the one of the rectangular crossbar-boards.

According to the present invention, the crossbar board-back panel assembly can be easily assembled by piling up a plurality of the crossbar board-strip panel assemblies on each other.

Additionally, in the information-processing device according to the present invention, the crossbar board-back panel assembly may further comprise a guide pole arranged upright so that the crossbar board-strip panel assemblies are piled up on each other with a hole formed in each of the rectangular crossbar-boards being passed through by the guide pole, and the crossbar board-strip panel assemblies are supplied with a voltage via the guide poles.

According to the present invention, the crossbar board-back panel assembly can be achieved that has a sustainable structure and can easily supply a voltage to the crossbar-boards and the strip panels.

Additionally, in the information-processing device according to the present invention, the crossbar board-back panel assembly may further comprise guide rails arranged horizontally so that the crossbar board-strip panel assemblies are piled up on each other with upper and under edges of each of the pairs of the two opposing strip panels being inserted into the guide rails, and the crossbar board-strip panel assemblies are supplied with a voltage via the guide rails.

According to the present invention, the crossbar board-back panel assembly can be achieved that has a sustainable structure and can easily supply a voltage to the crossbar-boards and the strip panels.

Additionally, the information-processing device according to the present invention may further comprise hollow heat-radiation components each placed between the crossbar-boards, wherein an air moves through inside of the hollow heat-radiation components.

According to the present invention, the information-processing device can be efficiently forced-air cooled.

Additionally, in the information-processing device according to the present invention, each of the back panels may comprise a grid-like frame and smaller panels than each of the back panels, the smaller panels arranged in the grid-like frame.

According to the present invention, the back panels can be easily enlarged.

Additionally, in the information-processing device according to the present invention, the smaller panels may be supplied with a voltage via the grid-like frame.

According to the present invention, the smaller panels can easily be supplied with a voltage.

Additionally, in the information-processing device according to the present invention, each of the back panels may comprise smaller panels than each of the back panels, the smaller panels detachably connected electrically and mechanically to each other.

According to the present invention, the smaller panels can easily be supplied with a voltage.

In order to achieve the above-mentioned objects, there is also provided according to another aspect of the present invention an information-processing device comprising:

- two grid-like frames opposing each other;
- a plurality of crossbar-boards fixed between the two grid-like frames;
- at least one motherboard fixed to each of the two grid-like frames, the motherboard having an information-processing semiconductor element mounted thereon; and
- a flexible connector connecting the motherboard and each of the crossbar-boards.

According to the present invention, since an air moves through the grid-like frames, the motherboard and the crossbar-boards can be efficiently forced-air cooled. In addition, since the information-processing device uses the flexible connector, the crossbar-boards can maintain a symmetrical effect of the equal-length wiring patterns thereof.

In order to achieve the above-mentioned objects, there is also provided according to another aspect of the present invention an information-processing device comprising:

- a crossbar board-back panel assembly comprising a plurality of crossbar-boards arranged in parallel, and a plurality of back panels detachably connected electrically and mechanically to different sides of each of the crossbar-boards; and
- a plurality of motherboards detachably connected electrically and mechanically to each of the back panels, each of the motherboards having an information-processing semiconductor element mounted thereon,
- wherein the crossbar board-back panel assembly includes a caster provided on the bottom thereof.

According to the present invention, the crossbar board-back panel assembly can be moved easily on the caster.

In order to achieve the above-mentioned objects, there is also provided according to another aspect of the present invention a server comprising:

- a body having a room to contain a crossbar board-back panel assembly comprising a plurality of crossbar-boards arranged in parallel, and a plurality of back panels detachably connected electrically and mechanically to different sides of each of the crossbar-boards; and
- the crossbar board-back panel assembly including a caster provided on the bottom thereof, the crossbar board-back panel assembly being contained in the room.

According to the present invention, the crossbar board-back panel assembly can be easily set to the server, and also can be easily removed from the server, enhancing a maintainability of the server.

Other objects, features and advantages of the present invention will become more apparent from the following detailed description when read in conjunction with the accompanying drawings.

BRIEF DESCRIPTION OF THE DRAWINGS

FIG. 31A is a perspective view showing a first assembling method of a crossbar board-back panel assembly shown in FIG. 2;

FIG. 31B is a side view showing the first assembling method of the crossbar board-back panel assembly shown in FIG. 2;

FIG. 35A is an illustration of a third variation of the crossbar board-back panel assembly shown in FIG. 2;

FIG. 35B is an illustration of a server including a room to contain the crossbar board-back panel assembly shown in FIG. 35A;

FIG. 35C is an illustration of the server shown in FIG. 35B containing the crossbar board-back panel assembly shown in FIG. 35A in the room;

DETAILED DESCRIPTION OF THE PREFERRED EMBODIMENTS

Figure 1:
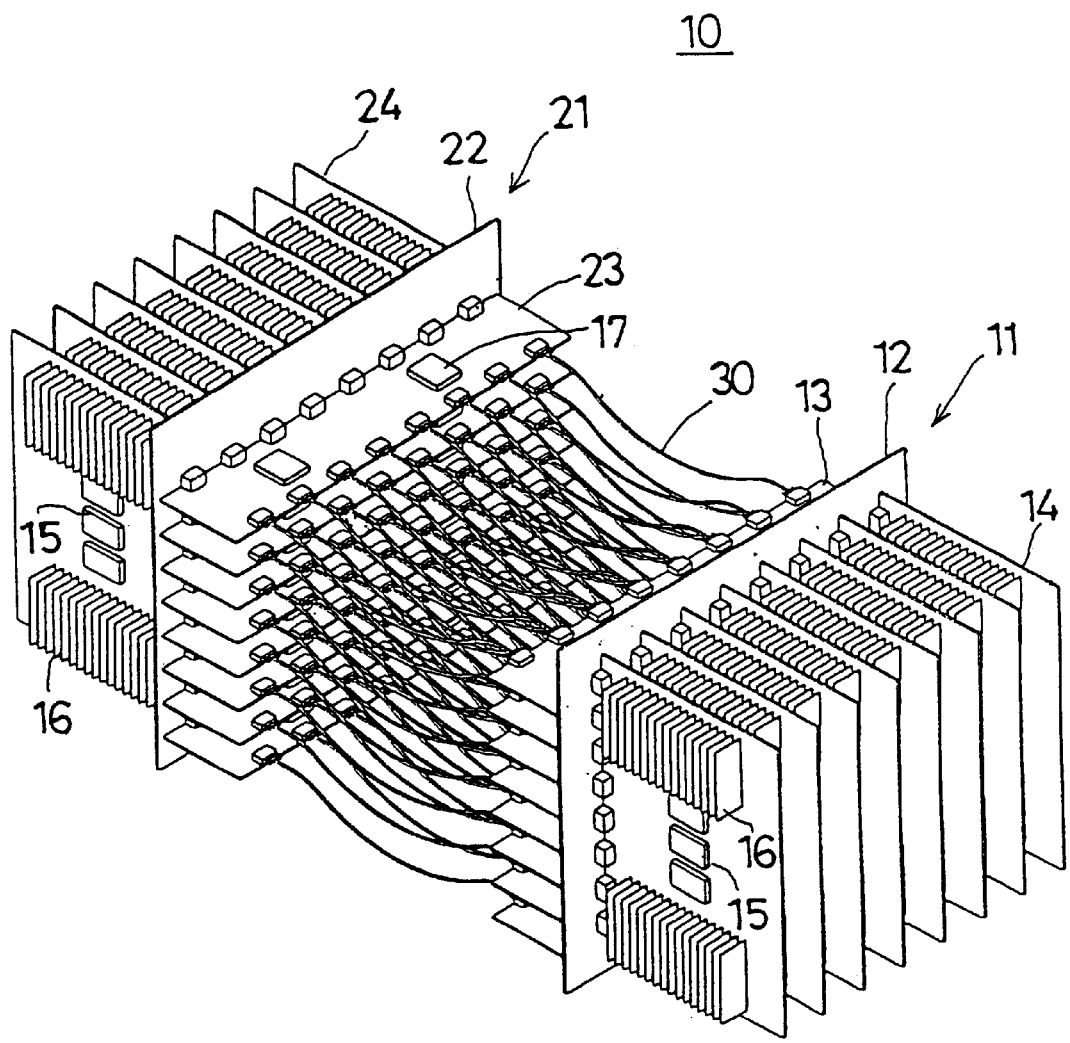
FIG. 1 is an illustration of a conventional multiprocessor of a crossbar-interconnect type.

A description will now be given, with reference to the drawings, of embodiments according to the present invention. It is noted that the essentially same elements are marked by the same reference characters, and with suffix reference characters when the essentially same elements need distinguishing in explanation.

1. First Embodiment

Figure 2:
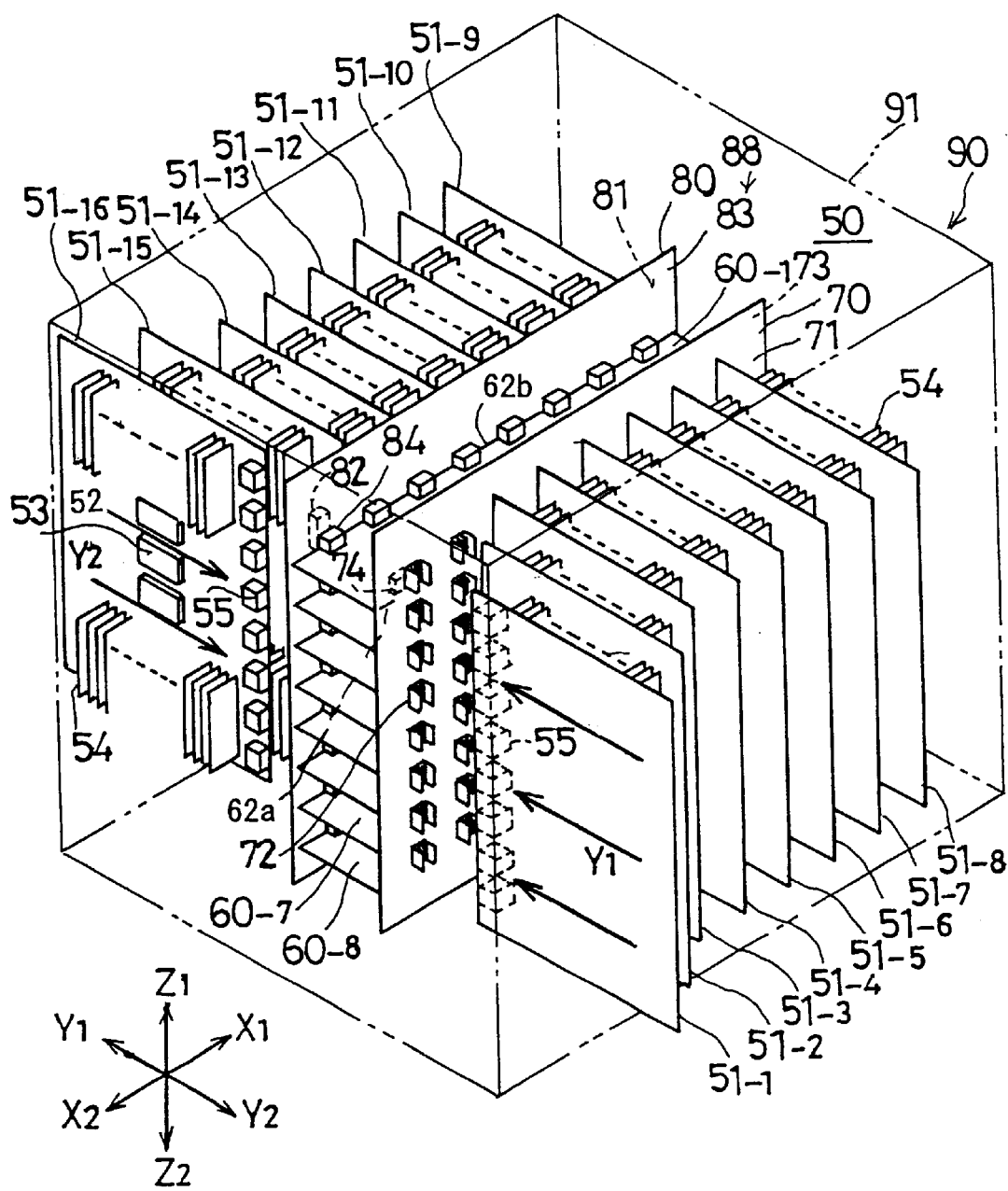
FIG. 2 is an illustration of a multiprocessor according to a first embodiment of the present invention.
Figure 3:
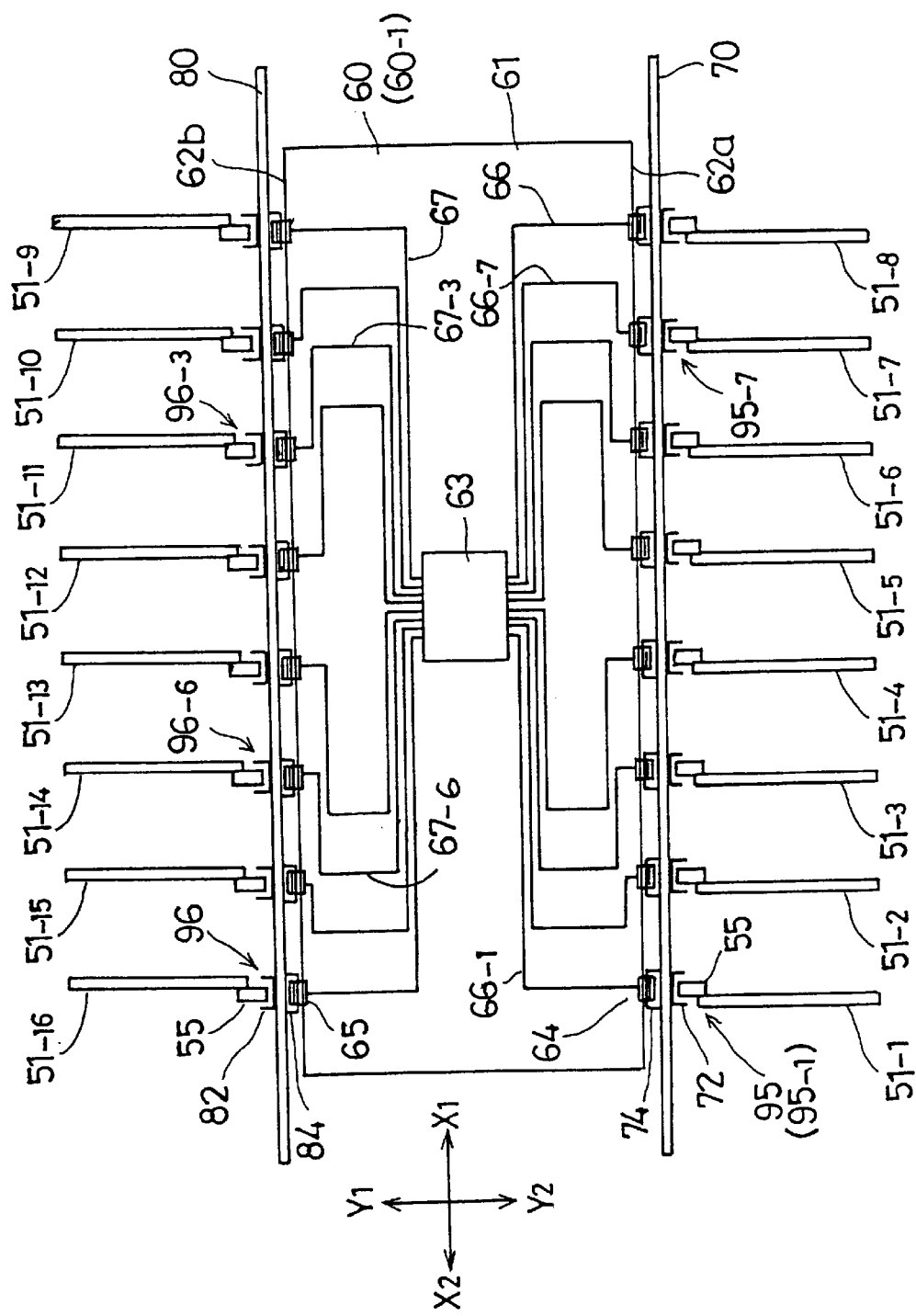
FIG. 3 is a plan view of the multiprocessor shown in FIG. 2.

FIG. 2 is an illustration of a multiprocessor 50 according to a first embodiment of the present invention. FIG. 3 is a plan view of the multiprocessor 50 shown in FIG. 2. The multiprocessor 50 is an SMP (Symmetric Multiprocessor) of the crossbar-interconnect type. The multiprocessor 50 includes 16 motherboards 51-1 to 51-16, and is capable of processing numerous information. The multiprocessor 50 is also capable of switching connections between any two motherboards 51-n selected from the 16 motherboards 51-1 to 51-16. A server 90 comprises the multiprocessor 50 in a shelf 91 indicated by a double dashed chain line in FIG. 2.

In FIG. 2 and FIG. 3, a direction X1-X2 shows a width direction, a direction Y1-Y2 shows a depth direction, and a direction Z1-Z2 shows a height direction. A plane X-Y is a horizontal plane, and a plane Y-Z and a plane X-Z are vertical planes.

The multiprocessor 50 comprises eight crossbar-boards 60-1 to 60-8, a first back panel 70, a second back panel 80 and the 16 motherboards 51-1 to 51-16.

Each of the eight crossbar-boards 60-1 to 60-8 is rectangular and is placed horizontal. The eight crossbar-boards 60-1 to 60-8 are aligned in the direction Z1-Z2 at regular intervals. However, depending on arrangements of connectors on the back panels 70 and 80, the crossbar-boards may be aligned at irregular intervals. This applies also to the following other embodiments.

The first back panel 70 is placed vertical, and is connected to a longitudinal side 62a of two longitudinal sides 62a and 62b at both sides of each of the eight crossbar-boards 60-1 to 60-8 by connectors.

The second back panel 80 is also placed vertical, and is connected to the other longitudinal side 62b of each of the eight crossbar-boards 60-1 to 60-8 by connectors.

Each of eight motherboards 51-1 to 51-8 of the 16 motherboards 51-1 to 51-16 is placed vertical, and is inserted into the first back panel 70 in a direction indicated by an arrow Y1 so as to be plugged in and connected thereto. The eight motherboards 51-1 to 51-8 are aligned in the direction X1-X2 at regular intervals.

Each of the other eight motherboards 51-9 to 51-16 is placed vertical, and is inserted into the second back panel 80 in a direction indicated by an arrow Y2 so as to be plugged in and connected thereto. The other eight motherboards 51-9 to 51-16 are aligned in the direction X1-X2 at regular intervals.

The motherboard 51 comprises: a board 52; a CPU 53 and a memory module 54 each mounted thereon; and a plurality of jack-connectors 55 fixed along an edge of the board 52 at an end in the direction indicated by the arrow Y1 or Y2 in which the motherboard 51 is inserted into the first or second back panel.

The first back panel 70 comprises: a plurality of plug-connectors 72 mounted on a surface 71 at which the motherboards 51 are connected; and a plurality of plug-connectors 74 mounted on a surface 73 at which the crossbar-boards 60 are connected.

The plurality of plug-connectors 72 on the surface 71 are used to connect the first back panel 70 and the motherboards 51, and are aligned in the direction Z1-Z2 in eight rows, the eight rows being aligned in the direction X1-X2 at regular intervals. The plurality of plug-connectors 74 on the surface 73 are used to connect the first back panel 70 and the crossbar-boards 60, and are aligned in the direction X1-X2 in eight rows, the eight rows being aligned in the direction Z1-Z2 at regular intervals.

Figure 4:
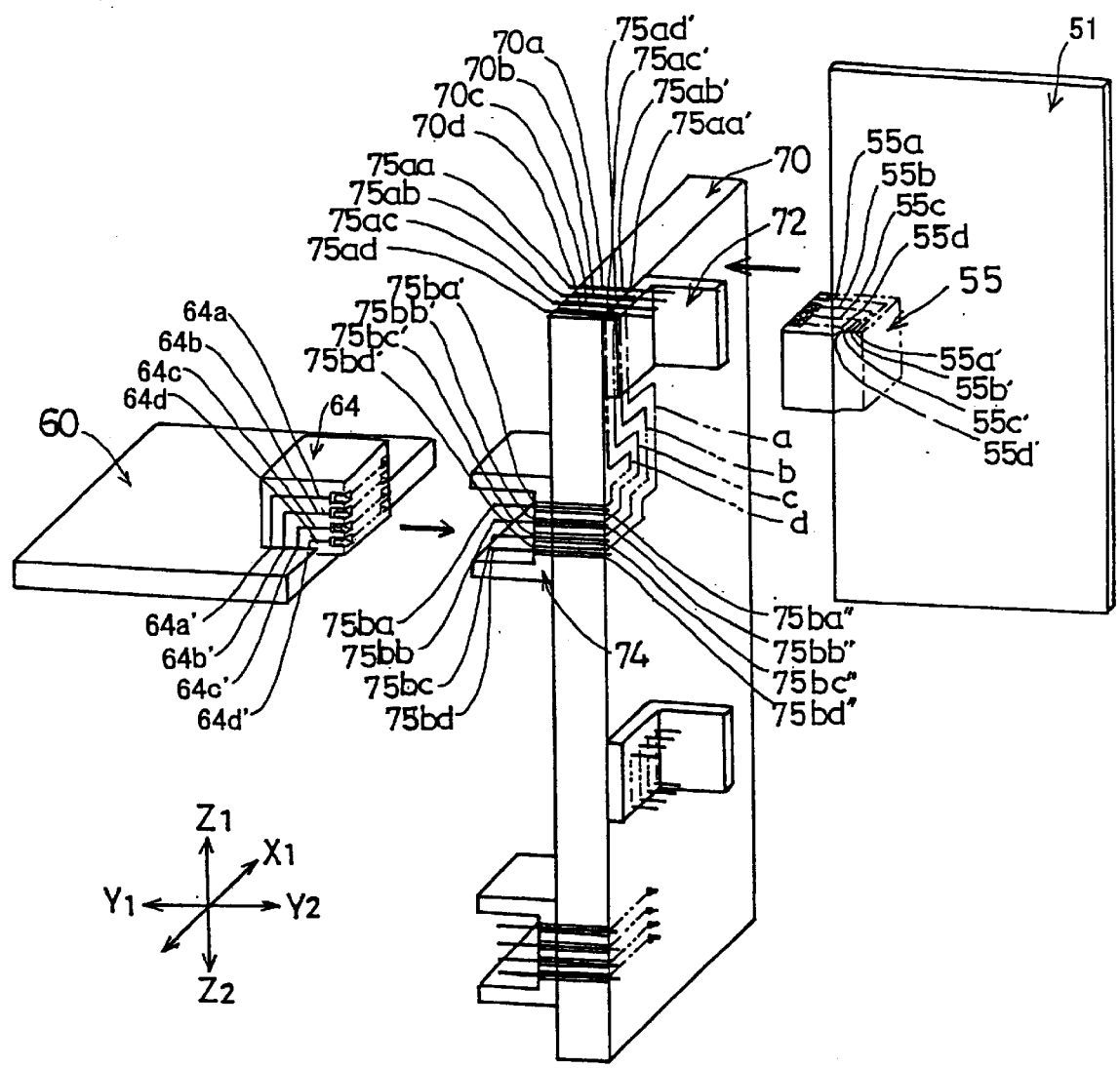
FIG. 4 is an illustration of a structure of a first back panel shown in FIG. 2.

FIG. 4 is an illustration of a structure of the first back panel 70 shown in FIG. 2. As shown magnified in FIG. 4, pins 75aa to 75ad of each of the plug-connectors 72 are electrically and mechanically connected to and held in through holes 70a to 70d formed in the first back panel 70, by soldering or press fitting. Also, pins 75ba to 75bd of each of the plug-connectors 74 on the opposite side to the plug-connectors 72 are electrically and mechanically connected to and held in the through holes 70a to 70d formed in the first back panel 70 by the same method. It should be noted that, although soldering or press fitting is employed as a method of mounting the plug-connectors 72 and 74 in the present embodiment, plug-connectors of a surface mount type are also usable as the plug-connectors 72 and 74.

Each of the plurality of jack-connectors 55 fixed on the motherboard 51 has connection pins 55a to 55d correspondent respectively to the pins 75aa to 75ad of the plug-connector 72. Thereby, the jack-connector 55 is engaged with the plug-connector 72. Each of a plurality of jack-connectors 64 fixed on the crossbar-board 60 has connection pins 64a to 64d correspondent respectively to the pins 75ba to 75bd of the plug-connector 74. Thereby, the jack-connector 64 is engaged with the plug-connector 74.

The pins 75aa to 75ad of the plug-connector 72 have an equal length, while the connection pins 55a to 55d of the jack-connector 55 have different lengths. Likewise, the pins 75ba to 75bd of the plug-connector 74 have an equal length, while the connection pins 64a to 64d of the jack-connector 64 have different lengths.

The lengths of these pins have relations shown by the following expressions. For conveniences' sake in explanation, the following expressions use the reference characters marking the pins as symbols representing the lengths thereof.

$$75aa=75ba=75ab=75bb=75ac=75bc=75ad=75bd(55a=64a)>(55b=64b)>(55c=64c)>(55d=64d)$$

The first back panel 70 has wiring patterns a to d connecting the plug-connector 72 and the plug-connector 74. The wiring pattern a connects the pin 75aa and the pin 75bd, the pin 75aa to be connected to the longest connection pin 55a of the jack-connector 55 and the pin 75bd to be connected to the shortest connection pin 64d of the jack-connector 64. The wiring pattern b connects the pin 75ab and the pin 75bc, the pin 75ab to be connected to the second longest connection pin 55b of the jack-connector 55 and the pin 75bc to be connected to the second shortest connection pin 64c of the jack-connector 64. Also, for the wiring pattern c and the wiring pattern d, the following shows connection paths from the jack-connector 55 to the jack-connector 64: as for the wiring pattern c, the second shortest connection pin 55c→the pin 75ac →the wiring pattern c→the pin 75bb →the second longest connection pin 64b; and, as for the wiring pattern d, the shortest connection pin 55d→the pin 75ad→the wiring pattern d→the pin 75ba→the longest connection pin 64a.

Here, when the connection pins of the jack-connectors 55 and 64 have relations represented by the equation "$(55a+64d)=(55b+64c)=(55c+64b)=(55d+64a)=$(a particular length)"

and the wiring patterns a to d of the first back panel 70 have an equal length, connection distances between connection points 55a' to 55d' of the jack-connector 55 on the motherboard 51 and connection points 64d' to 64a' of the jack-connector 64 on the crossbar-board 60, respectively, can all be made equal. With this method and an equal-length wiring on the crossbar-board, later described with reference to FIG.

Figure 6:
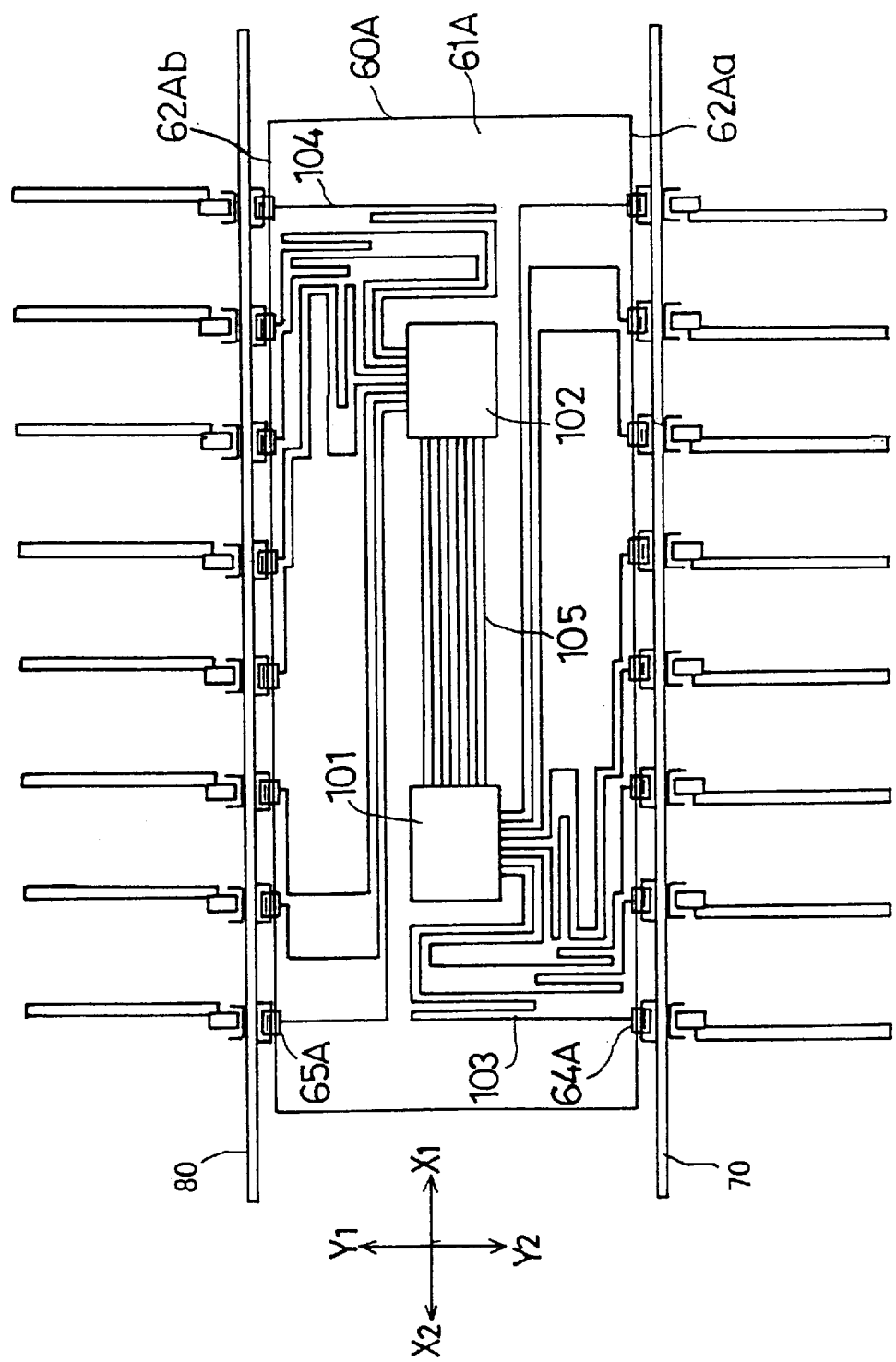
FIG. 6 is an illustration of a variation of a crossbar-board of the multiprocessor shown in FIG. 3.

3 and FIG. 6, a plurality of the motherboards can be connected to a switching circuit 63 (101 or 102 in FIG. 6) on the crossbar-board at an equal length.

Further, by equalizing connection distances between the CPU 53 (or other MEM elements) and the connection points 55a' to 55d' in each of the motherboards 51, a plurality of the CPUs 53 of the motherboards can be connected at an equal length through the first back panel 70 and the crossbar-board to the switching circuit thereon, whereby a transmission time of signals can be made equal. This achieves an optimal SMP.

In addition, even when the above-mentioned equation "(55a+64d)=(55b+64c)=(55c+64b)=(55d+64a)=(a particular length)" does not stand for the connection pins of the jack-connectors 55 and 64, adjusting the lengths of the wiring patterns a to d of the first back panel 70 can equalize all the connection distances between the connection points 55a' to 55d' of the jack-connector 55 on the motherboard 51 and the connection points 64d' to 64a' of the jack-connector 64 on the crossbar-board 60, respectively, resulting in the same effects.

This case is more apparent as shown below, using the following values, for example, as the lengths of the connection pins of the jack-connectors 55 and 64.

55a=64a=(5 mm); 55b=64b=(4 mm); 55c=64c=(3.5 mm); 55d=64d=(3 mm).

Then, (55a+64d)=(8 mm); (55b+64c)=7.5 mm; (55c+64b)=(7.5 mm); (55d+64a)=(8 mm).

Here, the above-mentioned equation "(55a+64d)=(55b+64c)=(55c+64b)=(55d+64a)=(a particular length)" does not stand.

However, arranging the lengths of the wiring patterns a to d of the first back panel 70 as follows can equalize all the connection distances between the connection points 55a'–55d' and the connection points 64d'–64a'.

(the length of the wiring pattern a)=(the length of the wiring pattern b)+((55a+64d)−(55b+64c))

(the length of the wiring pattern d)=(the length of the wiring pattern c)+((55d+64a)−(55c+64b))

(the length of the wiring pattern b)=(the length of the wiring pattern c)

This means that differences in the summed lengths of the corresponding connection pins of the jack-connectors are compensated by adjusting the lengths of the wiring patterns so that the connection distances between the connection points 55a'–55d' and the connection points 64d'–64a', respectively, can all be made equal.

This method is applicable, as follows, when the corresponding connection pins 55a–55d and 64d–64a of the jack-connectors are not actually connected yet, as shown in FIG. 4.

First, the pins 75aa–75ad and the pins 75bd–75ba are connected by the wiring patterns a–d, respectively, at a possible shortest length. Next, total connection distances including the lengths of the pins 75aa–75ad, the pins 75bd–75ba, the wiring patterns a–d, the connection pins 55a–55d and the connection pins 64d–64a, respectively, are calculated. Then, differences between the longest of the total connection distances and the other total connection distances are calculated. Finally, the differences are added to the lengths of the wiring patterns, respectively, achieving an equal-length connection on the first back panel 70.

Figure 5:
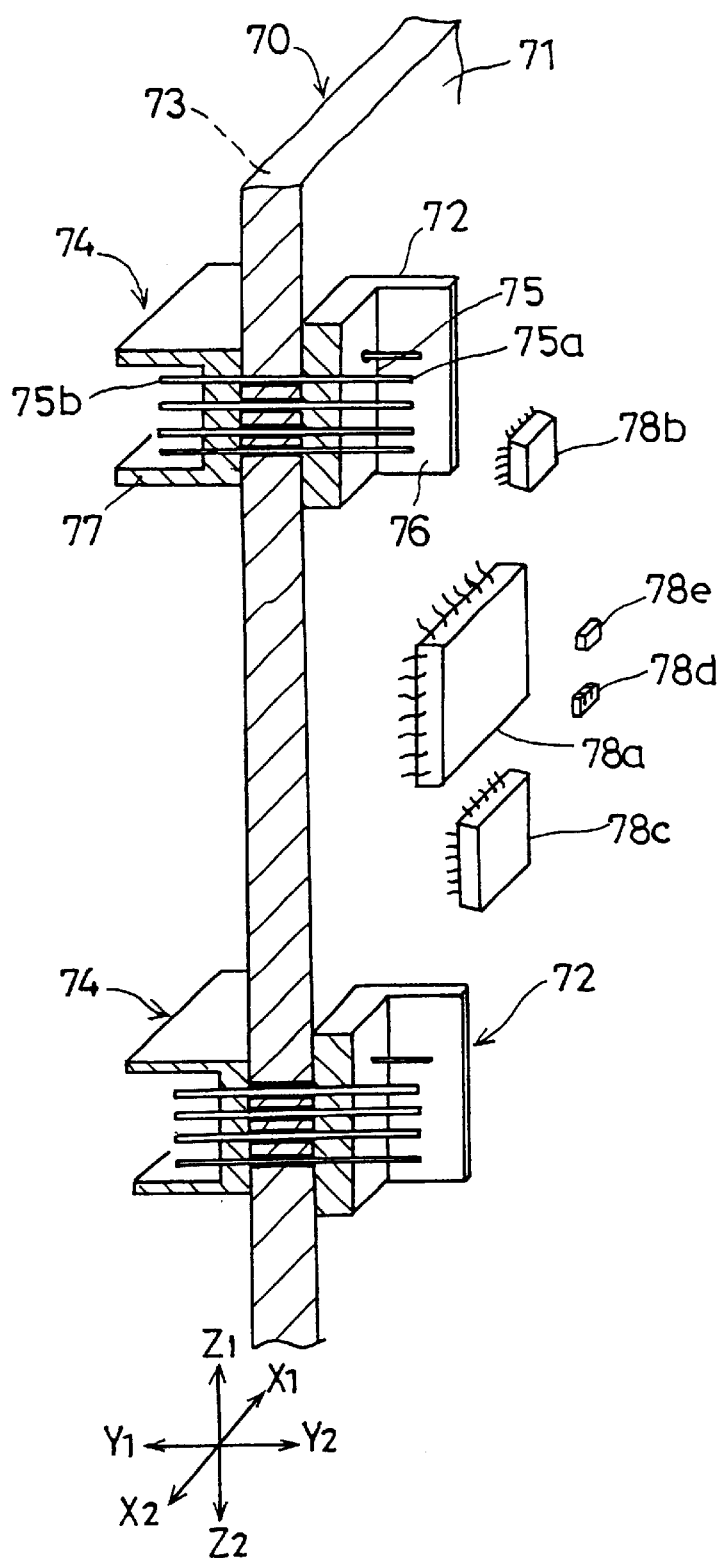
FIG. 5 is an illustration of a variation of the first back panel shown in FIG. 4.

Additionally, the first back panel 70 may comprise the plug-connectors 72 and 74 in a manner shown in FIG. 5. FIG. 5 is an illustration of a variation of the first back panel 70 shown in FIG. 4.

As shown in FIG. 5, a long pin terminal 75 passes through the first back panel 70. Each of the plug-connectors 72 has a shroud 76, one end 75a of the pin terminal 75 projecting within the shroud 76. Each of the plug-connectors 74 has a shroud 77, the other end 75b of the pin terminal 75 projecting within the shroud 77.

Also, as shown in FIG. 5, the first back panel 70 has the following elements mounted on the surface 71: an electronic component 78a having a switching function; an electronic component 78b having a passive driving function; an electronic component 78c having a memory or buffer function; a resistor 78d; and a capacitor 78e.

The first back panel 70 shown in FIG. 5 does not have the wiring patterns. Accordingly, in order to achieve an equal-length connection: first, connection distances between the connection points 55a' to 55d' of the jack-connector 55 on the motherboard 51 and the connection points 64d' to 64a' of the jack-connector 64 on the crossbar-board 60, respectively, are calculated; then, differences between the longest of the connection distances and the other connection distances are calculated; finally, the differences are adjusted in wiring patterns on the crossbar-board 60.

The second back panel 80 has the substantially same structure as the first back panel 70, the second back panel 80 comprising: a plurality of plug-connectors 82 mounted on a surface 81 at which the motherboards 51 are connected; and a plurality of plug-connectors 84 mounted on a surface 83 at which the crossbar-boards 60 are connected.

The plurality of plug-connectors 82 on the surface 81 are used to connect the second back panel 80 and the motherboards 51, and are aligned in the direction Z1-Z2 in eight rows, the eight rows being aligned in the direction X1-X2 at regular intervals. The plurality of plug-connectors 84 on the surface 83 are used to connect the second back panel 80 and the crossbar-boards 60, and are aligned in the direction X1-X2 in eight rows, the eight rows being aligned in the direction Z1-Z2 at regular intervals. The plug-connectors 82 and 84 have the same structures as the above-mentioned plug-connectors 72 and 74.

As shown in FIG. 3, each of the crossbar-boards 60 comprises: a board 61; the switching circuit 63 mounted at the center of the upper surface thereof; the eight jack-connectors 64 mounted along the longitudinal side 62a at positions corresponding to the plug-connectors 74 of the first back panel 70; and eight jack-connectors 65 mounted along the other longitudinal side 62b at positions corresponding to the plug-connectors 84 of the second back panel 80. The board 61 has: a plurality of wiring patterns 66 connecting the eight jack-connectors 64 and corresponding terminals of the switching circuit 63, respectively; and a plurality of wiring patterns 67 connecting the eight jack-connectors 65 and corresponding terminals of the switching circuit 63, respectively. Each of the plurality of wiring patterns 66 and the plurality of wiring patterns 67 is properly bent and has an equal length to another. That is, the crossbar-board 60 has an equal-length wiring wherein the plurality of wiring patterns 66 and the plurality of wiring patterns 67 between the switching circuit 63 and the jack-connectors 64 and 65, respectively, have the same length.

The eight jack-connectors 64 of the crossbar-board 60 are connected to the plug-connectors 74 of the first back panel 70. The eight jack-connectors 65 of the crossbar-board 60 are connected to the plug-connectors 84 of the second back panel 80. Therefore, the first back panel 70 and the second back panel 80 flank the crossbar-board 60 at both sides thereof.

Here, a connection part of the jack-conneceter 55, the plug-connector 72, the plug-connector 74 and the jack-conneceter 64 is referred to as a first connection part 95. Also, a connection of the jack-connecter 55, the plug-connector 82, the plug-connector 84 and the jack-connecter 65 is referred to as a second connection part 96.

In the multiprocessor 50 having the above-mentioned structure, any two of the motherboards 51-1 to 51-16 can be connected to each other in the following three manners of connection. It is noted that a connection between any two of the motherboards 51-1 to 51-16 means, for conveniences' sake in explanation, a connection between the CPU 53 of one motherboard 51 and the memory module 54 of the other motherboard 51.

(1) A connection between any two of the motherboards 51-1 to 51-8 plugged in and connected to the first back panel 70.

For example, the motherboards 51-1 and 51-7 are connected by the first connection part 95-1, the wiring pattern 66-1, the switching circuit 63, the wiring pattern 66-7 and the first connection part 95-7.

(2) A connection between any two of the motherboards 51-9 to 51-16 plugged in and connected to the second back panel 80.

For example, the motherboards 51-11 and 51-14 are connected by the second connection part 96-3, the wiring pattern 67-3, the switching circuit 63, the wiring pattern 67-6 and the second connection part 96-6.

(3) A connection between any one of the motherboards 51-1 to 51-8 plugged in and connected to the first back panel 70 and any one of the motherboards 51-9 to 51-16 plugged in and connected to the second back panel 80.

For example, the motherboards 51-1 and 51-11 are connected by the first connection part 95-1, the wiring pattern 66-1, the switching circuit 63, the wiring pattern 67-3 and the second connection part 96-3.

It should be noted that, when a signal is transmitted by the CPU 53 to the memory module 54 of the same motherboard 51, the signal is transmitted via the switching circuit 63 of the crossbar-board 60 whereat the signal is turned back. In this case, a transmission distance of the signal is equal to cases according to the above-mentioned manners of connections (1) to (3). Accordingly, an access speed of the CPU 53 to the memory module 54 of the same motherboard 51 is equal to the cases according to the above-mentioned manners of connections (1) to (3).

The above-mentioned multiprocessor 50 has the following features.

1. The multiprocessor 50 is capable of processing information at a higher speed than a conventional multiprocessor.

Connection paths according to the above-mentioned manners of connections (1) to (3) have an equal length. This length is still shorter than the connection path of the conventional multiprocessor 10 by the length of the cable 30.

Hence, transmission distances of signals in the multiprocessor 50 become short, reducing the likelihood of causing distortion of the transmitting signals. Thereby, the conventional limitation restricting a transfer rate of signals is eased, and accordingly, the transfer rate of the signals can be raised higher than the conventional multiprocessor 10. In this way, the multiprocessor 50 can process information at a higher speed than a conventional multiprocessor.

2. The multiprocessor 50 is an optimal SMP.

Since the connection paths according to the above-mentioned manners of connections (1) to (3) have an equal length, the transmission distances of signals in the multiprocessor 50 are always the same, regardless of the manners of connections. Accordingly, each of the CPUs 53 of the plurality of the motherboards 51 accesses each of the memory modules 54 of the plurality of the motherboards 51 at an equal speed, achieving an optimal SMP.

3. The multiprocessor 50 can have a structure smaller in size than a conventional multiprocessor.

Since the multiprocessor 50 does not use the cables 30 unlike the conventional multiprocessor 10, the multiprocessor 50 can have a small structure in size.

Accordingly, since the multiprocessor 50 is small in size, the server 90 can also have a small structure of, for example, 1800 mm in height, 1000 mm in width and 1000 mm in depth.

4. The multiprocessor 50 is more reliable than a conventional multiprocessor.

Since the multiprocessor 50 does not have the cables 30, the multiprocessor 50 does not suffer a malfunction due to a poor connection of the cables.

In FIG. 2, it is noted that a crossbar board-back panel assembly 88 comprises the crossbar-boards 60-1 to 60-8, the first back panel 70 and the second back panel 80.

FIG. 6 is an illustration of a crossbar-board 60A, which is a variation of the crossbar-board 60 of the multiprocessor 50, along with the first back panel 70 and the second back panel 80.

As shown in FIG. 6, the crossbar-board 60A comprises: a board 61A; a first switching circuit 101 mounted on a X2 side of the upper surface of the board 61A; a second switching circuit 102 mounted on a X1 side of the upper surface of the board 61A; and eight jack-connectors 64A and eight jack-connectors 65A mounted at the same positions as the eight jack-connectors 64 and the eight jack-connectors 65, respectively, shown in FIG. 3. The board 61A has: a plurality of wiring patterns 103 connecting the eight jack-connectors 64A and corresponding terminals of the first switching circuit 101, respectively; a plurality of wiring patterns 104 connecting the eight jack-connectors 65A and corresponding terminals of the second switching circuit 102, respectively; and a plurality of wiring patterns 105 connecting the first switching circuit 101 and the second switching circuit 102. Each of the plurality of wiring patterns 103 is properly bent and has an equal length to another. Likewise, each of the plurality of wiring patterns 104 is properly bent and has an equal length to another. Additionally, each of the plurality of wiring patterns 105 has an equal length to another. Here, the wiring pattern 103 has an equal length to the wiring pattern 104. That is, the crossbar-board 60A also has an equal-length wiring.

Any two of the motherboards 51-1 to 51-16 are connected to each other with the length of a connection path always being equal.

2. Second Embodiment

Figure 7:
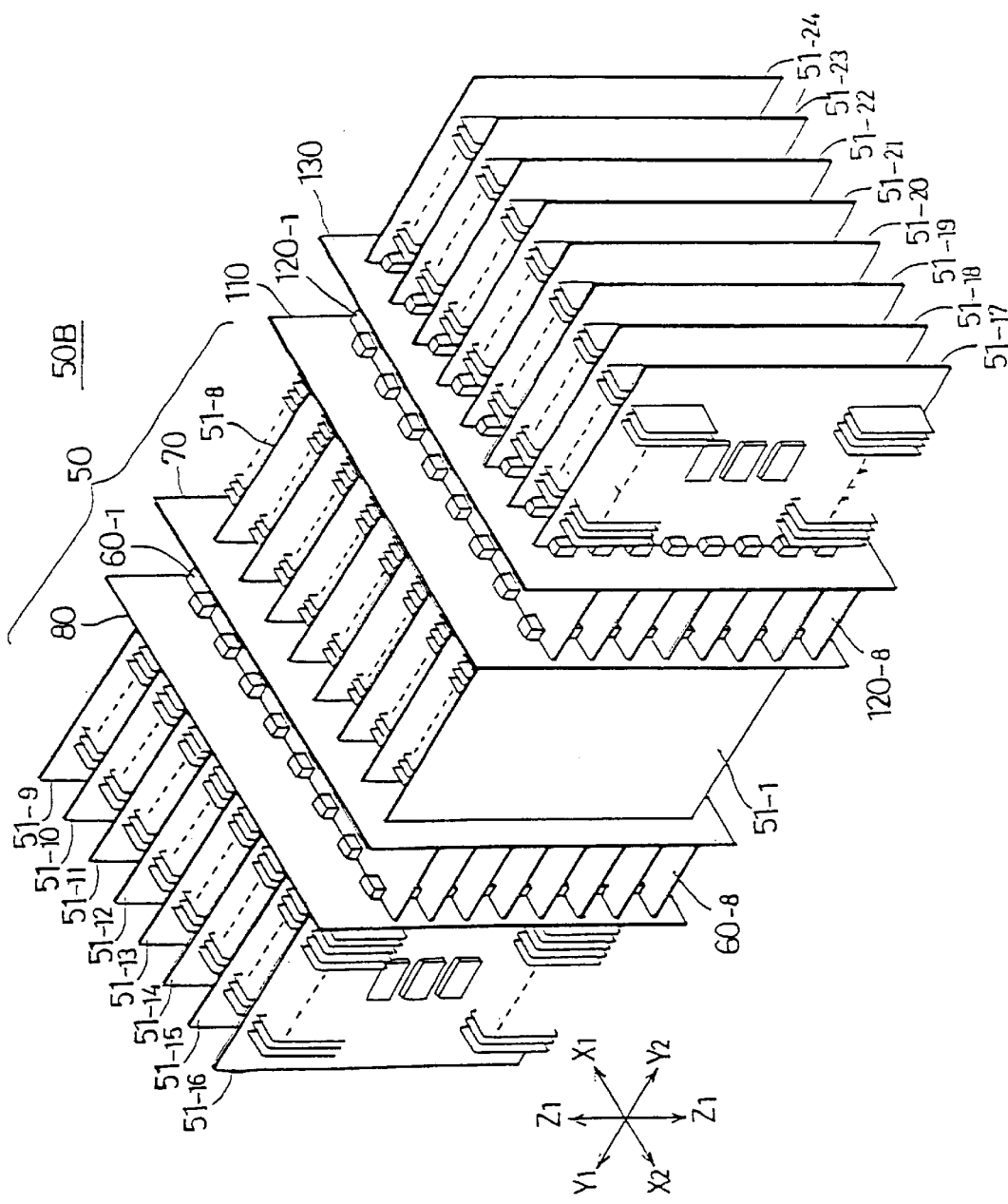
FIG. 7 is an illustration of a multiprocessor according to a second embodiment of the present invention.

FIG. 7 is an illustration of a multiprocessor 50B according to a second embodiment of the present invention. The multiprocessor 50B is an SMP (Symmetric Multiprocessor) of the crossbar-interconnect type. The multiprocessor 50B includes eight more motherboards than the multiprocessor 50 shown in FIG. 2, totaling 24 motherboards 51-1 to 51-24.

The multiprocessor 50B has a structure based on the multiprocessor 50 shown in FIG. 2, and further comprises the motherboards 51-17 to 51-24 extensively added in the direction indicated by the arrow Y2. It is noted that extensively added boards and panels are given names including the word "extension".

The multiprocessor 50B comprises: the multiprocessor 50 shown in FIG. 2; a first extension back panel 110 connected by connectors to an edge of the motherboards 51-1 to 51-8 in the direction indicated by the arrow Y2; eight extension crossbar-boards 120-1 to 120-8 connected by connectors to a surface of the first extension back panel 110 in the direction indicated by the arrow Y2, each of the eight extension crossbar-boards 120-1 to 120-8 being placed horizontal and aligned in the direction Z1-Z2 at regular intervals; a second extension back panel 130 connected by connectors to an edge of the eight extension crossbar-boards 120-1 to 120-8 in the direction indicated by the arrow Y2; and the eight extension motherboards 51-17 to 51-24 connected by connectors to a surface of the second extension back panel 130 in the direction indicated by the arrow Y2, each of the eight extension motherboards 51-17 to 51-24 being placed vertical and aligned in the direction X1-X2 at regular intervals.

Further, the multiprocessor 50B may comprise more motherboards 51 extensively added in the direction indicated by the arrow Y1 or Y2.

The multiprocessor 50B provides the same effects as the above-mentioned multiprocessor 50.

3. Third Embodiment

Figure 8:
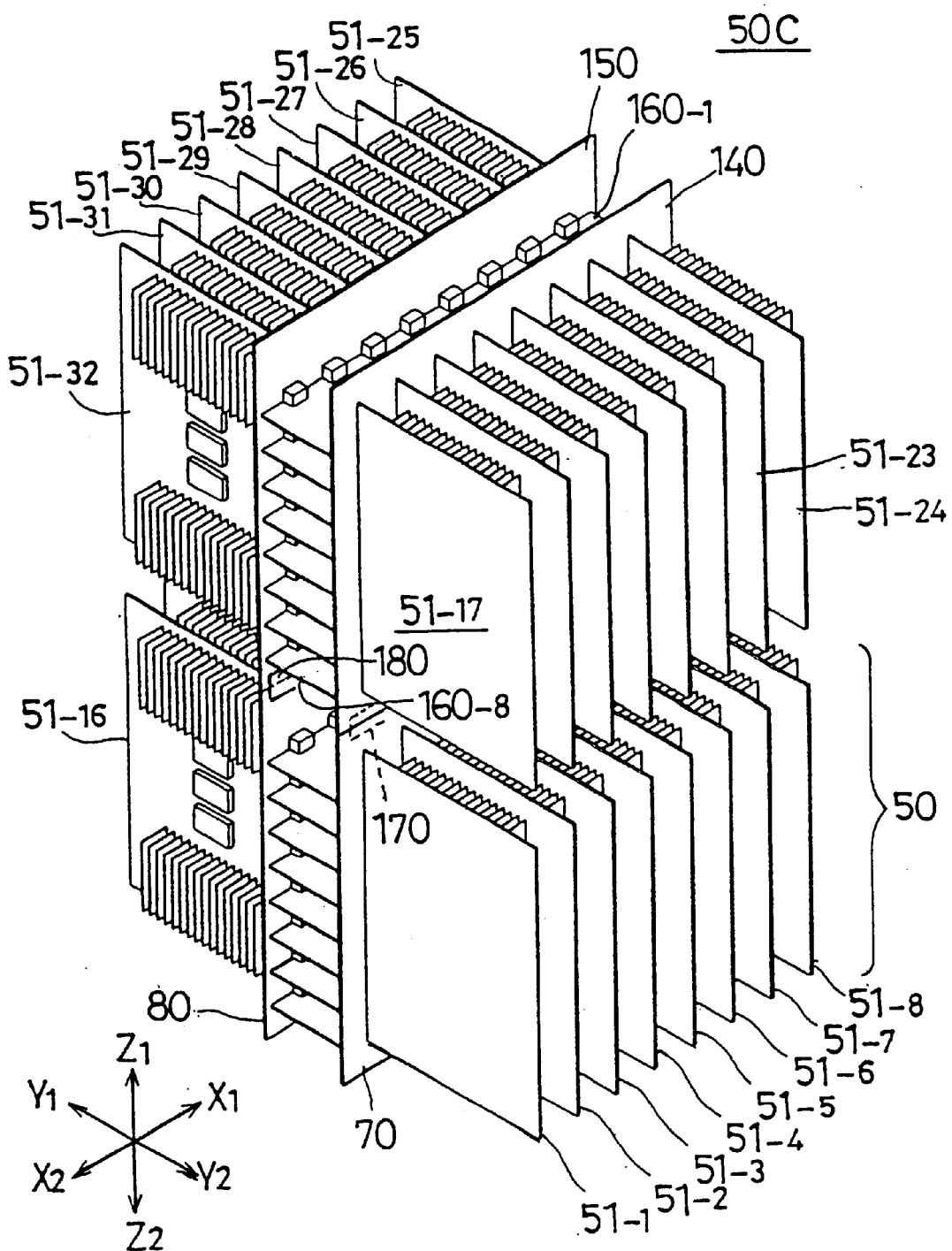
FIG. 8 is an illustration of a multiprocessor according to a third embodiment of the present invention.

FIG. 8 is an illustration of a multiprocessor 50C according to a third embodiment of the present invention. The multiprocessor 50C is an SMP (Symmetric Multiprocessor) of the crossbar-interconnect type. The multiprocessor 50C includes 16 more motherboards than the multiprocessor 50 shown in FIG. 2, totaling 32 motherboards 51-1 to 51-32.

The multiprocessor 50C basically has a structure comprising the multiprocessor 50 shown in FIG. 2; and another multiprocessor 50 placed thereupon. In other words, the multiprocessor 50B comprises: the multiprocessor 50; and the motherboards 51-17 to 51-32 and other elements extensively added in the direction indicated by an arrow Z1. It is noted that extensively added boards and panels are given names including the word "extension".

The multiprocessor 50C comprises: the multiprocessor 50 shown in FIG. 2; a first extension back panel 140 extensively connected by a connector 170 to an edge of the first back panel 70 in the direction indicated by the arrow Z1; a second extension back panel 150 extensively connected by a connector 180 to an edge of the second back panel 80 in the direction indicated by the arrow Z1; eight extension crossbar-boards 160-1 to 160-8 connected by connectors to opposing surfaces of the first extension back panel 140 and the second extension back panel 150, each of the eight extension crossbar-boards 160-1 to 160-8 being placed horizontal and aligned in the direction Z1-Z2 at regular intervals; eight extension motherboards 51-17 to 51-24 connected by connectors to a surface of the first extension back panel 140 in the direction indicated by the arrow Y2, each of the eight extension motherboards 51-17 to 51-24 being placed vertical and aligned in the direction X1-X2 at regular intervals; and eight extension motherboards 51-25 to 51-32 connected by connectors to a surface of the second extension back panel 150 in the direction indicated by the arrow Y1, each of the eight extension motherboards 51-25 to 51-32 being placed vertical and aligned in the direction X1-X2 at regular intervals.

Further, the multiprocessor 50C may comprise more motherboards 51 extensively added in the direction indicated by the arrow Z1 or Z2.

The multiprocessor 50C provides the same effects as the above-mentioned multiprocessor 50.

4. Fourth Embodiment

Figure 9:
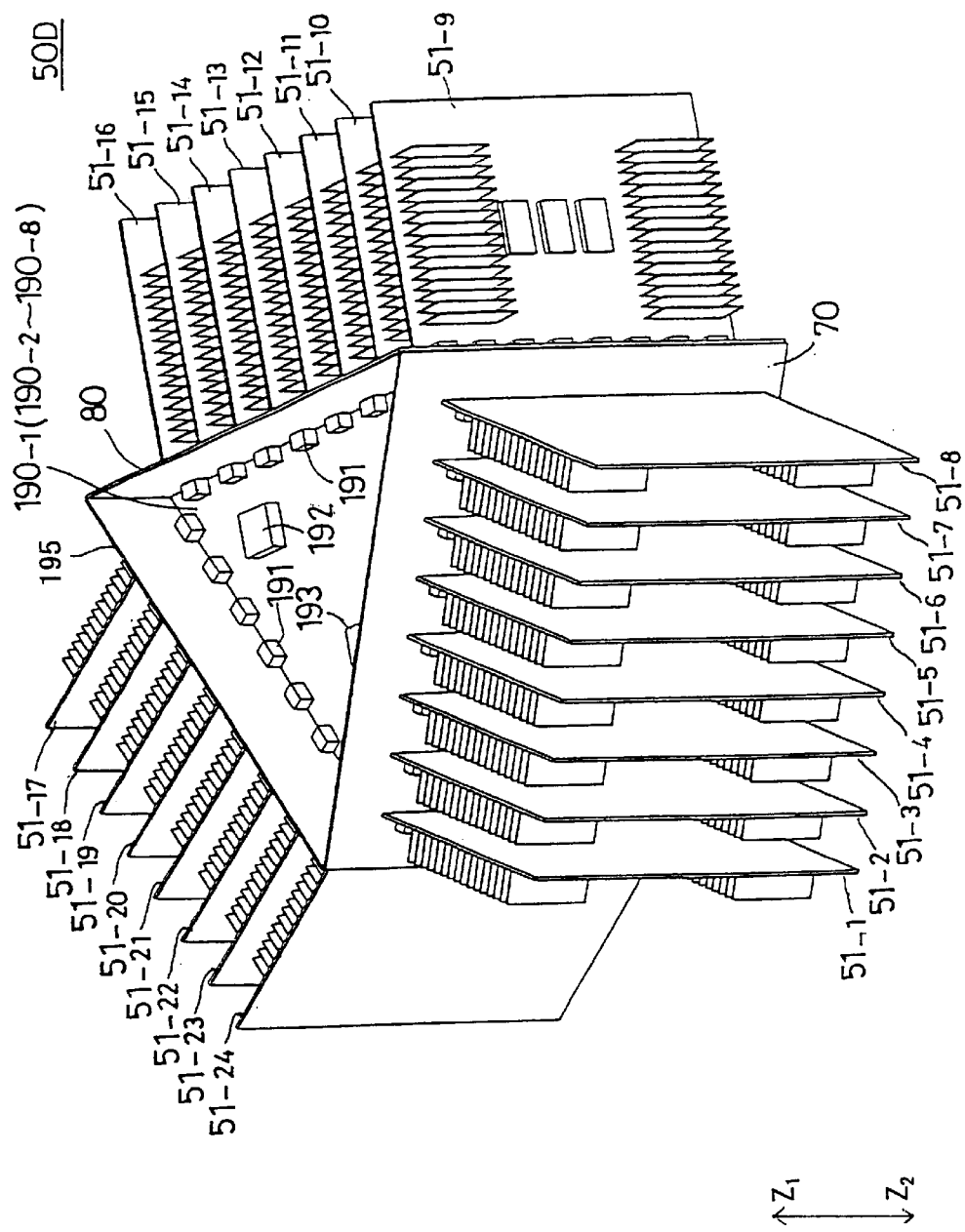
FIG. 9 is an illustration of a multiprocessor according to a fourth embodiment of the present invention.

FIG. 9 is an illustration of a multiprocessor 50D according to a fourth embodiment of the present invention. The multiprocessor 50D is an SMP (Symmetric Multiprocessor) of the crossbar-interconnect type. The multiprocessor 50D includes eight more motherboards than the multiprocessor 50 shown in FIG. 2, totaling 24 motherboards 51-1 to 51-24, and is characterized in having a prismatic shape.

The multiprocessor 50D comprises: eight crossbar-boards 190-1 to 190-8; the first back panel 70; the second back panel 80; a third back panel 195; and the 24 motherboards 51-1 to 51-24.

Each of the eight crossbar-boards 190-1 to 190-8 is an equilateral triangle, and comprises: a plurality of connecters 191 mounted along three laterals thereof; and switching circuits 192 and 193 mounted on the upper surface of each of the eight crossbar-boards 190-1 to 190-8. Each of the eight crossbar-boards 190-1 to 190-8 is placed horizontal and aligned in the direction Z1-Z2 at regular intervals.

The first back panel 70, the second back panel 80 and the third back panel 195 are each placed vertical, and are connected by connecters to three sides of the eight crossbar-boards 190-1 to 190-8, forming a shape of an equilaterally triangular prism.

The motherboards 51-1 to 51-8, the motherboards 51-9 to 51-16 and the motherboards 51-17 to 51-24 are connected by connecters to the first back panel 70, the second back panel 80 and the third back panel 195, respectively. Each of the motherboards 51-1 to 51-8, the motherboards 51-9 to 51-16 and the motherboards 51-17 to 51-24 is placed vertical. The motherboards 51-1 to 51-8, the motherboards 51-9 to 51-16 and the motherboards 51-17 to 51-24 are aligned widthwise of the first back panel 70, the second back panel 80 and the third back panel 195, respectively.

The multiprocessor 50D provides the same effects as the above-mentioned multiprocessor 50.

Further, the multiprocessor 50D may comprise crossbar-boards having a shape of a square, a regular pentagon, a regular hexagon, other regular polygons, a triangle, a quadrilateral, a pentagon, a hexagon, or other polygons, etc. Thereby, the multiprocessor 50D has a prismatic shape in accordance with the shape of the crossbar-boards.

5. Fifth Embodiment

Figure 10:
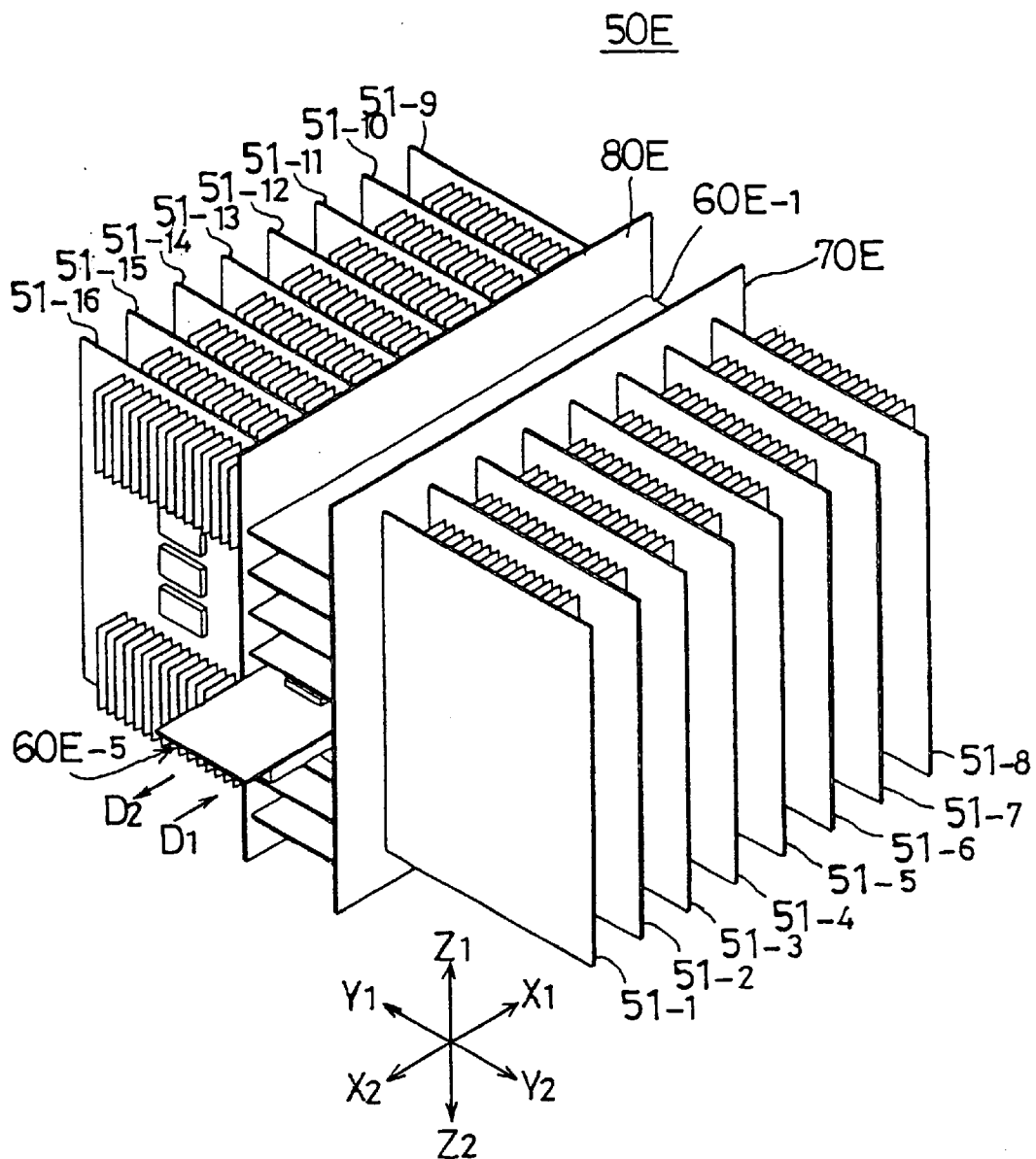
FIG. 10 is an illustration of a multiprocessor according to a fifth embodiment of the present invention.
Figure 11:
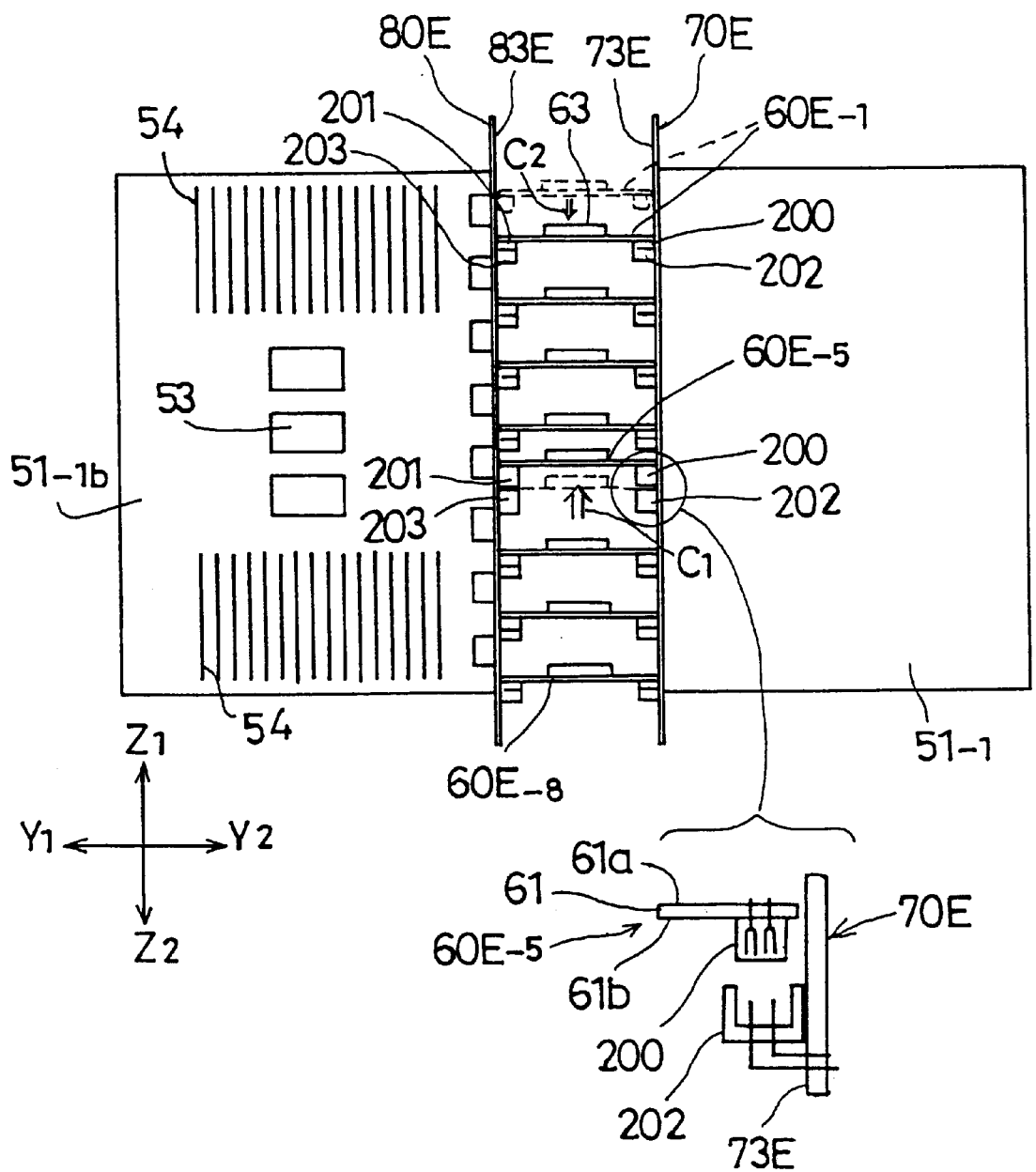
FIG. 11 is a side view of the multiprocessor shown in FIG. 10.

FIG. 10 is an illustration of a multiprocessor 50E according to a fifth embodiment of the present invention. FIG. 11 is a side view of the multiprocessor 50E shown in FIG. 10. The multiprocessor 50E is an SMP (Symmetric Multiprocessor) of the crossbar-interconnect type. In the multiprocessor 50E, the crossbar-boards are connected to the back panels by connecters facing different directions than in the multiprocessor 50 shown in FIG. 2.

The multiprocessor 50E comprises: eight crossbar-boards 60E-1 to 60E-8; a first back panel 70E; a second back panel 80E; and the 16 motherboards 51-1 to 51-16.

Each of the eight crossbar-boards 60E-1 to 60E-8 comprises: the board 61; the switching circuit 63 mounted at the center of an upper surface 61a thereof; and eight jack-connectors 200 and eight jack-connectors 201 mounted along both longitudinal sides, respectively, of an under surface 61b of the board 61, as shown in FIG. 10 and FIG. 11. A joining part of each of the eight jack-connectors 200 and the eight jack-connectors 201 faces in the direction indicated by the arrow Z2, as shown in FIG. 11.

The first back panel 70E has a plurality of plug-connecters 202 mounted on a surface 73E. A pin of each of the plurality of plug-connecters 202 faces in the direction indicated by the arrow Z1. The second back panel 80E has a plurality of plug-connectors 203 mounted on a surface 83E. A pin of each of the plurality of plug-connectors 203 faces in the direction indicated by the arrow Z1.

Each of the eight crossbar-boards 60E-1 to 60E-8 is placed horizontal and aligned in the direction Z1-Z2 at regular intervals.

The first back panel 70E and the second back panel 80E are each placed vertical, and oppose each other.

The jack-connectors 200 and the jack-connectors 201 of the crossbar-boards 60E-1 to 60E-8 are connected to the plug-connectors 202 of the first back panel 70E and the plug-connectors 203 of the second back panel 80E, respectively. Each of the motherboards 51-1 to 51-16 is placed vertical. The motherboards 51-1 to 51-8 and the motherboards 51-9 to 51-16 are connected by connectors to the first back panel 70E and the second back panel 80E, respectively, and are aligned in the direction X1-X2 at regular intervals.

In order that the jack-connectors 200 and the jack-connectors 201 are connected to the plug-connectors 202 and the plug-connectors 203, respectively, each of the crossbar-boards 60E-1 to 60E-8 is pushed downward in the direction Z2, as indicated by an arrow C2 in FIG. 11. In order that the jack-connectors 200 and the jack-connectors 201 are disconnected from the plug-connectors 202 and the plug-connectors 203, respectively, each of the crossbar-boards 60E-1 to 60E-8 is pushed upward in the direction Z1, as indicated by an arrow C1 in FIG. 11.

For example, the crossbar-board 60E-5 is removed from the multiprocessor 50E by firstly pushing upward the crossbar-board 60E-5 in the direction Z1, as indicated by the arrow C1 in FIG. 11, so as to disconnect the jack-connectors 200 and the jack-connectors 201 from the plug-connectors 202 and the plug-connectors 203, and secondly drawing the crossbar-board 60E-5 in the direction X2, as indicated by the arrow D2 in FIG. 10. A new crossbar-board 60E is attached to the multiprocessor 50E reversely by firstly inserting the crossbar-board 60E-5 from a side of the multiprocessor 50E as indicated by the arrow D1 in FIG. 10, and secondly pushing downward the crossbar-board 60E-5 as indicated by the arrow C2 in FIG. 11.

Therefore, when one of the crossbar-boards 60E-1 to 60E-8 goes out of order, the broken crossbar-board 60E can be replaced by a new crossbar-board 60E without disassembling the multiprocessor 50E, i.e., without moving or removing the opposing first back panel 70E and the second back panel 80E. Thereby, a maintenance of the multiprocessor 50E requires a small number of steps, and thus the multiprocessor 50E has a good maintainability.

6. Sixth Embodiment

Figure 12:
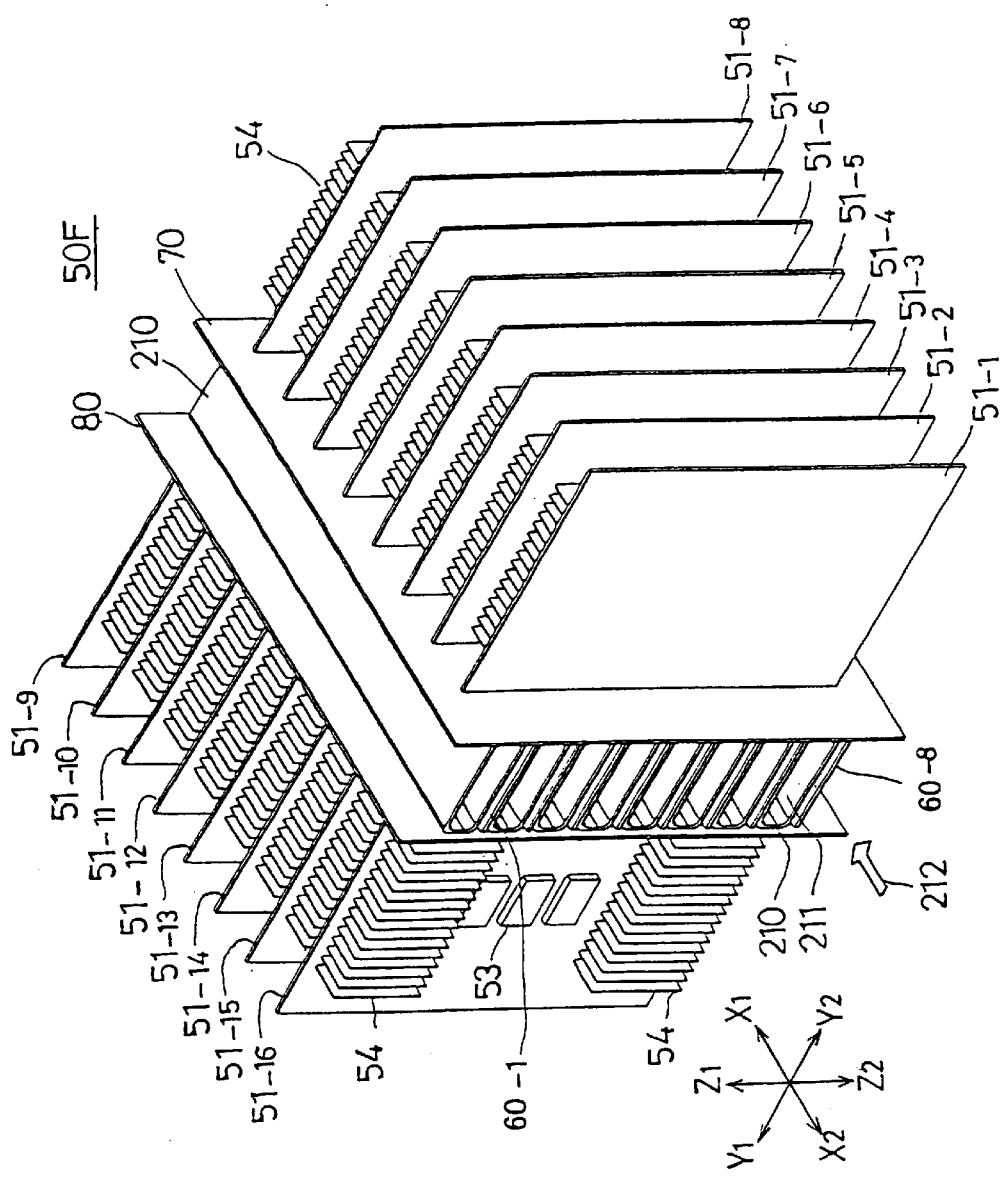
FIG. 12 is an illustration of a multiprocessor according to a sixth embodiment of the present invention.

FIG. 12 is an illustration of a multiprocessor 50F according to a sixth embodiment of the present invention. The multiprocessor 50F is an SMP (Symmetric Multiprocessor) of the crossbar-interconnect type, and comprises a plurality of heat radiation components 210 in addition to the structure of the multiprocessor 50 shown in FIG. 2.

Each of the heat radiation components 210 is a hollow aluminum component comprising a hollow space 211 having a rectangular cross section, and is placed horizontally on the upper side of each of the crossbar-boards 60-1 to 60-8 so as to contact an upper surface of the switching circuit 63. Each of the heat radiation components 210 is placed in a space between the adjacent crossbar-boards 60. A size of the hollow space 211 is determined optimally according to a relation between a quantity and a speed of a cooling wind.

A server incorporating the multiprocessor 50F has a cooling fan, whereby a cooling wind moves in the direction X1 as indicated by an arrow 212 while contacting outer and inner surfaces of each of the heat radiation components 210. Thereby, a heat generated in the switching circuit 63 of each of the crossbar-boards 60-1 to 60-8 is effectively deprived, and thus the switching circuit 63 can be efficiently forced-air cooled.

7. Seventh Embodiment

Figure 13:
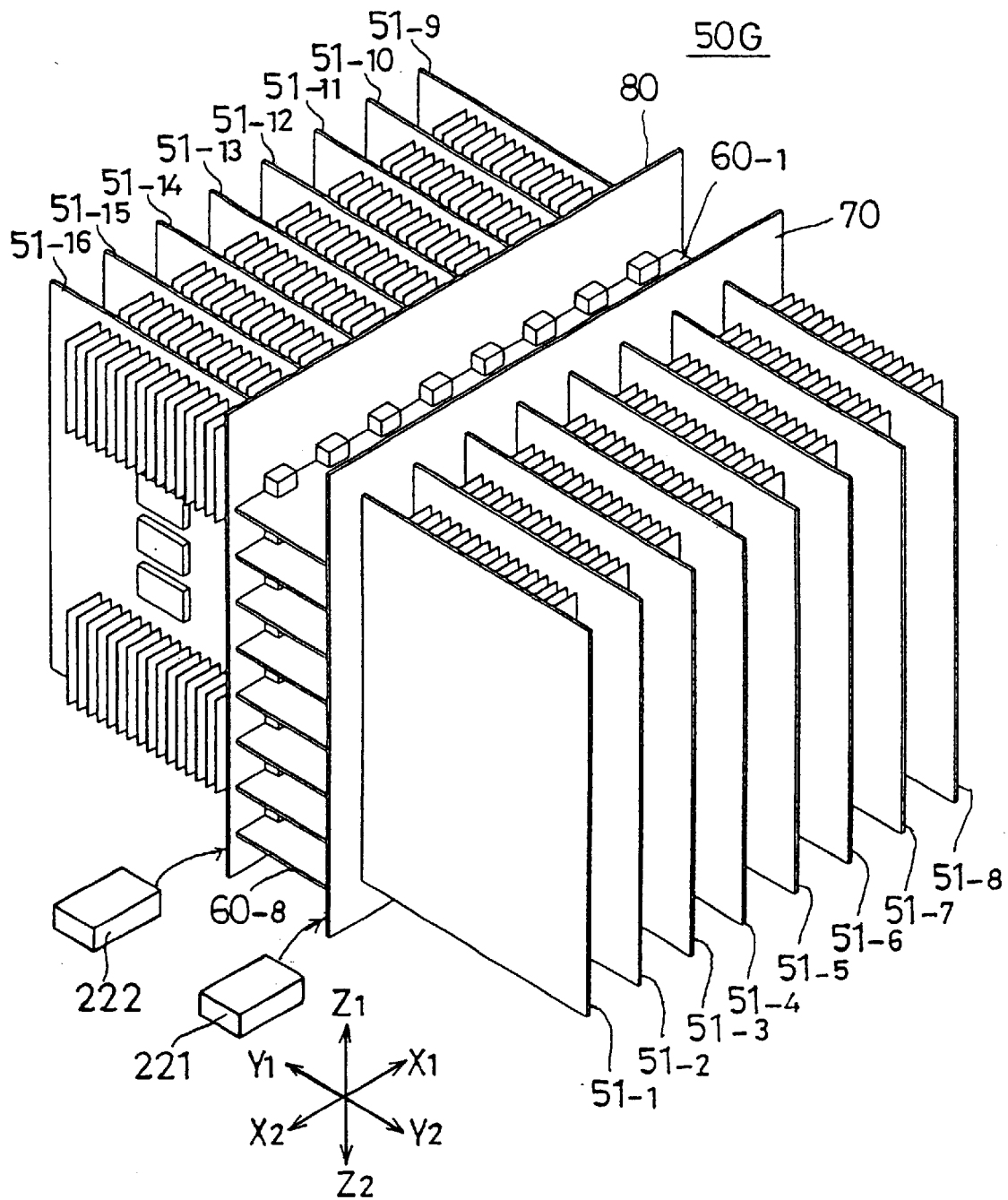
FIG. 13 is an illustration of a multiprocessor according to a seventh embodiment of the present invention.

FIG. 13 is an illustration of a multiprocessor 50G according to a seventh embodiment of the present invention. The multiprocessor 50G is an SMP (Symmetric Multiprocessor) of the crossbar-interconnect type, and comprises a first power supply unit 221 and a second power supply unit 222 in addition to the structure of the multiprocessor 50 shown in FIG. 2.

The first power supply unit 221 and the second power supply unit 222 are independent of each other. The first power supply unit 221 is connected to the first back panel 70. The second power supply unit 222 is connected to the second back panel 80. The first power supply unit 221 and the second power supply unit 222 are connected in parallel. Each of the first power supply unit 221 and the second power supply unit 222 has a capacity to supply the entire multiprocessor 50G with a required electric power without an aid of the other.

The first power supply unit 221 supplies an electric power to the first back panel 70, the eight motherboards 51-1 to 51-8 and the crossbar-boards 60-1 to 60-8. The second power supply unit 222 supplies an electric power to the second back panel 80 and the other eight motherboards 51-9 to 51-16. When the first power supply unit 221 goes out of order, the second power supply unit 222 supplies an electric power to the first back panel 70, the eight motherboards 51-1 to 51-8 and the crossbar-boards 60-1 to 60-8 so that the multiprocessor 50G continues to operate normally. When the second power supply unit 222 goes out of order, the first power supply unit 221 supplies an electric power to the second back panel 80 and the other eight motherboards 51-9 to 51-16 so that the multiprocessor 50G continues to operate normally.

8. Eighth Embodiment

Figure 14:
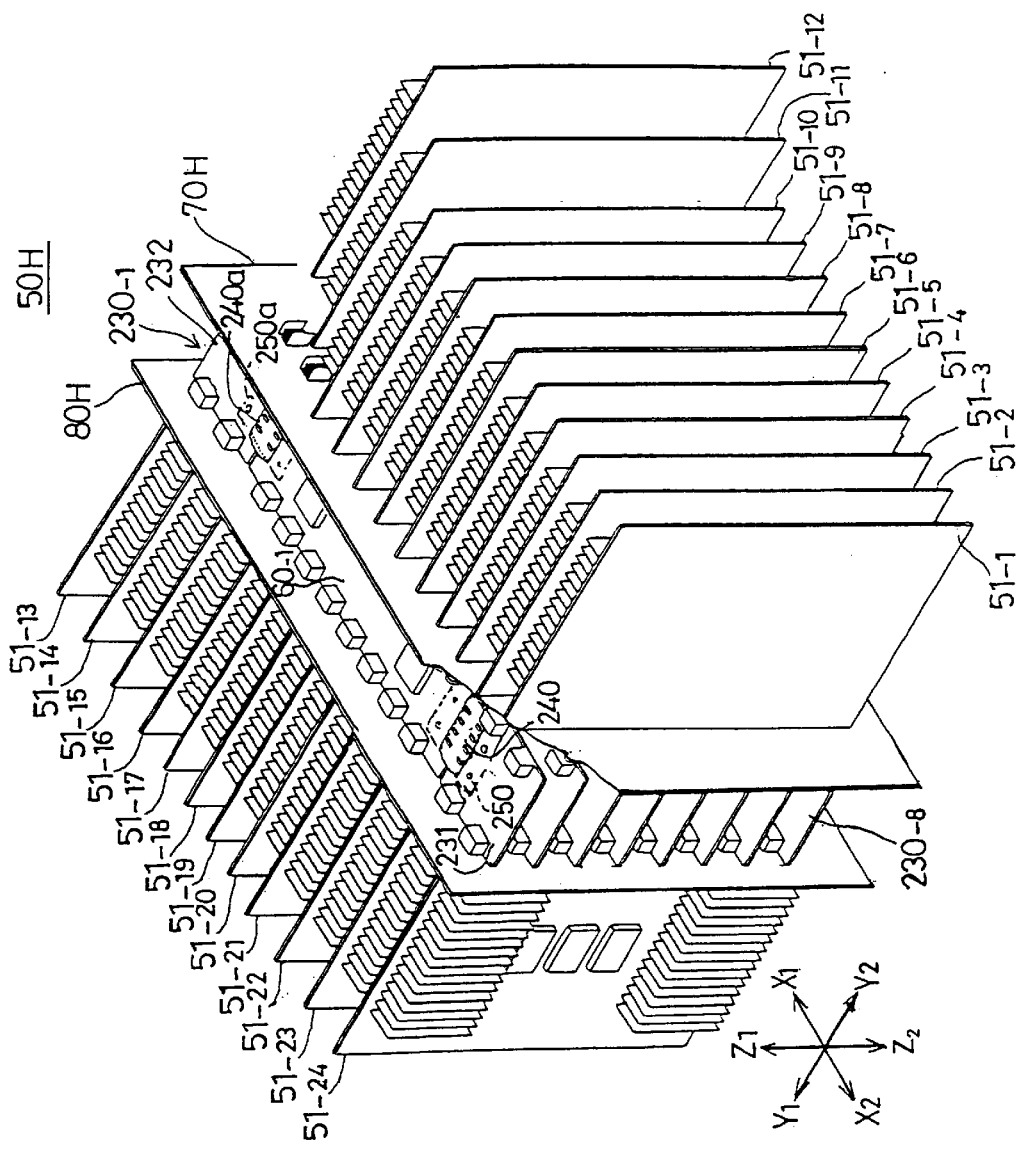
FIG. 14 is an illustration of a multiprocessor according to an eighth embodiment of the present invention.

FIG. 14 is an illustration of a multiprocessor 50H according to an eighth embodiment of the present invention. The multiprocessor 50H is an SMP (Symmetric Multiprocessor) of the crossbar-interconnect type, and comprises the substantially same structure as the multiprocessor 50 shown in FIG. 2, except that the multiprocessor 50H has a larger size in the direction X1-X2 than the multiprocessor 50 shown in FIG. 2.

A first back panel 70H and a second back panel 80H have a larger size in the direction X1-X2 than the first back panel 70 and the second back panel 80 shown in FIG. 2. Each of the twelve motherboards 51-1 to 51-12 is connected to the first back panel 70H by connectors, and is placed vertically. The twelve motherboards 51-1 to 51-12 are aligned in the direction X1-X2 at regular intervals. Each of the other twelve motherboards 51-13 to 51-24 is connected to the second back panel 80H by connectors, and is placed vertically. The other twelve motherboards 51-13 to 51-24 are aligned in the direction X1-X2 at regular intervals.

Each of crossbar-board assemblies 230-1 to 230-8 has a rectangular shape, and is placed horizontally. The crossbar-board assemblies 230-1 to 230-8 are aligned in the direction Z1-Z2 at regular intervals. The first back panel 70H and the second back panel 80H are respectively connected to both sides of the crossbar-board assemblies 230-1 to 230-8 by connectors, and oppose each other.

The crossbar-board assembly 230-1 comprises extension crossbar-boards 231 and 232 respectively connected to both ends of the crossbar-board 60-1 shown in FIG. 2 in longitudinal directions thereof. The board 61 of the crossbar-board 60-1 has wiring patterns to accommodate the extension crossbar-boards 231 and 232. The extension crossbar-boards 231 and 232 each have wiring patterns analogous to the wiring patterns of the board 61.

Figure 15:
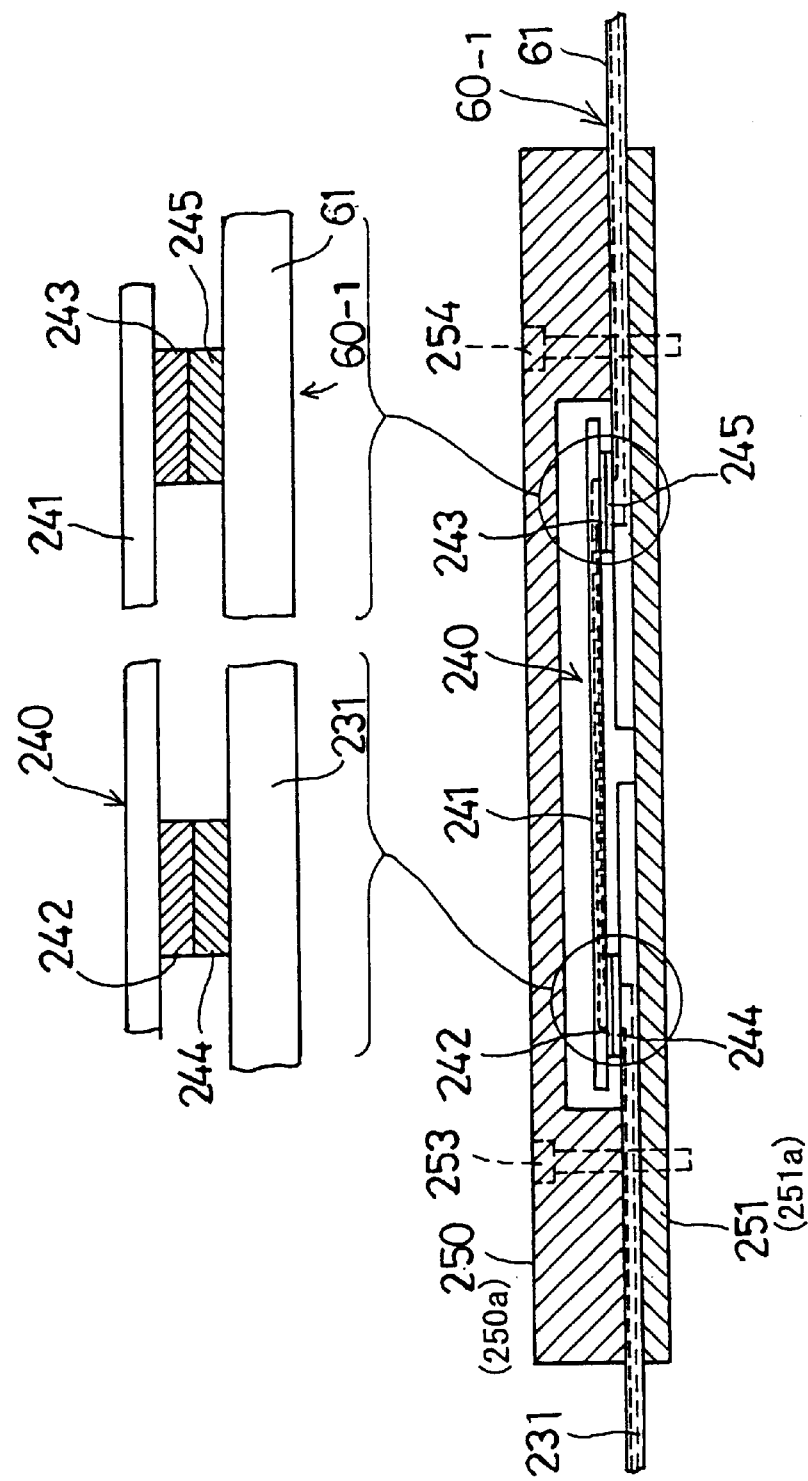
FIG. 15 is a magnified illustration of a connecting part of an extension crossbar-board and a crossbar-board shown in FIG. 14.

FIG. 15 is a magnified illustration of a connecting part of the extension crossbar-board 231 and the crossbar-board 60-1 shown in FIG. 14. As shown also in FIG. 15, the extension crossbar-board 231 and the crossbar-board 60-1 are connected by a parallel-board connector (a stacking connector) 240, electrically. Mechanically, the extension crossbar-board 231 and the crossbar-board 60-1 are fixed from both upper and under sides by board-shaped reinforcing metal articles 250 and 251, and are screwed with screws 253 and 254. FIG. 14 shows the connecting part with the reinforcing metal article 250 removed.

The stacking connector 240 comprises: a flat-cable unit 241; stacking male-connectors 242 and 243 respectively attached on both ends of the under surface of the flat-cable unit 241; a stacking female-connector 244 attached on one end of the upper surface of the extension crossbar-board 231; and a stacking female-connector 245 attached on one end of the upper surface of the board 61. The stacking male-connectors 242 and 243 are connected to the stacking female-connectors 244 and 245, respectively.

In the same manner, the extension crossbar-board 232 and the crossbar-board 60-1 are connected by a parallel-board connector (a stacking connector) 240a, board-shaped reinforcing metal articles 250a and 251a, and screws.

Namely, the crossbar-board assembly 230-1 has a structure wherein the crossbar-board 60-1 is extended in the longitudinal directions thereof. The other crossbar-board assemblies 230-2 to 230-8 have the same structure as the crossbar-board assembly 230-1. Therefore, the crossbar-board assembly 230 corresponding to the back panels 70H and 80H longer in the direction X1-X2 than normal can be manufactured by using a conventional reflow furnace.

9. Ninth Embodiment

Figure 16:
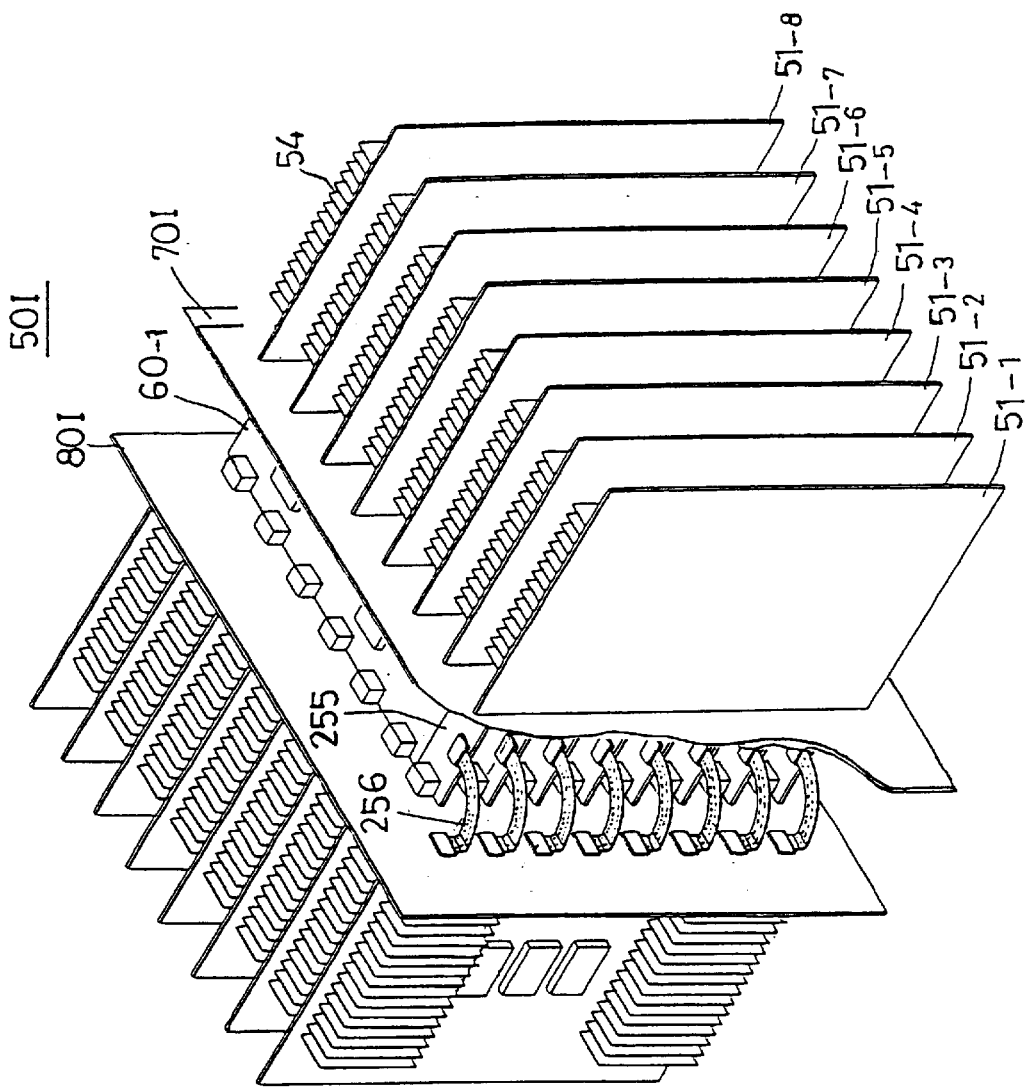
FIG. 16 is an illustration of a multiprocessor according to a ninth embodiment of the present invention.

FIG. 16 is an illustration of a multiprocessor 50I according to a ninth embodiment of the present invention. The multiprocessor 50I has a similar structure to the multiprocessor 50H shown in FIG. 14. However, the multiprocessor 50I comprises: extension crossbar-boards 255 respectively connected to one end of the crossbar-boards 60-1 to 60-8 in the longitudinal direction thereof; and flexible cable connectors 256 each having connectors on both ends of a flexible substrate. The extension crossbar-boards 255 are connected to a first back panel 70I and a second back panel 80I in the same manner as the crossbar-boards 60-1 to 60-8. Each of the flexible cable connectors 256 connects one end of the extension crossbar-board 255 and the second back panel 80I by the connectors.

Each of the flexible cable connectors 256 provides one more connection part between the extension crossbar-board 255 and the second back panel 80I than normal.

10. Tenth Embodiment

Figure 17:
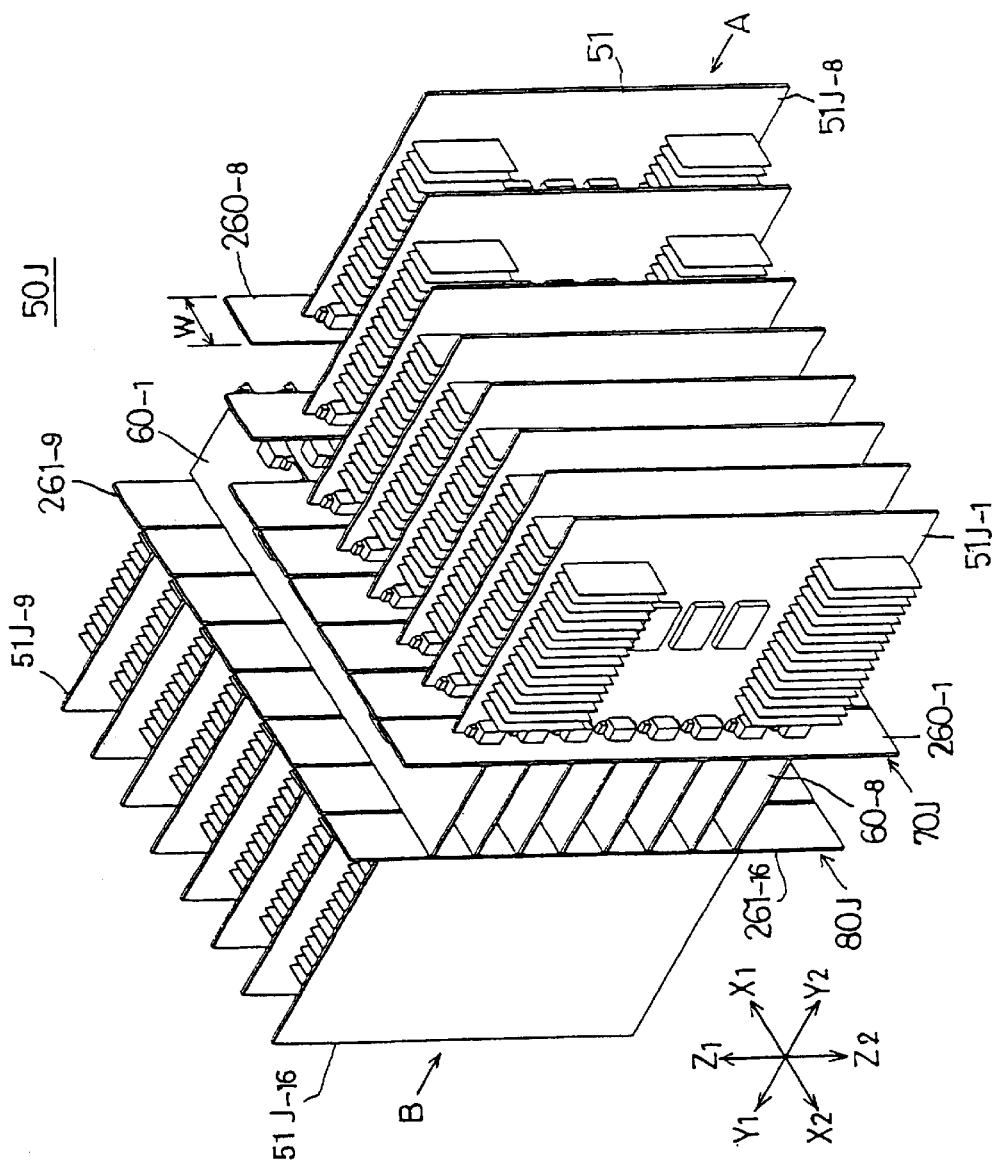
FIG. 17 is an illustration of a multiprocessor according to a tenth embodiment of the present invention.

FIG. 17 is an illustration of a multiprocessor 50J according to a tenth embodiment of the present invention. The multiprocessor 50J is an SMP (Symmetric Multiprocessor) of the crossbar-interconnect type, and has a structure different from the structure of the multiprocessor 50 shown in FIG. 2 with respect to motherboards and back panels.

The multiprocessor 50J comprises the eight crossbar-boards 60-1 to 60-8 and 16 motherboards 51J-1 to 51J-16.

The motherboard 51J comprises: the motherboard 51 shown in FIG. 2; and a strip panel 260 or 261 connected thereto. Each of the strip panels 260 and 261 has a width W corresponding to the motherboard 51 shown in FIG. 2. For example, the motherboard 51J-8 comprises: the motherboard 51 shown in FIG. 2; and the strip panel 260-8 connected to one end of the motherboard 51 in the direction indicated by the arrow Y1. The motherboard 51J-9 comprises: the motherboard 51 shown in FIG. 2; and the strip panel 261-9 connected to one end of the motherboard 51 in the direction indicated by the arrow Y2.

Each of the eight motherboards 51J-1 to 51J-8 is placed vertical. The motherboards 51J-1 to 51J-8 are inserted toward the eight crossbar-boards 60-1 to 60-8 in a direction indicated by an arrow A, and are plugged in and connected thereto. The motherboards 51J-1 to 51J-8 are aligned in the direction X1-X2 at regular intervals. Each of the other eight motherboards 51J-9 to 51J-16 is placed vertical. The motherboards 51J-9 to 51J-16 are inserted toward the eight crossbar-boards 60-1 to 60-8 in a direction indicated by an arrow B, and are plugged in and connected thereto. The motherboards 51J-9 to 51J-16 are aligned in the direction X1-X2 at regular intervals.

The strip panels 260-1 to 260-8 form a first back panel 70J. The strip panels 261-9 to 261-16 form a second back panel 80J.

The multiprocessor 50J comprises the first back panel 70J and the second back panel 80J divided into strips for each of the motherboards 51J, and thus can easily be enlarged.

Figure 18:
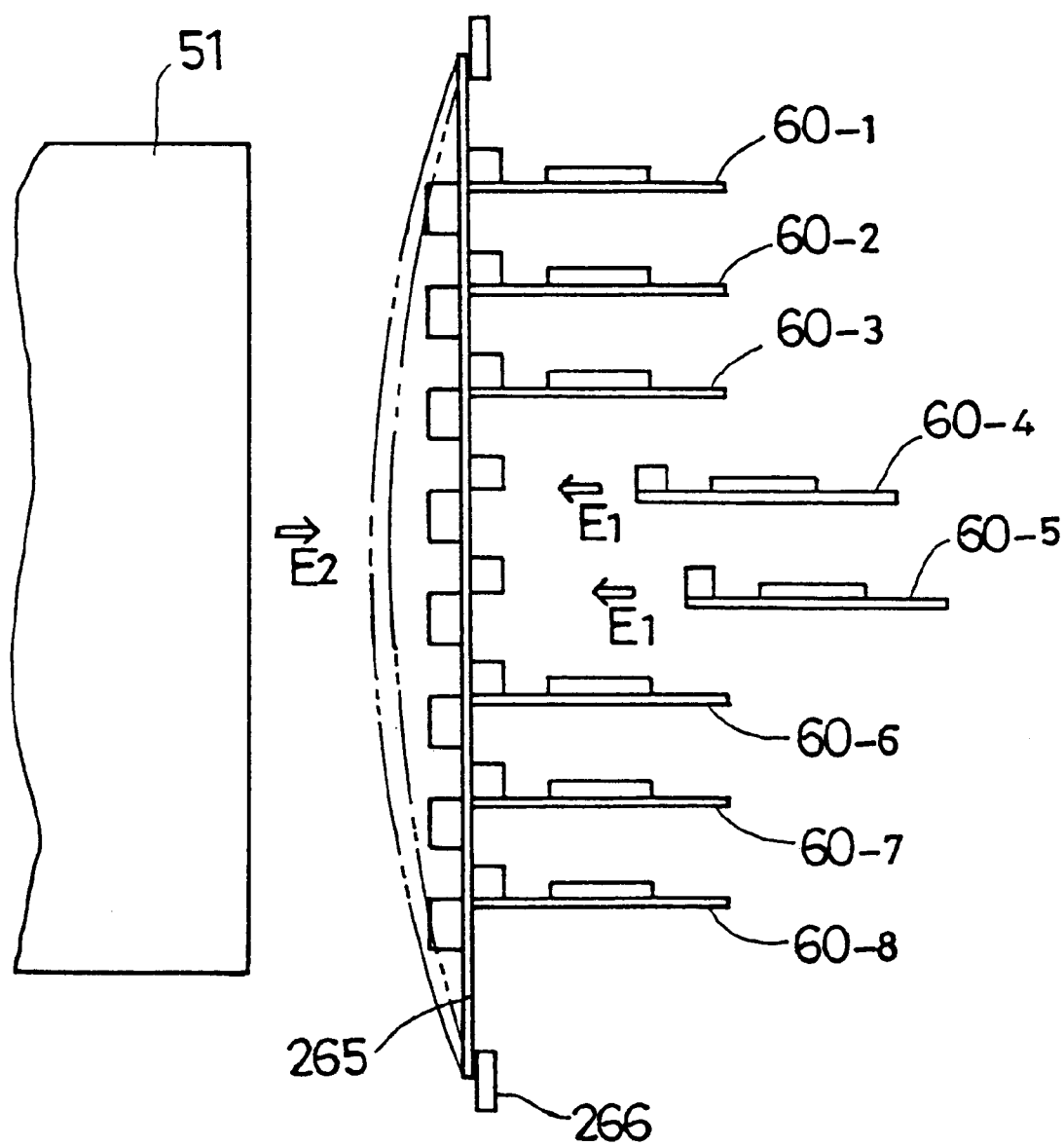
FIG. 18 is an illustration for explaining a process of assembling a multiprocessor when the multiprocessor comprises a single back panel.

Additionally, when the multiprocessor comprises a single back panel, the multiprocessor is assembled in a manufactory, as shown in FIG. 18, by fixing peripheries of a back panel 265 to a rack frame 266; and pushing the crossbar-boards 60-1 to 60-8 as indicated by an arrow E1 and connecting by connectors the crossbar-boards 60-1 to 60-8 to the back panel 265 one by one. In this process, each of the crossbar-boards 60-1 to 60-8 has to be pushed forcefully so that all connectors of the crossbar-board 60 are connected to the back panel 265 simultaneously. This sometimes causes the back panel 265 to warp as depicted by a double dashed chain line in FIG. 18. As a result of this, when the motherboard 51 is plugged in and connected to the back panel 265 as indicated by an arrow E2 after the above-mentioned process, there is a risk of imperfect connections between the motherboard 51 and the back panel 265.

However, when the multiprocessor comprises the first back panel 70J and the second back panel 80J divided into strips for each of the motherboards 51J as in the present embodiment, the multiprocessor is assembled by first fixing the crossbar-boards 60-1 to 60-8 in a rack frame (not shown in the figures); and then plugging and connecting each of the motherboards 51J comprising the strip panel 260 or 261 to the crossbar-boards 60-1 to 60-8. This does not warp the strip panels 260 or 261. Therefore, the motherboards 51J have good connections to the crossbar-boards 60-1 to 60-8.

11. Eleventh Embodiment

Figure 19:
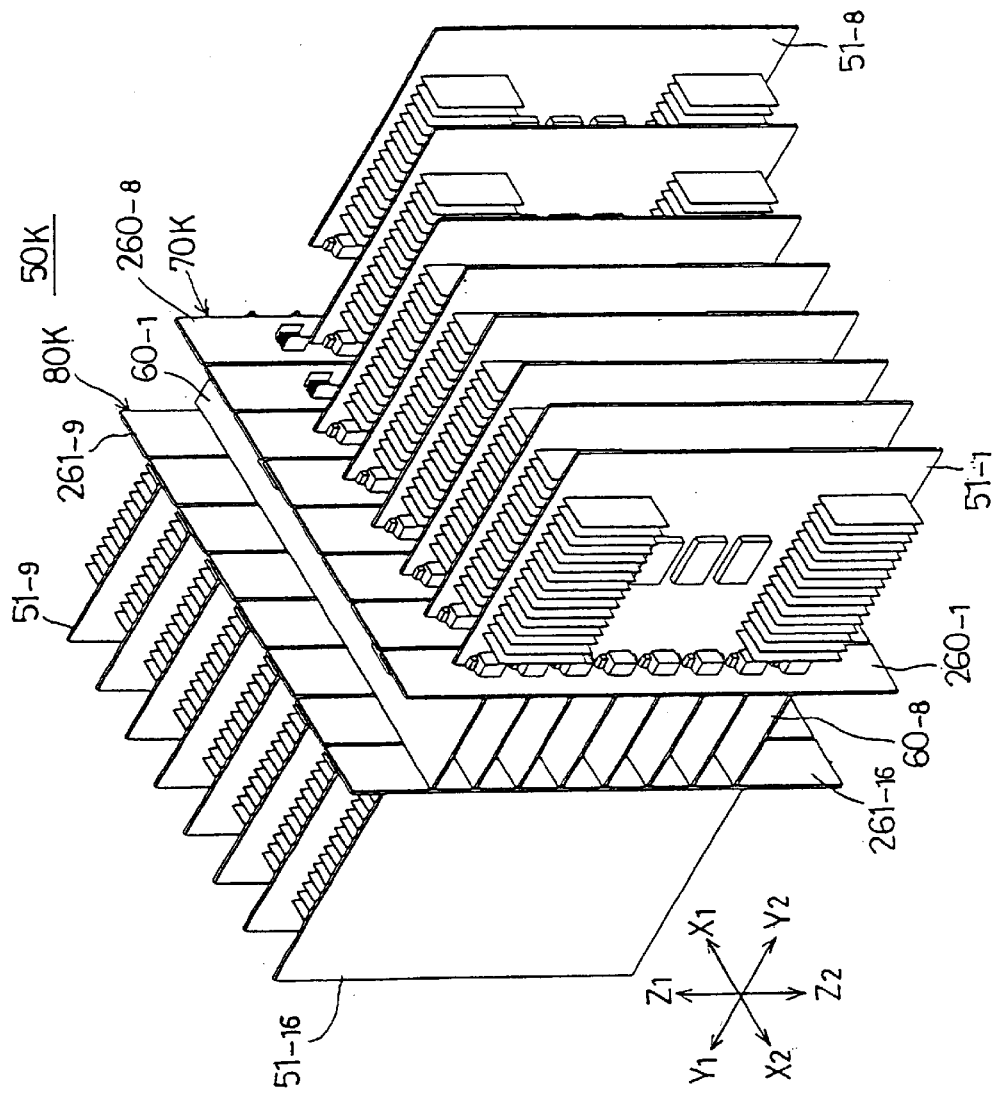
FIG. 19 is an illustration of a multiprocessor according to an eleventh embodiment of the present invention.

FIG. 19 is an illustration of a multiprocessor 50K according to an eleventh embodiment of the present invention. The multiprocessor 50K is an SMP (Symmetric Multiprocessor)

of the crossbar-interconnect type, and has substantially the same structure as the multiprocessor 50J shown in FIG. 17, the structure being different from the structure of the multiprocessor 50 shown in FIG. 2 with respect to back panels.

The multiprocessor 50K comprises: the eight crossbar-boards 60-1 to 60-8; a first back panel 70K; a second back panel 80K; and the 16 motherboards 51-1 to 51-16.

The first back panel 70K is formed by the strip panels 260-1 to 260-8 shown in FIG. 17. Each of the strip panels 260-1 to 260-8 is connected by connectors to the crossbar-boards 60-1 to 60-8, and forms a plane in the direction X1-X2 together with the others. Likewise, the second back panel 80K is formed by the strip panels 261-9 to 261-16 shown in FIG. 17. Each of the strip panels 261-9 to 261-16 is connected by connectors to the crossbar-boards 60-1 to 60-8, and forms a plane in the direction X1-X2 together with the others.

The multiprocessor 50K comprises the first back panel 70K and the second back panel 80K divided into strips for each of the motherboards 51, and thus can easily be enlarged.

Additionally, the multiprocessor 50K is assembled by first fixing the crossbar-boards 60-1 to 60-8 in a rack frame (not shown in the figures); and then connecting by connectors the strip panels 260-1 to 260-8 and 261-9 to 261-16 to the crossbar-boards 60-1 to 60-8 one by one. This forms the first back panel 70K and the second back panel 80k without warps. Therefore, the motherboards 51 can have good connections to the first back panel 70K and the second back panel 80k.

12. Twelfth Embodiment

Figure 20:
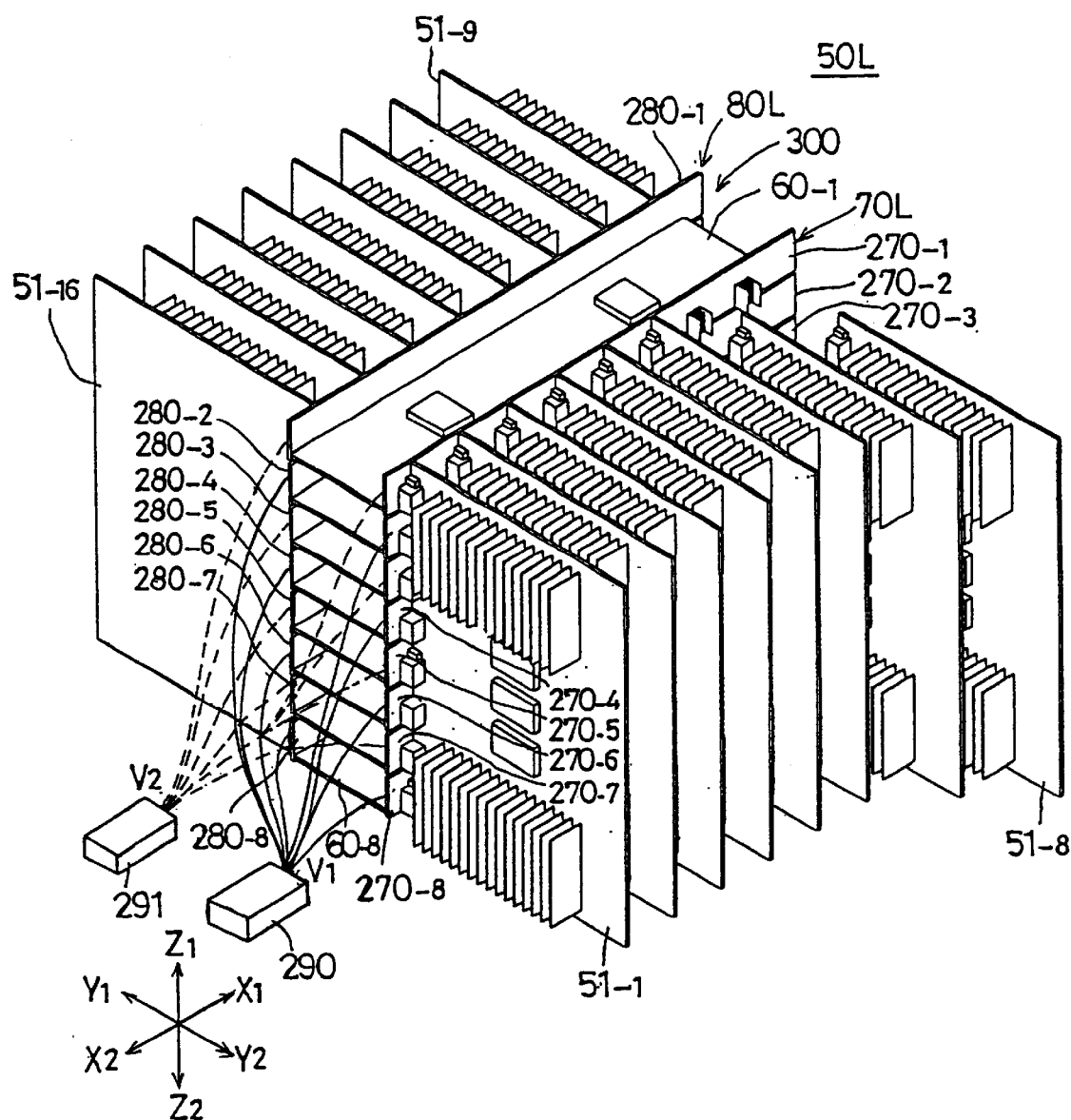
FIG. 20 is an illustration of a multiprocessor according to a twelfth embodiment of the present invention.

FIG. 20 is an illustration of a multiprocessor 50L according to a twelfth embodiment of the present invention. The multiprocessor 50L is an SMP (Symmetric Multiprocessor) of the crossbar-interconnect type, and has a structure different from the structure of the multiprocessor 50 shown in FIG. 2 with respect to back panels.

The multiprocessor 50L comprises: the eight crossbar-boards 60-1 to 60-8; a first back panel 70L; a second back panel 80L; and the 16 motherboards 51-1 to 51-16.

The first back panel 70L comprises strip panels 270-1 to 270-8 being oblong in the direction X1-X2 so as to fit the crossbar-boards 60-1 to 60-8, respectively. The strip panels 270-1 to 270-8 are connected by connectors to the crossbar-boards 60-1 to 60-8, respectively, and form a plane in the direction Z1-Z2. The second back panel 80L comprises strip panels 280-1 to 280-8 being oblong in the direction X1-X2 so as to fit the crossbar-boards 60-1 to 60-8, respectively. The strip panels 280-1 to 280-8 are connected by connectors to the crossbar-boards 60-1 to 60-8, respectively, and form a plane in the direction Z1-Z2.

Each of the motherboards 51-1 to 51-8 crosses over the strip panels 270-1 to 270-8. Each of the motherboards 51-9 to 51-16 crosses over the strip panels 280-1 to 280-8.

The multiprocessor 50L comprises the first back panel 70L and the second back panel 80L divided into strips for each of the crossbar-boards 60, and thus can easily be enlarged.

The crossbar-boards 60-1 to 60-8, the first back panel 70L and the second back panel 80L compose a crossbar board-back panel assembly 300 which is a core of the multiprocessor 50L.

The crossbar board-back panel assembly 300 also comprises: a power supply unit 290 outputting a voltage V1; and a power supply unit 291 outputting a voltage V2. The power supply unit 290 is connected to the strip panels 270 and 280 suffixed with even numbers, i.e., the strip panels 270-2, 270-4, 270-6, 270-8, 280-2, 280-4, 280-6 and 280-8. The power supply unit 291 is connected to the strip panels 270 and 280 suffixed with odd numbers, i.e., the strip panels 270-1, 270-3, 270-5, 270-7, 280-1, 280-3, 280-5 and 280-7. Each of the motherboards 51-1 to 51-16 has two power-supplied layers.

Accordingly, the voltage V1 is impressed to one of the two power-supplied layers of each of the motherboards 51-1 to 51-16. The voltage V2 is impressed to the other of the two power-supplied layers of each of the motherboards 51-1 to 51-16. That is, two different voltages are impressed to each of the motherboards 51-1 to 51-16. Therefore, semiconductor elements operable at the voltage V1 and semiconductor elements operable at the voltage V2 can be mounted together on each of the motherboards 51-1 to 51-16.

Figure 21:
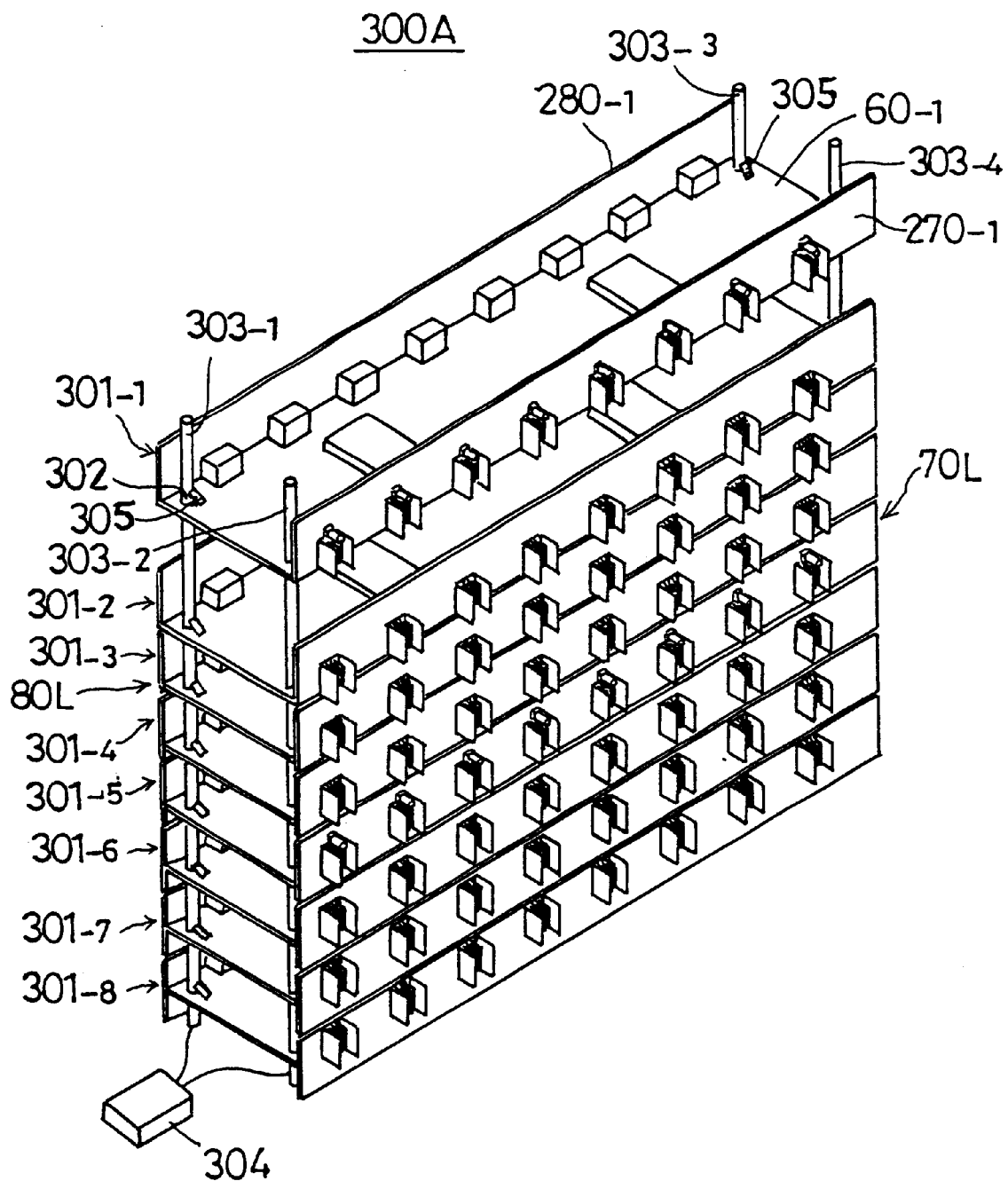
FIG. 21 is an illustration of a first variation of a crossbar board-back panel assembly shown in FIG. 20.

FIG. 21 is an illustration of a crossbar board-back panel assembly 300A, which is a first variation of the above-mentioned crossbar board-back panel assembly 300 shown in FIG. 20. The crossbar board-back panel assembly 300A comprises: guide poles 303-1 to 303-4 placed at positions corresponding to four corners of the crossbar-boards 60; and crossbar board-strip panel assemblies 301-8 to 301-1 piled up and fixed by holes 302 formed at the four corners of the crossbar-boards 60-1 to 60-8 being passed through by the guide poles 303-1 to 303-4, respectively.

The crossbar board-strip panel assembly 301-1 comprises: the crossbar-board 60-1; and the strip panels 270-1 and 280-1 connected respectively to both longitudinal sides of the crossbar-board 60-1 by connectors. The other crossbar board-strip panel assemblies 301-2 to 301-8 have the same structure as the crossbar board-strip panel assembly 301-1.

The guide poles 303-1 to 303-4 are made of aluminum, and connected with a power supply unit 304. The crossbar-boards 60 comprise terminal members 305 respectively formed at positions facing the holes 302. The terminal members 305 respectively contact the guide poles 303-1 to 303-4 in a state where the crossbar board-strip panel assemblies 301-8 to 301-1 are piled up. Thereby, the power supply unit 304 can effectively supply a voltage to all of the crossbar-boards 60-1 to 60-8 via the guide poles 303-1 to 303-4, and further to the first back panel 70L and the second back panel 80L. Therefore, this structure is especially effective when applied to a case where a large power is supplied to the crossbar-boards 60-1 to 60-8 and a case where a large power is supplied to the back panels 70L and 80L. Specifically, this structure is capable of preventing voltage drops in the crossbar-boards 60-1 to 60-8 and in the back panels 70L and 80L.

Figure 22:
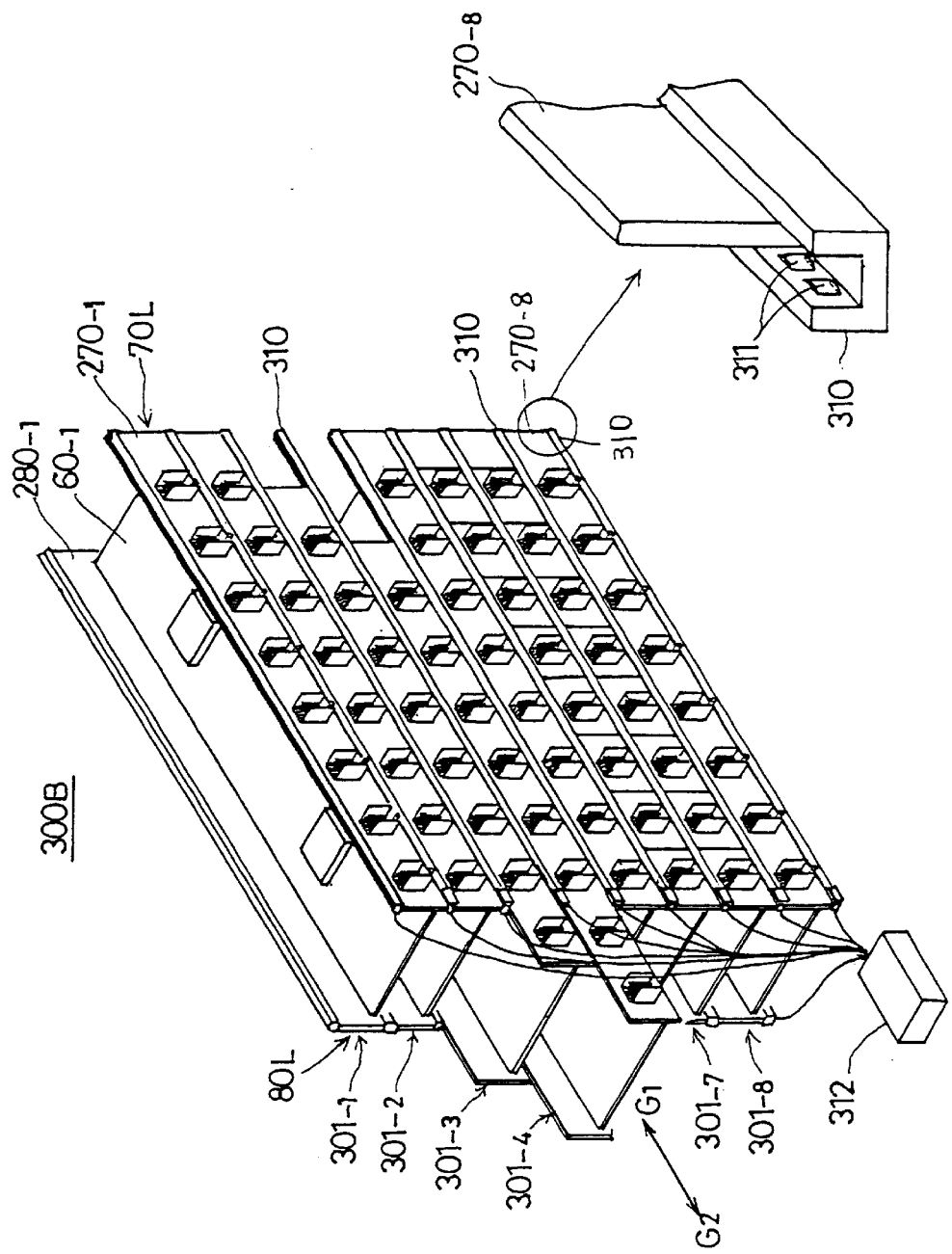
FIG. 22 is an illustration of a second variation of the crossbar board-back panel assembly shown in FIG. 20.

FIG. 22 is an illustration of a crossbar board-back panel assembly 300B, which is a second variation of the above-mentioned crossbar board-back panel assembly 300 shown in FIG. 20. The crossbar board-back panel assembly 300B comprises: the crossbar board-strip panel assemblies 301-1 to 301-8; and a plurality of guide rails 310 fixed horizontally at positions corresponding to the crossbar board-strip panel assemblies 301-1 to 301-8. That is, both upper and under edges of each of the strip panels 270-1 to 270-8 and 280-1 to 280-8 on both sides of the crossbar board-strip panel assemblies 301-1 to 301-8 are inserted into the guide rails 310 so that the crossbar board-strip panel assemblies 301-1 to 301-8 are piled up.

The strip panels 270-1 to 270-8 together form a plane so as to compose the first back panel 70L. The strip panels 280-1 to 280-8 together form a plane so as to compose the second back panel 80L.

Each of the guide rails 310 comprises springy power supply terminals 311 incorporated therein. The power supply terminals 311 are connected with a power supply unit 312. The power supply unit 312 impresses a voltage to all of the strip panels 270-1 to 270-8 and 280-1 to 280-8 via the power supply terminals 311 in the guide rails 310. Thus, this structure is capable of preventing voltage drops in the back panels 70L and 80L.

Additionally, any of the crossbar board-strip panel assemblies 301-1 to 301-8 can be drawn out in a direction G2 shown in FIG. 22. Therefore, when one of the crossbar board-strip panel assemblies 301-1 to 301-8 goes out of order, the broken crossbar board-strip panel assembly 301 can be easily replaced. This facilitates a maintenance of the crossbar board-back panel assembly 300B.

13. Thirteenth Embodiment

Figure 23:
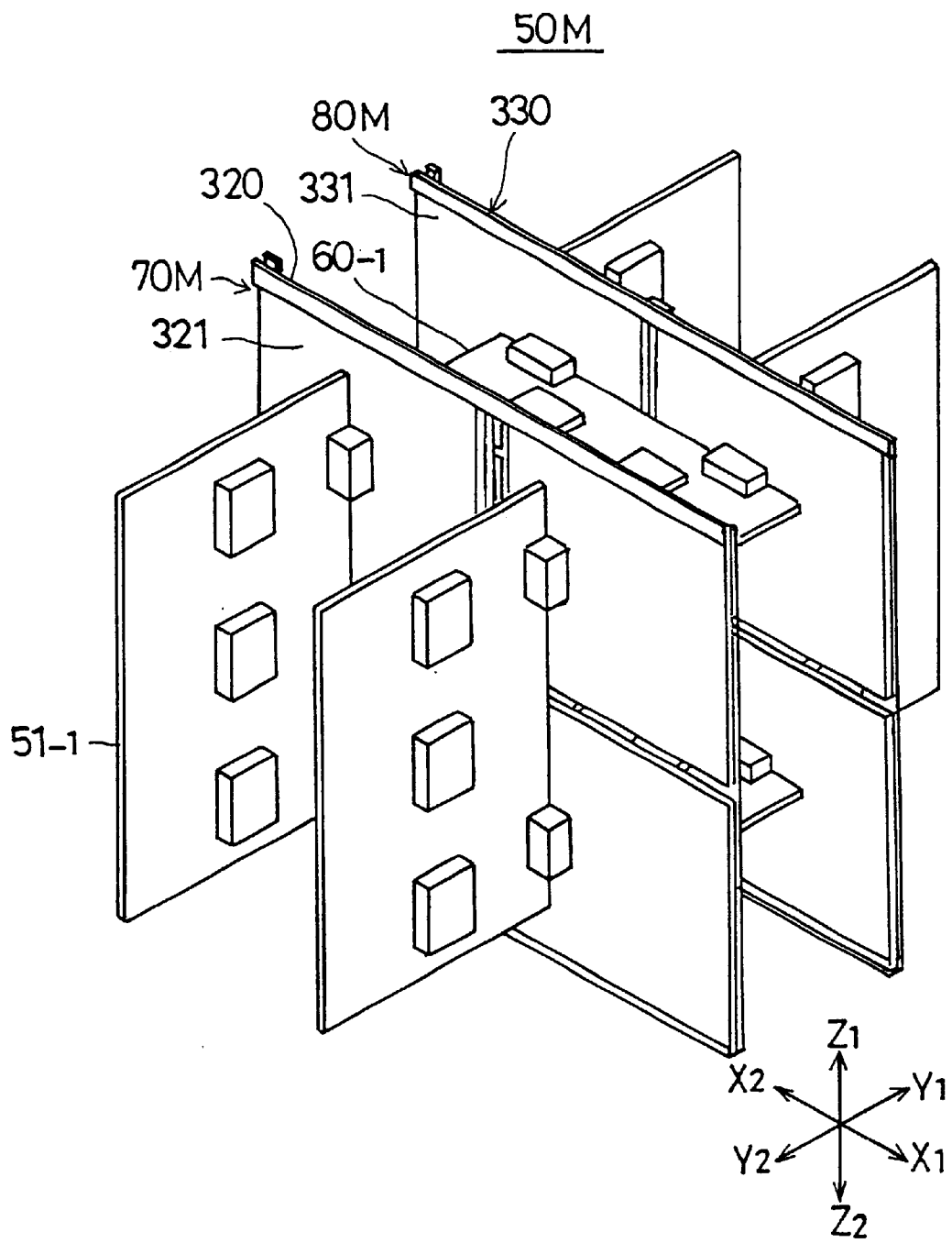
FIG. 23 is an illustration of a multiprocessor according to a thirteenth embodiment of the present invention.

FIG. 23 is an illustration of a multiprocessor 50M according to a thirteenth embodiment of the present invention. The multiprocessor 50M is an SMP (Symmetric Multiprocessor) of the crossbar-interconnect type, and has a structure different from the structure of the multiprocessor 50 shown in FIG. 2 with respect to back panels.

The multiprocessor 50M comprises: the crossbar-boards 60-1; a first back panel 70M; a second back panel 80M; and the motherboards 51.

The first back panel 70M comprises: a grid-like frame 320; and four small panels 321 each having a quarter size of the first back panel 70M, two of the four small panels 321 being arranged in the frame 320 in the direction X1-X2 and the other two of the four small panels 321 being arranged in the frame 320 in the direction Z1-Z2. The second back panel 80M comprises: a grid-like frame 330; and four small panels 331 each having a quarter size of the second back panel 80M, two of the four small panels 331 being arranged in the frame 330 in the direction X1-X2 and the other two of the four small panels 331 being arranged in the frame 330 in the direction Z1-Z2.

The small panels 321 of the first back panel 70M are supplied with a voltage via the frame 320. The small panels 331 of the second back panel 80M are supplied with a voltage via the frame 330.

The first back panel 70M and the second back panel 80M can be enlarged by multiplying the small panels 321 and 331 arranged in the direction X1-X2 and in the direction Z1-Z2.

It should be noted that each of the small panels 321 and 331 can be minimized in size so as to have only one set of connectors for connecting the crossbar-board 60 and the motherboard 51.

Figure 24:
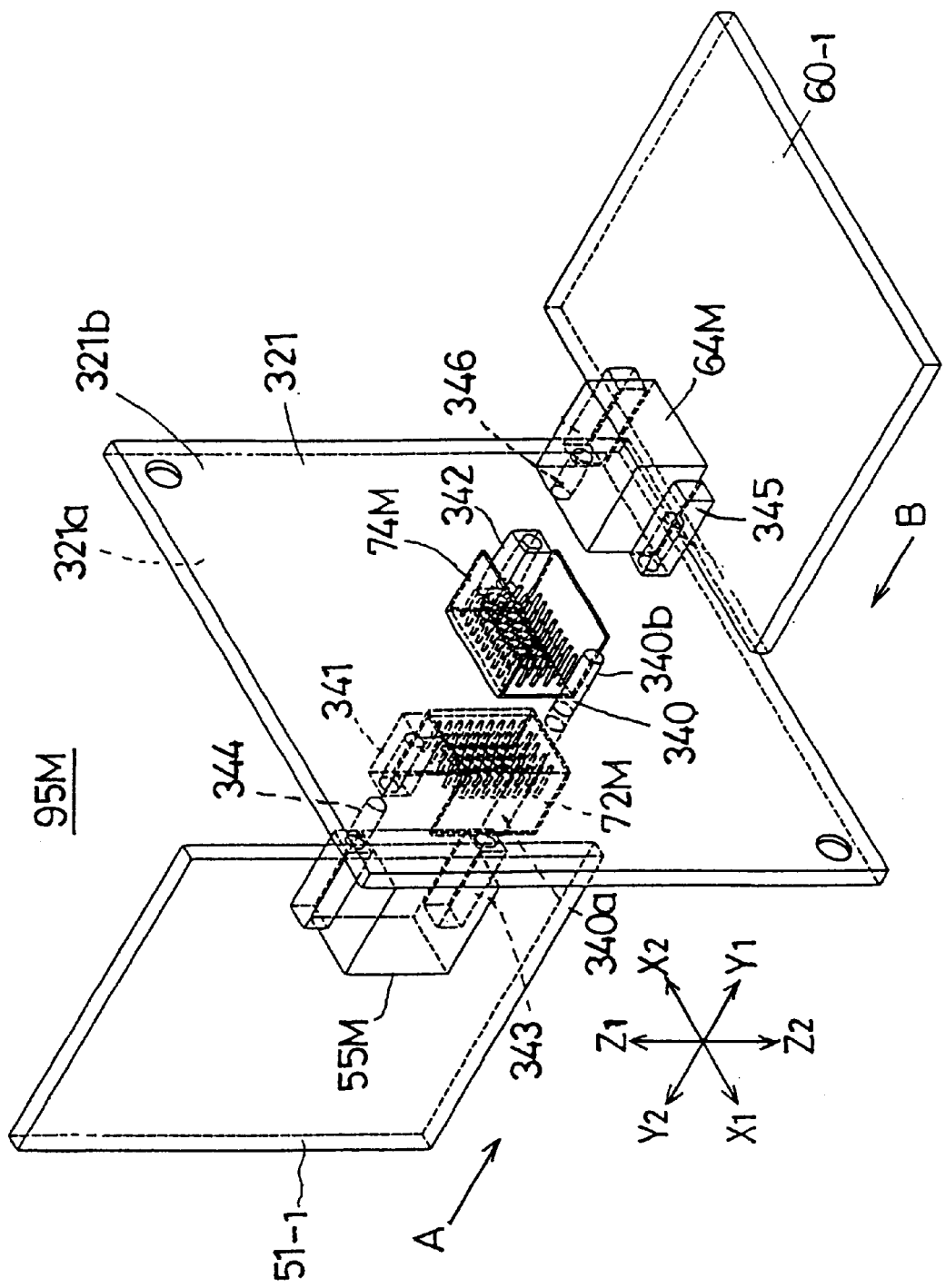
FIG. 24 is an illustration of a first connection part on each of small panels shown in FIG. 23.

FIG. 24 is an illustration of a structure of a first connection part 95M on each of the small panels 321 shown in FIG. 23. The small panel 321 is supported in a floating state where the small panel 321 is movable slightly in the plane X-Z. The small panel 321 comprises: a plug-connector 72M mounted on a surface 321a so as to be connected to the motherboard 51-1; and a plug-connector 74M mounted on a surface 321b so as to be connected to the crossbar-board 60-1. The plug-connector 72M and the plug-connector 74M are connected by wiring patterns in the small panel 321.

The small panel 321 also comprises: a guide pin 340 passed through and fixed at a position of the small panel 321 under the plug-connector 72M and by a side of the plug-connector 74M; a guide cylinder 341 placed above the plug-connector 72M on the surface 321a; and a guide cylinder 342 placed by the other side of the plug-connector 74M on the surface 321b. The guide pin 340 has: a guide-pin part 340a projecting in the direction Y2 on the surface 321a; and a guide-pin part 340b projecting in the direction Y1 on the surface 321b. That is, the guide-pin part 340a and the guide cylinder 341 are placed under and above the plug-connector 72M in the directions Z2-Z1, respectively. The guide-pin part 340b and the guide cylinder 342 are placed on both sides of the plug-connector 74M in the directions X1-X2, respectively.

A jack-connector 55M of the motherboard 51-1 has a guide cylinder 343 and a guide pin 344 placed under and above the jack-connector 55M in the directions Z2-Z1, respectively. A jack-connector 64M of the crossbar-board 60-1 has a guide cylinder 345 and a guide pin 346 placed on both sides of the jack-connector 64M in the directions X1-X2, respectively.

In assembling the multiprocessor 50M, when the crossbar-board 60-1 is moved in a direction indicated by an arrow B and is connected to the first back panel 70M comprising the small panels 321, the guide pin 346 is inserted into the guide cylinder 342, and the guide cylinder 345 has the guide-pin part 340b inserted therein. Subsequently, the small panel 321 is moved slightly in the plane X-Z so that the plug-connector 74M oppose the jack-connector 64M accurately. Hence, the jack-connector 64M is properly connected to the plug-connector 74M.

Also, when the motherboard 51-1 is moved in a direction indicated by an arrow A and is connected to the first back panel 70M comprising the small panels 321, the guide pin 344 is inserted into the guide cylinder 341, and the guide cylinder 343 has the guide-pin part 340a inserted therein. Subsequently, the small panel 321 is moved slightly in the plane X-Z so that the plug-connector 72M oppose the jack-connector 55M accurately. Hence, the jack-connector 55M is properly connected to the plug-connector 72M.

Therefore, the small panel 321 does not have to be positioned precisely in the frame 320, facilitating an assembly of the first back panel 70M. In the same manner, the small panel 331 of the second back panel 80M does not have to be positioned precisely in the frame 330, facilitating an assembly of the second back panel 80M.

Figure 25:
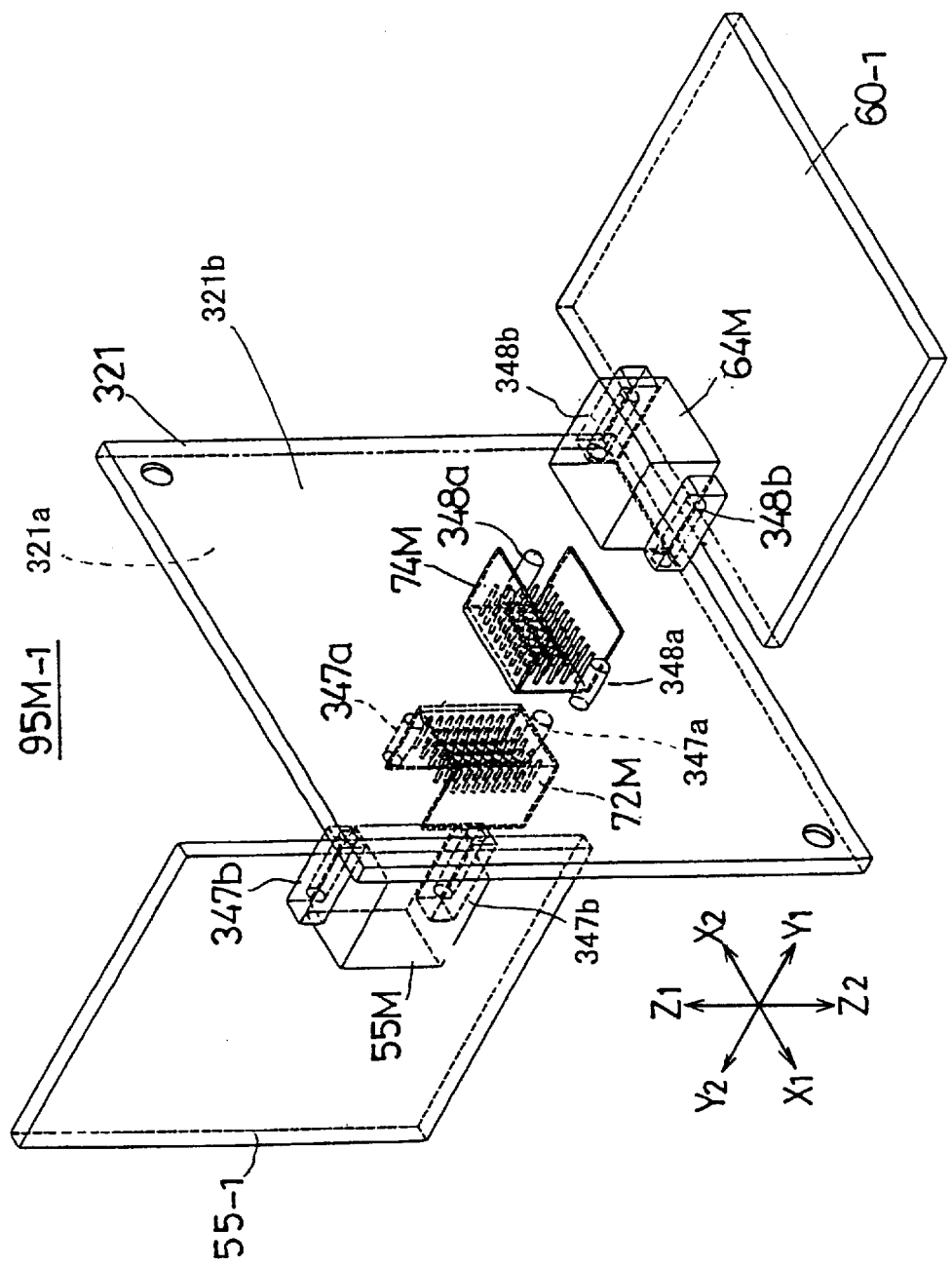
FIG. 25 is an illustration of a first variation of the first connection part shown in FIG. 24.

FIG. 25 is an illustration of a structure of a first connection part 95M-1, which is a first variation of the above-mentioned first connection part 95M shown in FIG. 24. The plug-connector 72M on the surface 321a of the small panel 321 has a pair of guide pins 347a. The plug-connector 74M on the surface 321b of the small panel 321 has a pair of guide pins 348a. The jack-connector 64M of the crossbar-board 60-1 has a pair of guide cylinders 348b. The jack-connector 55M of the motherboard 51-1 has a pair of guide cylinders 347b. In connecting the crossbar-board 60-1 to the first back panel 70M comprising the small panels 321, the guide cylinders 348b have the guide pins 348a inserted therein, and then, the small panel 321 is moved slightly in the plane X-Z so that the jack-connector 64M is properly connected to the plug-connector 74M. Also, in connecting the motherboard 55-1 to the first back panel 70M comprising the small panels 321, the guide cylinders 347b have the guide pins 347a inserted therein, and then, the small panel 321 is moved slightly in the plane X-Z so that the jack-connector 55M is properly connected to the plug-connector 72M.

Figure 26:
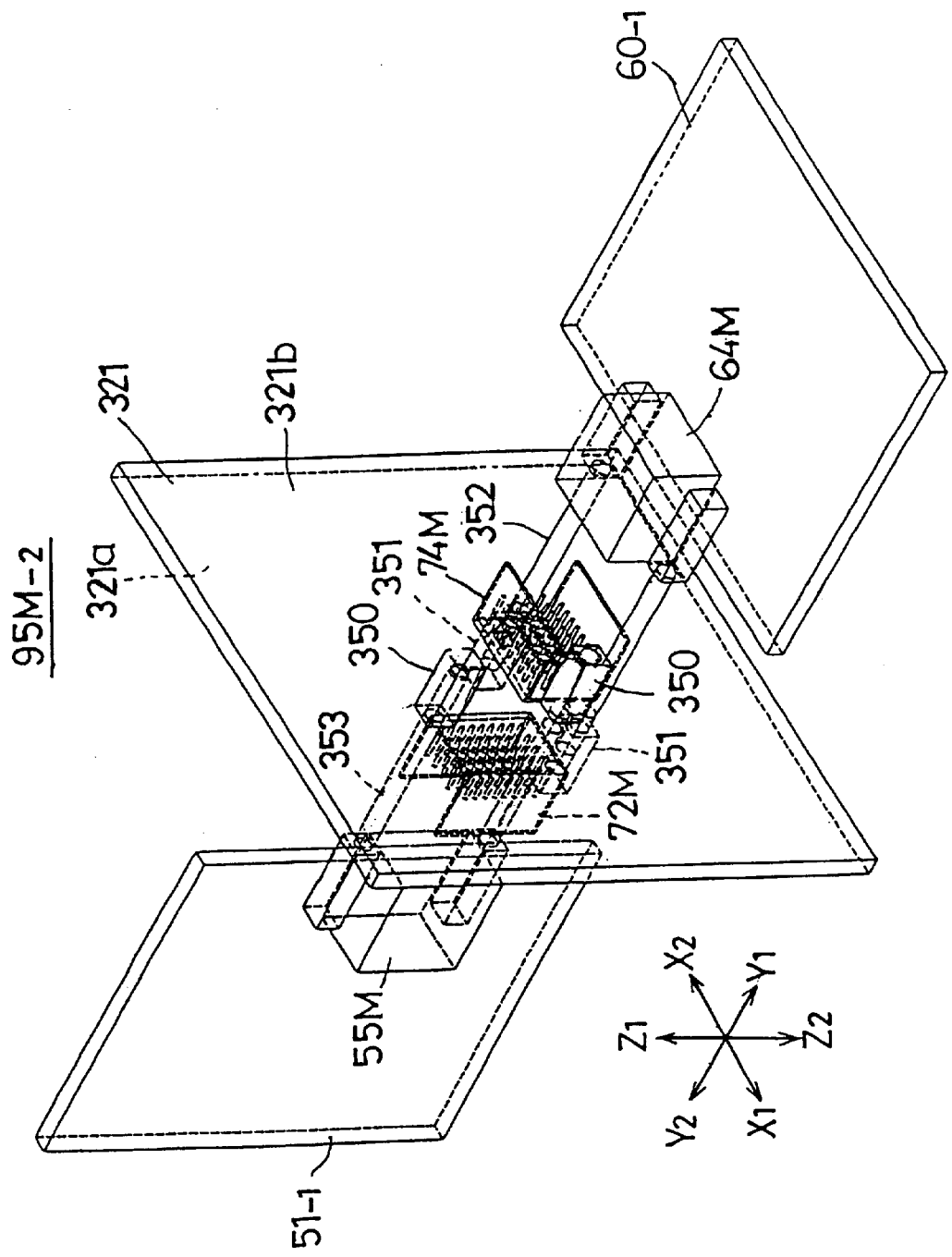
FIG. 26 is an illustration of a second variation of the first connection part shown in FIG. 24.

FIG. 26 is an illustration of a structure of a first connection part 95M-2, which is a second variation of the above-mentioned first connection part 95M shown in FIG. 24. The plug-connector 72M on the surface 321a of the small panel 321 has a pair of guide cylinders 350 on the opposite surface 321b. The plug-connector 74M on the surface 321b of the small panel 321 has a pair of guide cylinders 351 on the opposite surface 321a. The jack-connector 64M of the crossbar-board 60-1 has a pair of guide pins 352. The jack-connector 55M of the motherboard 51-1 has a pair of guide pins 353. The guide pins 352 and 353 each have a length enough to pass through the small panel 321.

In connecting the crossbar-board 60-1 to the first back panel 70M comprising the small panels 321, the guide pins 352 are passed through the small panel 321 and are inserted into the guide cylinders 351 on the opposite surface, and then, the small panel 321 is moved slightly in the plane X-Z so that the jack-connector 64M is properly connected to the plug-connector 74M. Also, in connecting the motherboard 55-1 to the first back panel 70M comprising the small panels 321, the guide pins 353 are passed through the small panel 321 and are inserted into the guide cylinders 350 on the opposite surface, and then, the small panel 321 is moved slightly in the plane X-Z so that the jack-connector 55M is properly connected to the plug-connector 72M.

14. Fourteenth Embodiment

Figure 27:
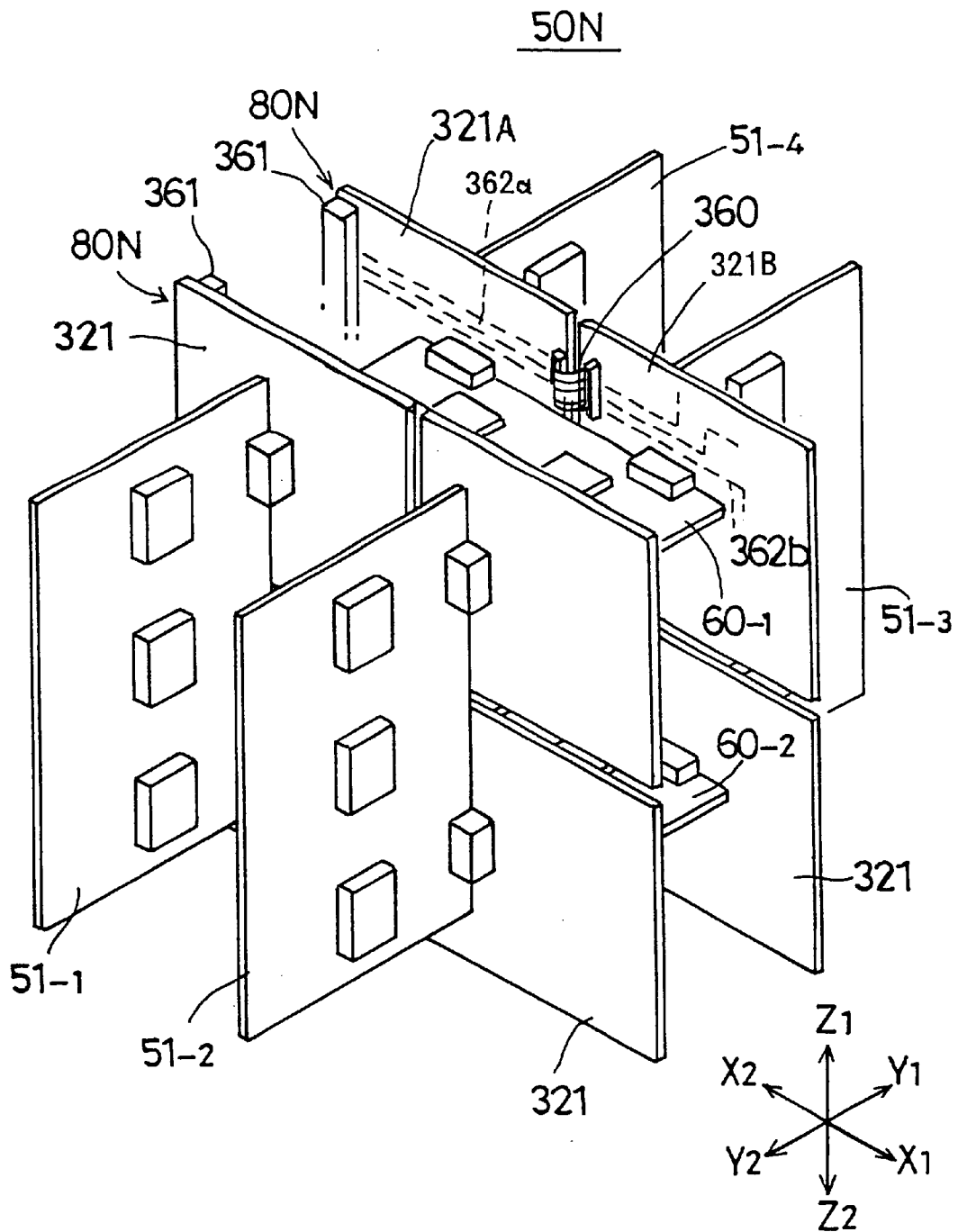
FIG. 27 is an illustration of a multiprocessor according to a fourteenth embodiment of the present invention.

FIG. 27 is an illustration of a multiprocessor 50N according to a fourteenth embodiment of the present invention. The multiprocessor 50N has substantially the same structure as the multiprocessor 50M shown in FIG. 23. The multiprocessor 50N comprises: a flexible connector 360; adjacent small panels 321A and 321B connected to each other thereby; and a power-supply connector 361 mounted on an edge of the small panel 321A in the direction X2. The small panels 321A and 321B have power-supply patterns 362a and 362b formed thereon, respectively.

An electric power is inputted to the power-supply connector 361, and then is supplied via the power-supply patterns 362a, the flexible connector 360 and the power-supply patterns 362b to the motherboards 51 and the crossbar-boards 60.

The above-mentioned multiprocessor 50N has a structure where an electric power is supplied in the direction X2 to X1.

15. Fifteenth Embodiment

Figure 28:
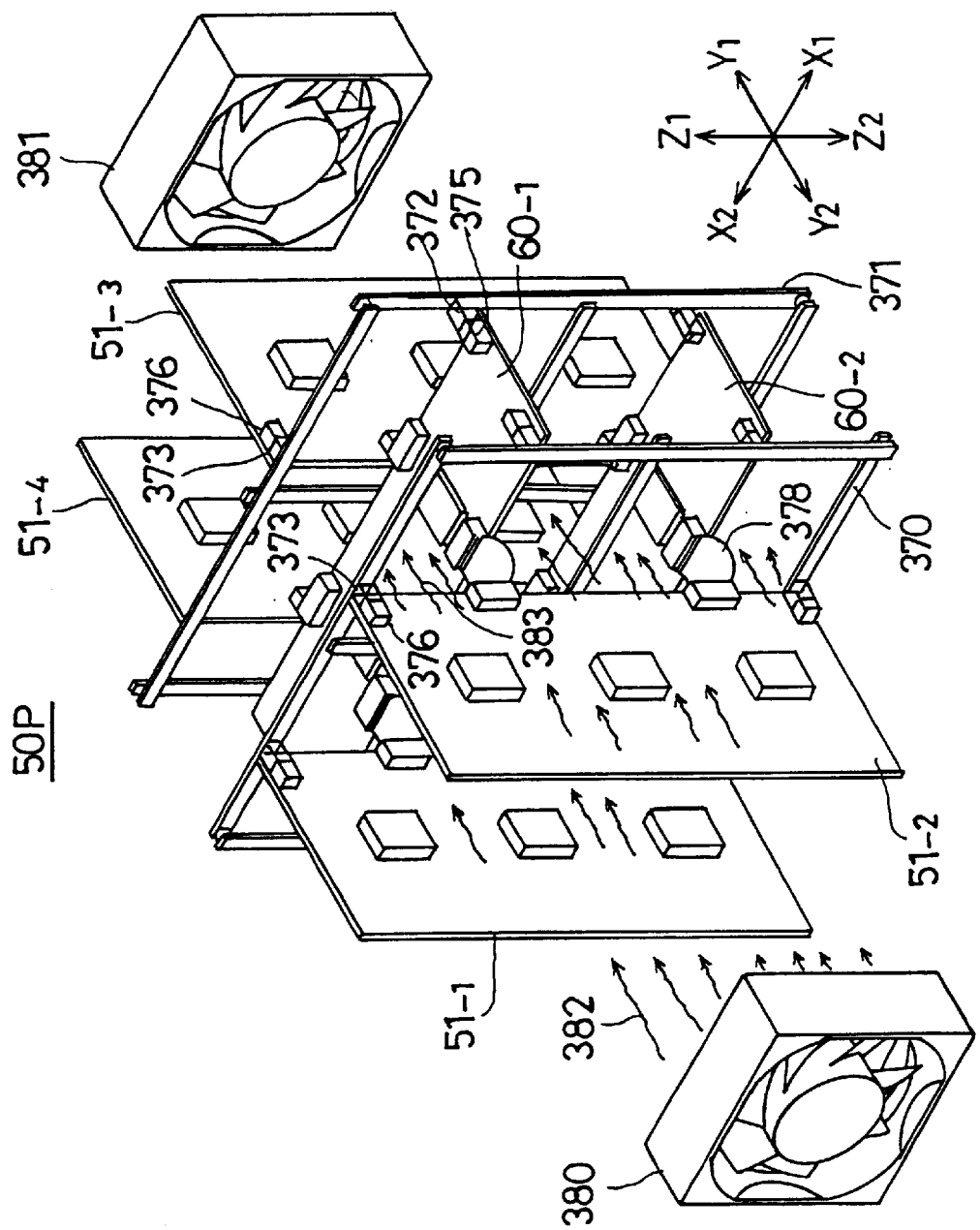
FIG. 28 is an illustration of a multiprocessor according to a fifteenth embodiment of the present invention.

FIG. 28 is an illustration of a multiprocessor 50P according to a fifteenth embodiment of the present invention. The multiprocessor 50P is an SMP (Symmetric Multiprocessor) of the crossbar-interconnect type. The multiprocessor 50P comprises: two grid-like power-supply frames 370 and 371; the two crossbar-boards 60-1 and 60-2; and the four motherboards 51-1 to 51-4. Each of the power-supply frames 370 and 371 has: connectors 372 for the crossbar-boards 60-1 and 60-2; and connectors 373 for the motherboards 51-1 and 51-2 or the motherboards 51-3 to 51-4.

The power-supply frames 370 and 371 oppose each other. Each of the two crossbar-boards 60-1 and 60-2 has connectors 375, and is placed horizontally between the two power-supply frames 370 and 371 with the connectors 375 connected to the connectors 372. Each of the motherboards 51-1 and 51-2 has connectors 376, and is supported vertically by the power-supply frame 370 with the connectors 376 connected to the connectors 373. Each of the motherboards 51-3 and 51-4 also has the connectors 376, and is supported vertically by the power-supply frame 371 with the connectors 376 connected to the connectors 373. Each of the motherboards 51-1 and 51-2 is connected to the two crossbar-boards 60-1 and 60-2 by flexible-cable connectors 378 each comprising a flexible cable and connectors on both ends thereof. Each of the motherboards 51-3 and 51-4 is connected to the two crossbar-boards 60-1 and 60-2 also by other flexible-cable connectors 378. The multiprocessor 50P.

In this multiprocessor 50P, all of signal wires in the flexible-cable connectors 378 between the crossbar-boards 60-1 and 60-2 and the motherboards 51-1 and 51-4 have an equal length. Thus, the equal-length wiring of the crossbar-boards 60 is not impaired at all. Hence, the multiprocessor 50P is an optimal SMP.

Additionally, motor-driven fans 380 and 381 are arranged on both sides of the multiprocessor 50P in the directions Y2 and Y1. The fan 380 sends air in the multiprocessor 50P as indicated by arrows 382. The fan 381 sends the air out of the multiprocessor 50P. Since the multiprocessor 50P has no back panels, the air moves even on the crossbar-boards 60-1 and 60-2. Thereby, the multiprocessor 50P can be effectively forced-air cooled.

16. Sixteenth Embodiment

Figure 29:
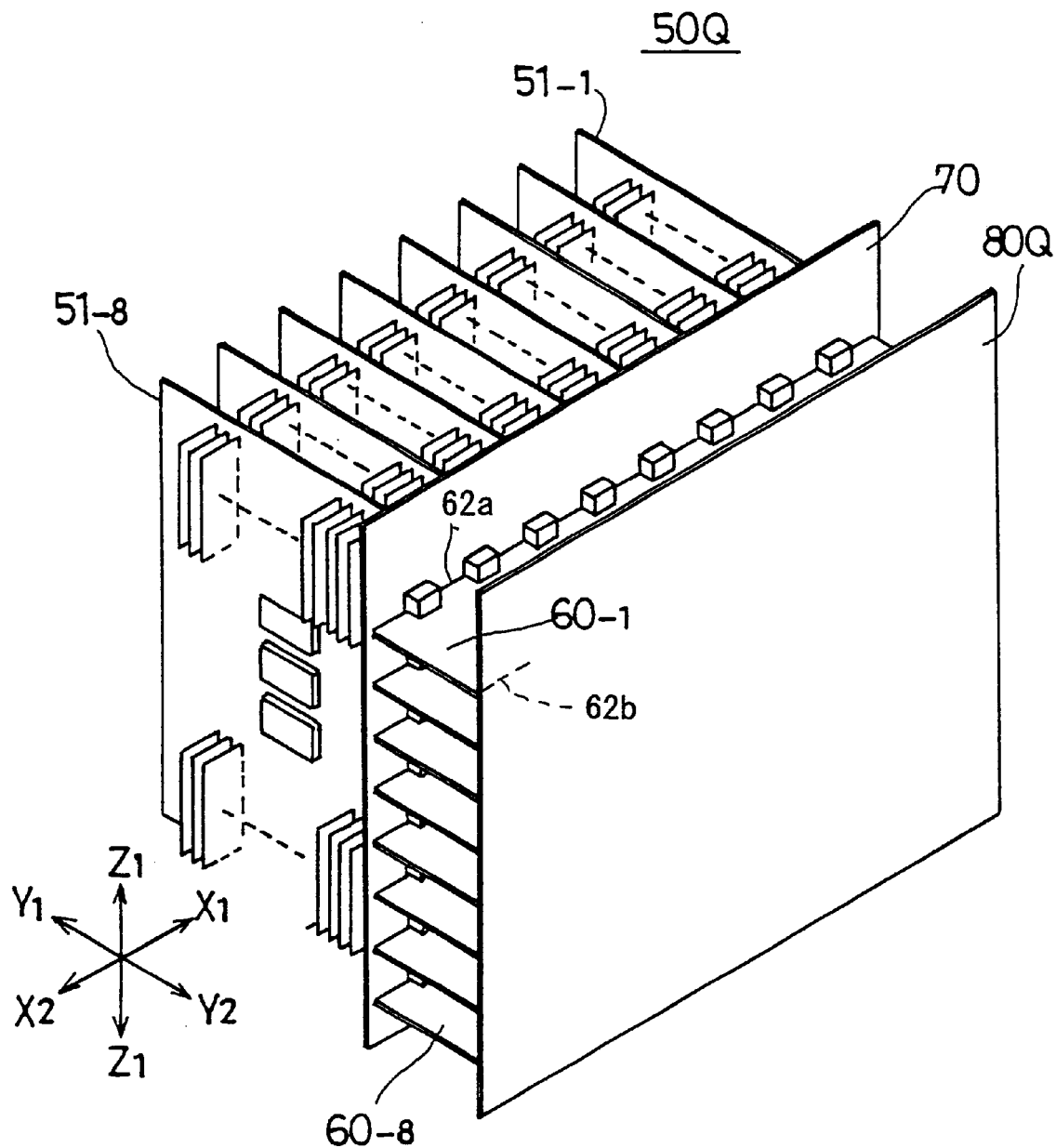
FIG. 29 is an illustration of a multiprocessor according to a sixteenth embodiment of the present invention.

FIG. 29 is an illustration of a multiprocessor 50Q according to a sixteenth embodiment of the present invention. The multiprocessor 50Q is an SMP (Symmetric Multiprocessor) of the crossbar-interconnect type, and has motherboards only on one side thereof. In FIG. 29, elements corresponding to the elements in FIG. 2 are marked by the same reference characters as in FIG. 2.

The multiprocessor 50Q comprises: the eight crossbar-boards 60-1 to 60-8; the first back panel 70 connected to the longitudinal sides 62a of the crossbar-boards 60-1 to 60-8; a second back panel 80Q placed opposite the first back panel 70 and connected to the longitudinal sides 62b of the crossbar-boards 60-1 to 60-8; and the eight motherboards 51-1 to 51-8 connected to the first back panel 70.

The second back panel 80Q has no motherboards connected thereto. The second back panel 80Q has wiring patterns extending lengthwise and obliquely on a surface thereof. The second back panel 80Q has a sole function to connect the crossbar-boards 60-1 to 60-8 to each other.

In a conventional multiprocessor that does not have the second back panel 80Q, the crossbar-boards 60-1 to 60-8 are connected to each other by the motherboards 51-1 to 51-8. Therefore, in a conventional multiprocessor, the motherboards 51 have a comparatively large number of wiring patterns. However, the multiprocessor 50Q according to the present invention comprises the second back panel 80Q connecting the crossbar-boards 60-1 to 60-8 to each other so that the motherboards 51 have a smaller number of wiring patterns.

Though the second back panel 80Q has no motherboards connected thereto, the above-mentioned structures and the variations thereof according to the other embodiments of the present invention are applicable to the multiprocessor 50Q according to the present embodiment.

17. Seventeenth Embodiment

Figure 30:
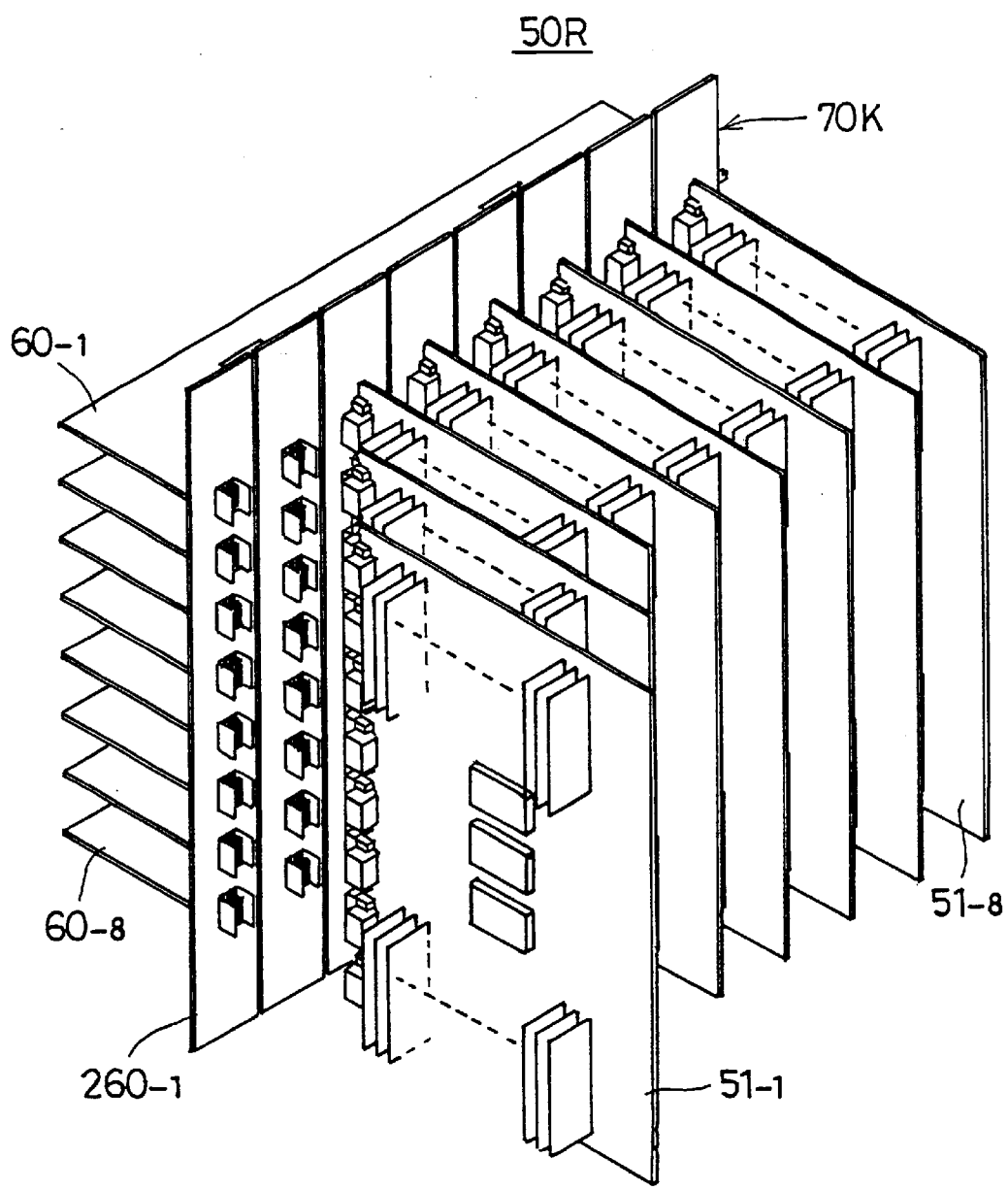
FIG. 30 is an illustration of a multiprocessor according to a seventeenth embodiment of the present invention.

FIG. 30 is an illustration of a multiprocessor 50R according to a seventeenth embodiment of the present invention. The multiprocessor 50R has the same structure as the multiprocessor 50K shown in FIG. 19 according to the eleventh embodiment, except that the multiprocessor 50R does not comprise the second back panel 80K and the motherboards 51-9 to 51-16.

The multiprocessor 50R comprises: the eight crossbar-boards 60-1 to 60-8; the first back panel 70K; and the eight motherboards 51-1 to 51-8. The first back panel 70K is formed by the strip panels 260-1 to 260-8.

The multiprocessor 50R is an embodiment wherein the structure of the multiprocessor 50K comprising the back panels 70K and 80K formed by the strip panels 260 shown in FIG. 19 is applied to a multiprocessor having a single back panel.

The above-mentioned structures shown in FIG. 8 to FIG. 28 are also applicable to a multiprocessor having a single back panel.

Next, descriptions will be given of a plurality of methods of assembling the crossbar board-back panel assembly 88 being the core of the multiprocessor 50 shown in FIG. 2. It is noted that the crossbar board-back panel assembly 88 comprises the crossbar-boards 60, the first back panel 70 and the second back panel 80.

1. First Assembling Method

FIG. 31A is a perspective view showing a first assembling method of the crossbar board-back panel assembly 88. FIG. 31B is a side view showing the first assembling method of the crossbar board-back panel assembly 88. The first assembling method uses an assembling apparatus 400 comprising a fixed stage 401 and a movable stage 402. First, the crossbar-boards 60-1 to 60-5 are connected to the first back panel 70. Second, the first back panel 70 connected with the crossbar-boards 60-1 to 60-5 is set and fixed to the fixed stage 401. Then, the second back panel 80 is set to the movable stage 402 in the plane X-Z and is supported in opposition to the first back panel 70. Next, the second back panel 80 together with the movable stage 402 is moved in a direction indicated by an arrow 403 closer to the first back panel 70 so that the second back panel 80 is connected to the crossbar-boards 60-1 to 60-5.

Noticeably, a frame 405 made of an elastic material is attached to the second back panel 80. The second back panel 80 is surrounded by the frame 405.

The second back panel 80 is supported to the movable stage 402 by the frame 405. Therefore, the elastic frame 405 allows the second back panel 80 to move a little on the movable stage 402 in the directions X1-X2 and the directions Z1-Z2.

Hence, in the course of connecting the plug-connectors of the second back panel 80 to the jack-connectors of the crossbar-boards 60-1 to 60-5, the second back panel 80 is moved properly in the plane X-Z so as to adjust positions of the plug-connectors and the jack-connectors. Thereby, the plug-connectors of the second back panel 80 are smoothly and appropriately connected to the jack-connectors of the crossbar-boards 60-1 to 60-5.

It should be noted that a weight of the second back panel 80 is supported by the movable stage 402 via the elastic frame 405. Therefore, the weight of the second back panel 80 is absorbed by the elastic frame 405. This keeps the plug-connectors and the jack-connectors from being damaged by the weight of the second back panel 80.

2. Second Assembling Method

Figure 32B:
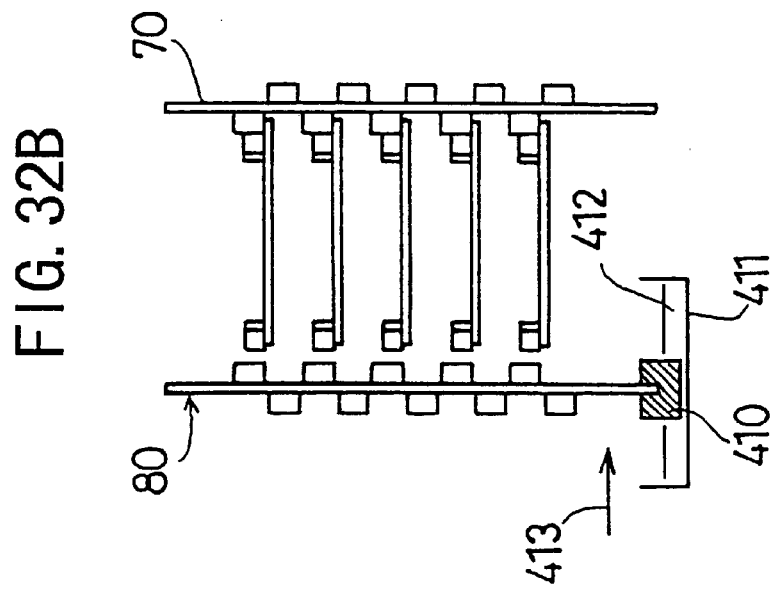
FIG. 32B is a side view showing the second assembling method of the crossbar board-back panel assembly shown in FIG. 2.
Figure 32A:
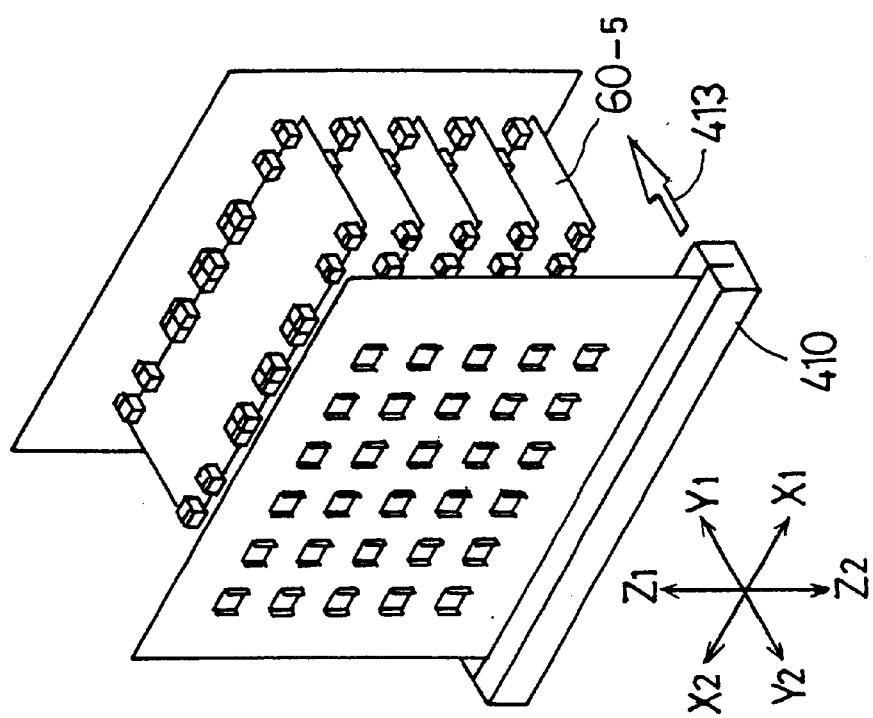
FIG. 32A is a perspective view showing a second assembling method of the crossbar board-back panel assembly shown in FIG. 2.

FIG. 32A is a perspective view showing a second assembling method of the crossbar board-back panel assembly 88. FIG. 32B is a side view showing the second assembling method of the crossbar board-back panel assembly 88. In the second assembling method, the second back panel 80 is fixed to a float 410. The float 410 is in a shallow and wide tank 411 containing a water 412. The second back panel 80 together with the float 410 is moved in a direction indicated by an arrow 413 so that the second back panel 80 is connected to the crossbar-boards 60-1 to 60-5.

In this course, the weight of the second back panel 80 is reduced to the extent of a buoyancy acting on the float 410. This allows the second back panel 80 to be moved properly in the directions X1-X2 and the directions Z1-Z2 in adjusting positions of the plug-connectors of the second back panel 80 and the jack-connectors of the crossbar-boards 60-1 to 60-5. Thereby, the plug-connectors of the second back panel 80 are smoothly and appropriately connected to the jack-connectors of the crossbar-boards 60-1 to 60-5.

The above-mentioned buoyancy may be replaced by an air pressure.

Next, descriptions will be given of variations of the crossbar board-back panel assembly 88.

1. First Variation

Figure 33:
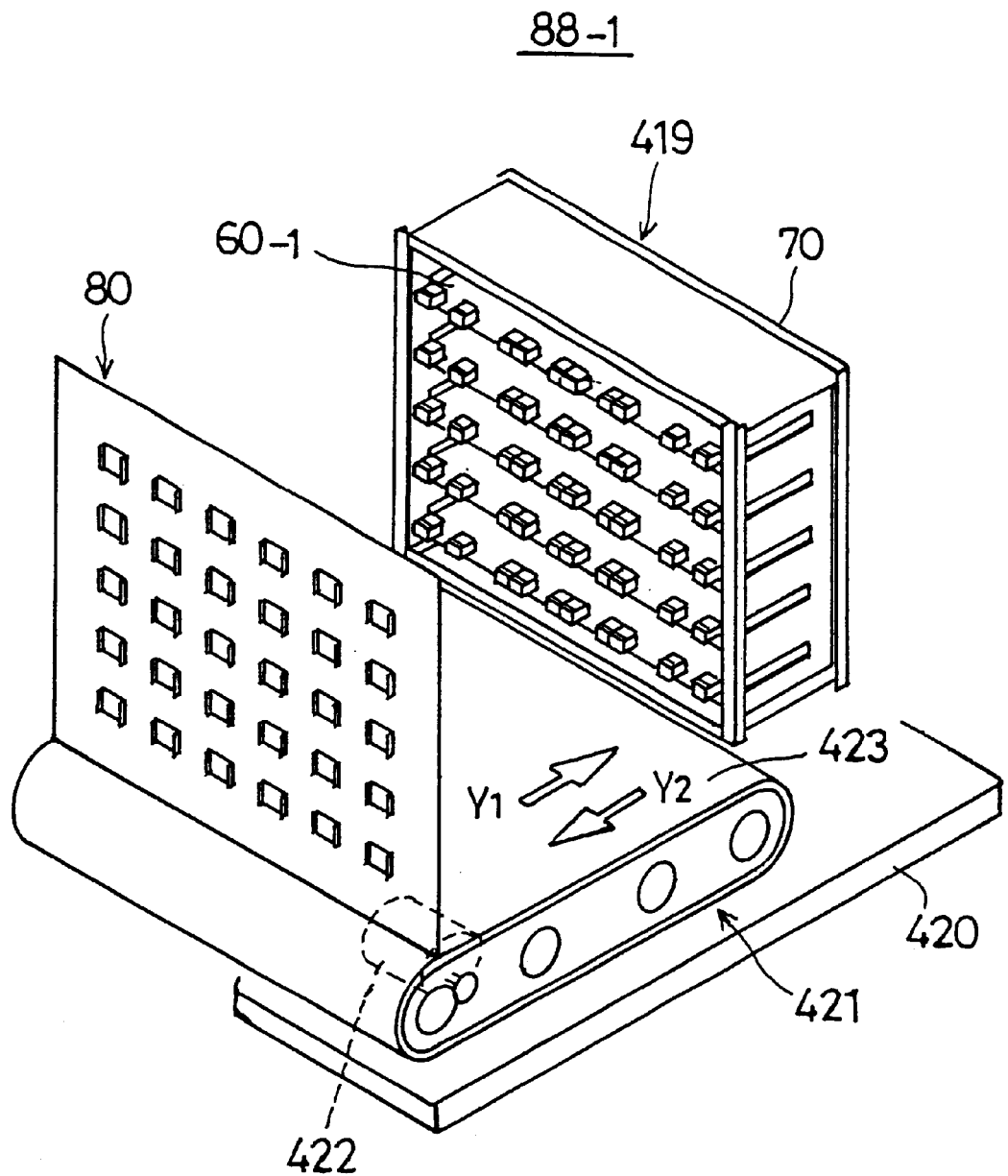
FIG. 33 is an illustration of a first variation of the crossbar board-back panel assembly shown in FIG. 2.

FIG. 33 is an illustration of a crossbar board-back panel assembly 88-1, which is a first variation of the above-mentioned crossbar board-back panel assembly 88. As shown in FIG. 33, the crossbar board-back panel assembly 88-1 comprises: a stage 420 for the following elements; a shelf 419 containing the first back panel 70 and the crossbar-boards 60-1 to 60-5 connected thereto; a driving-belt machine 421; and the second back panel 80 attached thereon.

The driving-belt machine 421 comprises: a motor 422; and a belt 423 driven thereby. The bottom edge of the second back panel 80 is fixed vertically on the belt 423.

The crossbar board-back panel assembly 88-1 is assembled by using a driving force of the motor 422. That is, the driving-belt machine 421 is started to operate so as to drive the belt 423. Thereby, the second back panel 80 is moved in a direction indicated by an arrow Y1 so as to be connected to the crossbar-boards 60-1 to 60-5. In this way, the crossbar board-back panel assembly 88-1 is assembled.

In performing a maintenance of the multiprocessor, the driving-belt machine 421 is started to operate so as to drive the belt 423 in the reverse direction. Thereby, the second back panel 80 is moved in a direction indicated by an arrow Y2 so as to be disconnected from the crossbar-boards 60-1 to 60-5. Accordingly, the multiprocessor can be maintained.

2. Second Variation

Figure 34:
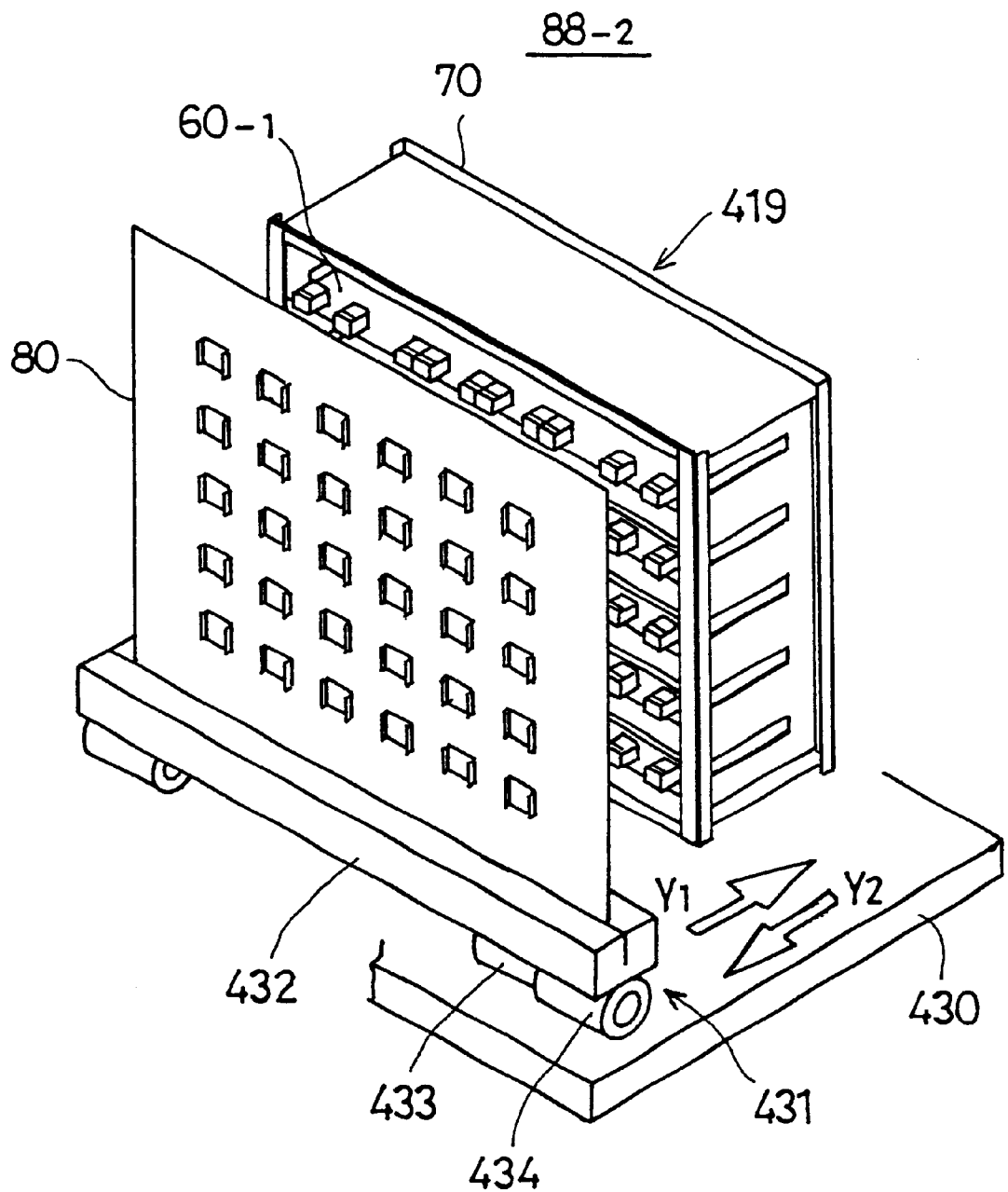
FIG. 34 is an illustration of a second variation of the crossbar board-back panel assembly shown in FIG. 2.

FIG. 34 is an illustration of a crossbar board-back panel assembly 88-2, which is a second variation of the above-mentioned crossbar board-back panel assembly 88. As shown in FIG. 34, the crossbar board-back panel assembly 88-2 comprises: a stage 430 for the following elements; the shelf 419 containing the first back panel 70 and the crossbar-boards 60-1 to 60-5 connected thereto; a driving dolly 431; and the second back panel 80 attached thereon.

The driving dolly 431 comprises: a body 432; a motor 433 attached on the bottom thereof; and wheels 434 driven thereby. The bottom edge of the second back panel 80 is fixed vertically on the body 432.

The crossbar board-back panel assembly 88-2 is assembled by driving the driving-dolly 431, and moving the second back panel 80 in a direction indicated by an arrow Y1 so as to connect the second back panel 80 to the crossbar-boards 60-1 to 60-5.

In performing a maintenance of the multiprocessor, the driving dolly 431 is driven in the reverse direction. Thereby, the second back panel 80 is moved in a direction indicated by an arrow Y2 so as to be disconnected from the crossbar-boards 60-1 to 60-5. Accordingly, the multiprocessor can be maintained.

3. Third Variation

FIG. 35A is an illustration of a crossbar board-back panel assembly 88-3, which is a third variation of the above-mentioned crossbar board-back panel assembly 88. As shown in FIG. 35A, the crossbar board-back panel assembly 88-3 comprises: a stage 441 with casters 440 attached on the bottom thereof; and the shelf 419 containing the first back panel 70 and the second back panel 80 each connected to the crossbar-boards 60-1 to 60-5.

FIG. 35B is an illustration of a server 450 including a room 453 to contain the crossbar board-back panel assembly 88-3 shown in FIG. 35A. As shown in FIG. 35B, the server 450 comprises two separate bodies 451 and 452. The body 451 has the room 453 at a lower part thereof to accommodate the crossbar board-back panel assembly 88-3.

FIG. 35C is an illustration of the server 450 containing the crossbar board-back panel assembly 88-3 in the room 453. The crossbar board-back panel assembly 88-3 shown in FIG. 35A is capable of moving on the rolling casters 440 thereof so that, as shown in FIG. 35C, the crossbar board-back panel assembly 88-3 is contained and fixed in the room 453. Then, the motherboards 51 are plugged in and connected to the crossbar board-back panel assembly 88-3, composing the multiprocessor 50.

In performing a maintenance of the multiprocessor 50, the body 451 is moved so that the motherboards 51 can be pulled out. Then, the crossbar board-back panel assembly 88-3 is moved on the rolling casters 440 so that the crossbar board-back panel assembly 88-3 is taken out of the room 453.

The crossbar board-back panel assembly 88-3 is removed from the server 450 efficiently by using the casters 440. Also, after a maintenance, the crossbar board-back panel assembly 88-3 is moved to and contained in the server 450 efficiently by using the casters 440.

4. Fourth Variation

Figure 36A:
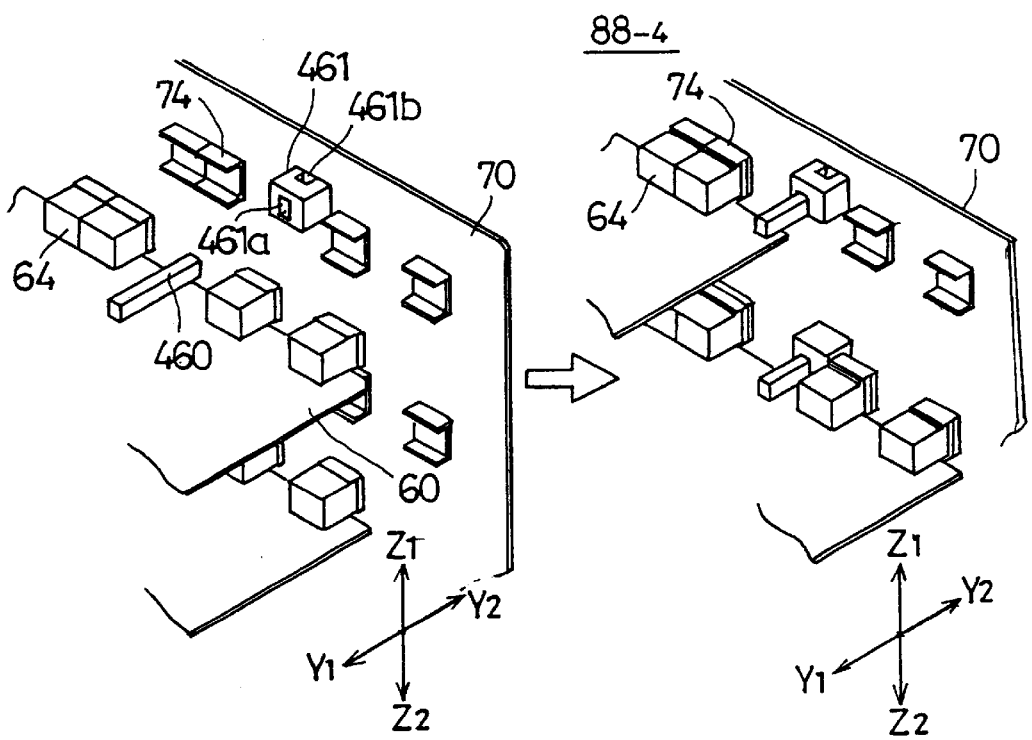
FIG. 36A is an illustration of the crossbar-board being connected to the first back panel, of a fourth variation of the crossbar board-back panel assembly shown in FIG. 2.
Figure 36B:
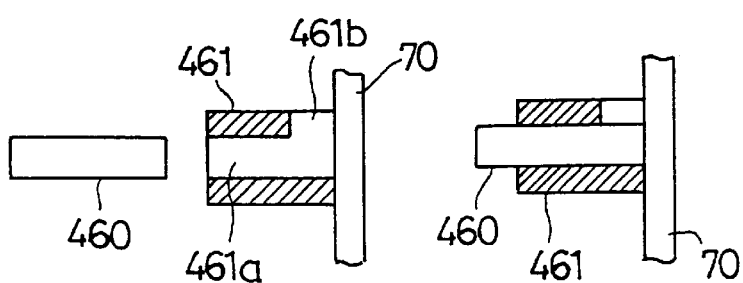
FIG. 36B is a cross-sectional view of a connection pin shown in FIG. 36A before being inserted into a connection block.
Figure 36C:
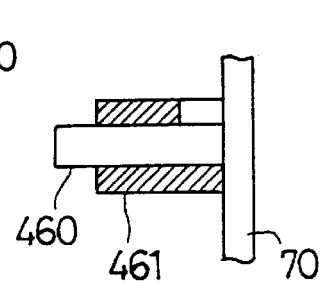
FIG. 36C is a cross-sectional view of the connection pin shown in FIG. 36A inserted into the connection block.
Figure 36D:
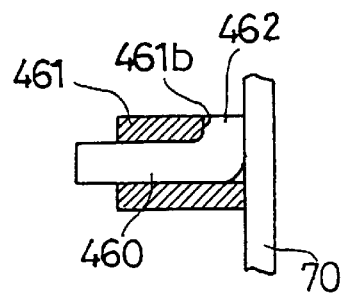
FIG. 36D is a cross-sectional view of the connection pin shown in FIG. 36A bending upward in the connection block.

FIG. 36A is an illustration of the crossbar-board 60 being connected to the first back panel 70, of a crossbar board-back panel assembly 88-4, which is a fourth variation of the above-mentioned crossbar board-back panel assembly 88. FIG. 36B is a cross-sectional view of a connection pin 460 shown in FIG. 36A before being inserted into a connection block 461. FIG. 36C is a cross-sectional view of the connection pin 460 shown in FIG. 36A inserted into the connection block 461. FIG. 36D is a cross-sectional view of the connection pin 460 shown in FIG. 36A bending upward in the connection block 461. As shown in FIG. 36A, the crossbar board 60 comprises the connection pin 460 fixed on the surface thereof and partly protruding in the direction Y2. The connection pin 460 is made of a shape memory alloy so that one end of the protruding part of the connection pin 460 bends upward in the direction Z1 at a temperature T1° C. raised by the multiprocessor in operation. The connection pin 460 is straight at a normal temperature. When the temperature is raised to T1° C., a part 462 of the connection pin 460 bends upward in the direction Z1, as shown in FIG. 36D. The first back panel 70 comprises a connection block 461 fixed at a position of the surface thereof corresponding to the connection pin 460. As shown in FIG. 36B, the connection block 461 comprises: a hole 461a into which the connection pin 460 is inserted; and a hooked hole 461b perpendicular to the hole 461a.

The crossbar board-back panel assembly 88-4 is assembled by connecting the crossbar board 60 and the first back panel 70 with the jack-connector 64 connected to the plug-connector 74, and the connection pin 460 inserted into the hole 461a of the connection block 461 as shown in FIG. 36C.

Thereafter, when the multiprocessor is initially brought into operation and then the temperature is raised to T1° C., the part 462 of the connection pin 460 bends upward and hooks in the hooked hole 461b, as shown in FIG. 36D. After this, the connection pin 460 maintains this shape, firming the connection between the crossbar board 60 and the first back panel 70.

5. Fifth Variation

Figure 37:
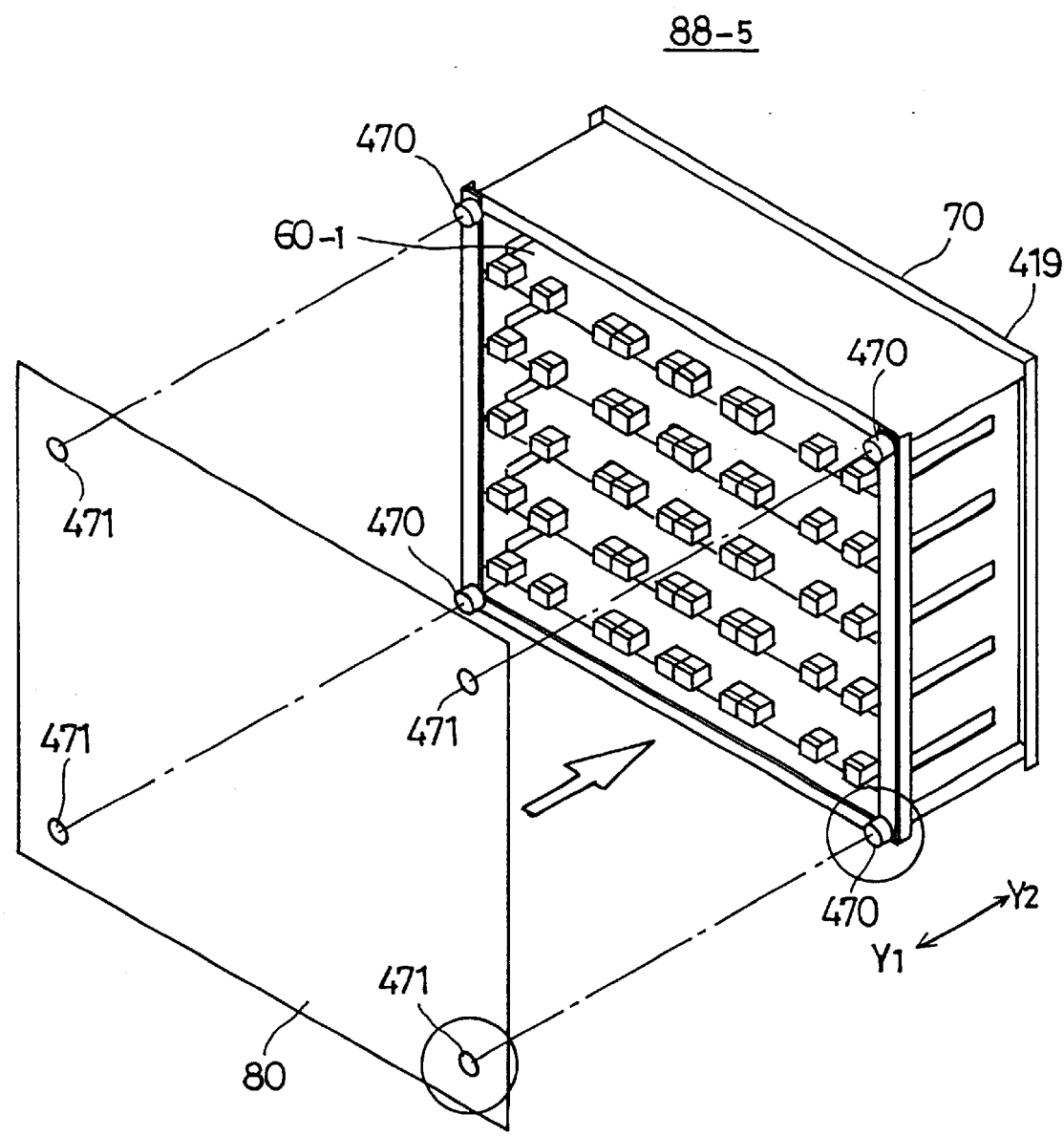
FIG. 37 is an illustration of a fifth variation of the crossbar board-back panel assembly shown in FIG. 2.

FIG. 37 is an illustration of a crossbar board-back panel assembly 88-5, which is a fifth variation of the above-mentioned crossbar board-back panel assembly 88. The crossbar board-back panel assembly 88-5 comprises: the shelf 419; the first back panel 70 attached to a side thereof in the direction Y2; the crossbar-boards 60-1 to 60-5 connected to the first back panel 70 in the shelf 419; and the second back panel 80 attached to a side of the shelf 419 in the direction Y1 and connected to the crossbar-boards 60-1 to 60-5.

The second back panel 80 is attached to the shelf 419 already attached with the first back panel 70 connected with the crossbar-boards 60, as a final step of manufacturing the crossbar board-back panel assembly 88-5.

The shelf 419 comprises light-emitters 470 on the four corners of the side thereof in the direction Y1. The second back panel 80 comprises light-receivers 471 on the four corners of the surface thereof in the direction Y2. In the course of attaching the second back panel 80 to the shelf 419, the second back panel 80 is adjusted in position so that the light-receivers 471 of the second back panel 80 equally receive lights emitted by the light-emitters 470 of the shelf 419. Thus, the second back panel 80 is smoothly connected to the crossbar-boards 60-1 to 60-5.

6. Sixth Variation

Figure 38:
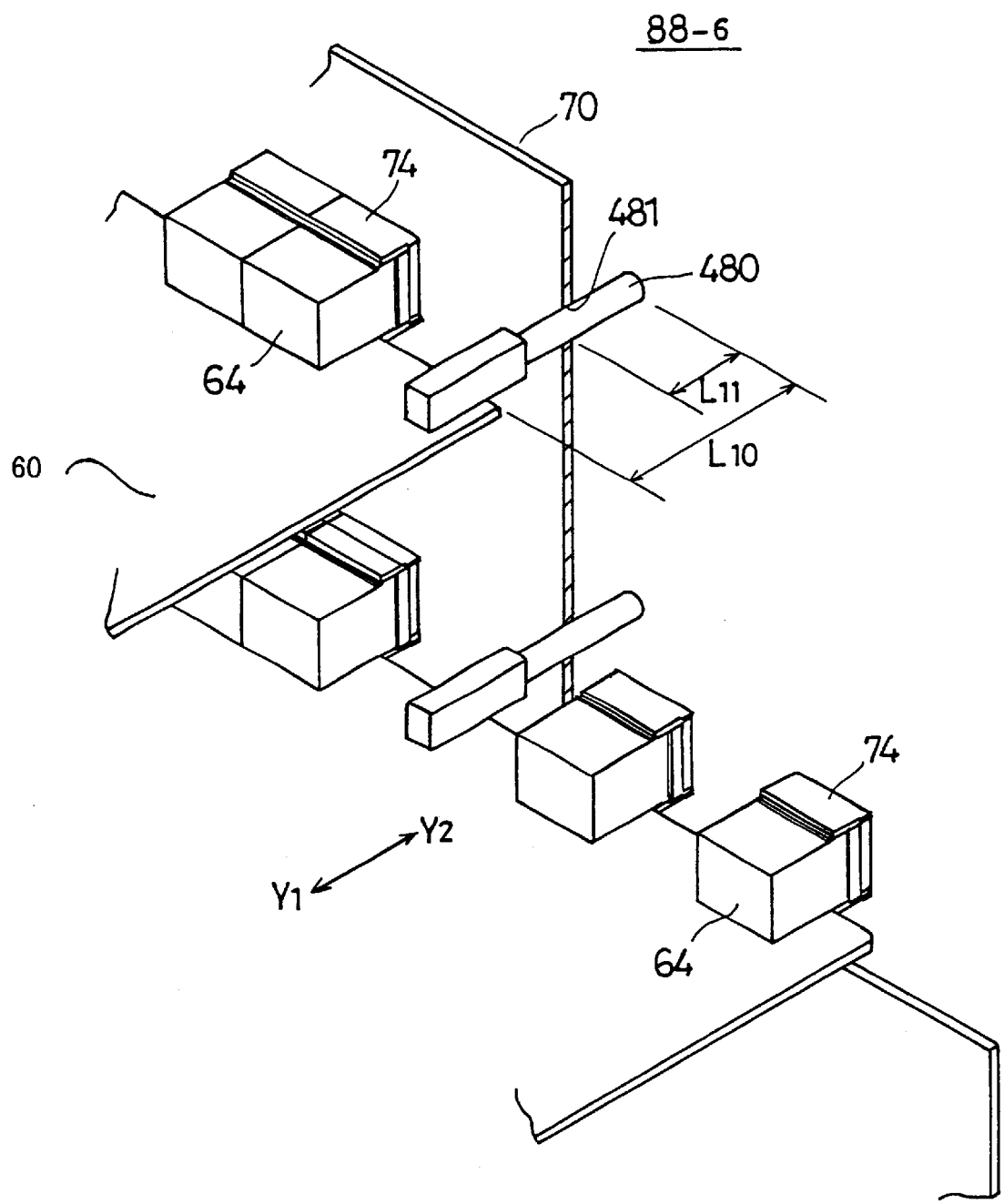
FIG. 38 is an illustration of a connection part of the crossbar-board and the first back panel, of a sixth variation of the crossbar board-back panel assembly shown in FIG. 2.

FIG. 38 is an illustration of a connection part of the crossbar-board 60 and the first back panel 70, of a crossbar board-back panel assembly 88-6, which is a sixth variation of the above-mentioned crossbar board-back panel assembly 88. The crossbar-board 60 comprises a pin 480 partly projecting from an edge thereof in the direction Y2 by a predetermined length L10. The first back panel 70 comprises a through hole 481 at a position corresponding to the pin 480.

The crossbar-board 60 is connected to the first back panel 70 by pushing the crossbar-board 60 in the direction Y2 so that the jack-connector 64 of the crossbar-board 60 is connected to the plug-connector 74 of the first back panel 70. Herewith, the pin 480 protrudes to the surface of the first back panel 70 in the direction Y2 through the through hole 481.

The jack-connector 64 and the plug-connector 74 cannot be seen from outside, because the jack-connector 64 and the plug-connector 74 are at the back side of the first back panel 70. Thus, it is hard to directly confirm by eye that the jack-connector 64 is properly connected to the plug-connector 74. However, judging from a length L11 of the pin 480 protruding from the first back panel 70, one can confirm indirectly that the jack-connector 64 is properly connected to the plug-connector 74. The pin 480 may be marked with scales to facilitate the confirmation.

Additionally, when the pin 480 is being inserted into the through hole 481, the pin 480 has a function to guide the jack-connector 64 to the plug-connector 74.

7. Seventh Variation

Figure 39:
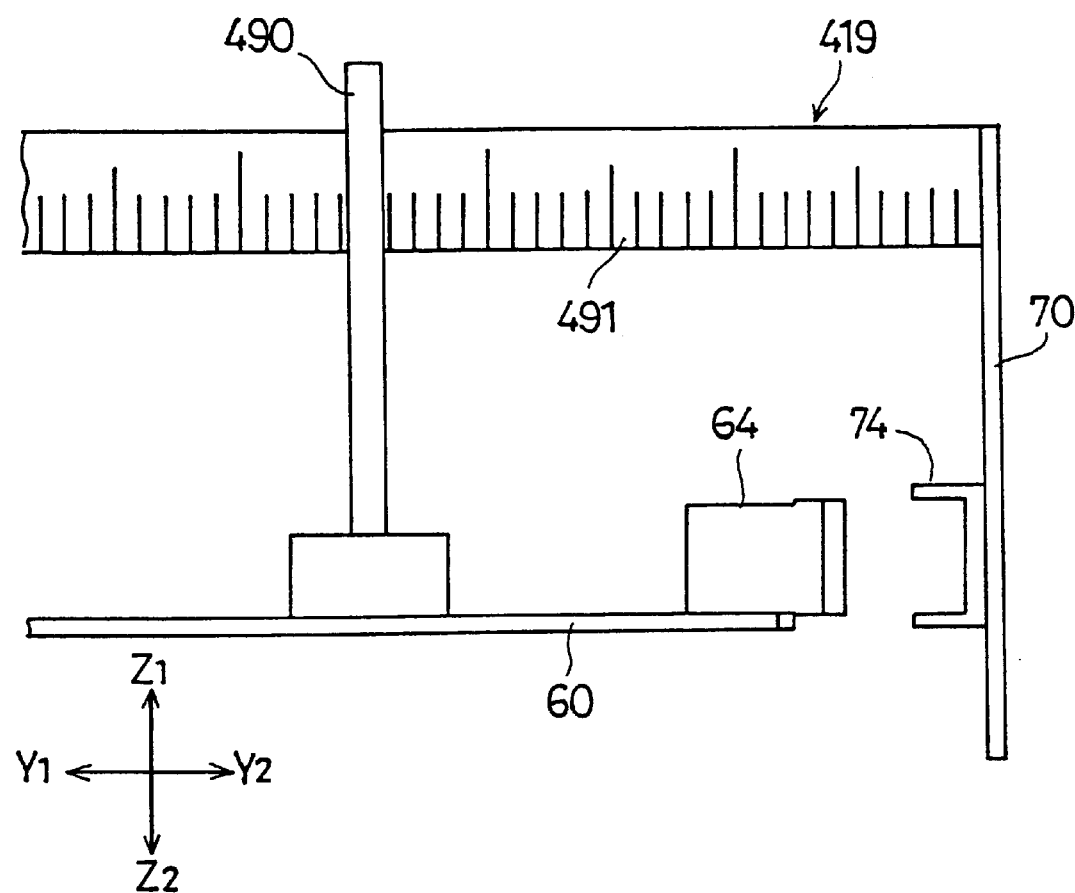
FIG. 39 is an illustration of a connection part of the crossbar-board and the first back panel, of a seventh variation of the crossbar board-back panel assembly shown in FIG. 2.

FIG. 39 is an illustration of a connection part of the crossbar-board 60 and the first back panel 70, of a crossbar board-back panel assembly 88-7, which is a seventh variation of the above-mentioned crossbar board-back panel assembly 88. The crossbar board-back panel assembly 88-7 is also a variation of the above-mentioned crossbar board-back panel assembly 88-6 shown in FIG. 38 as the sixth variation.

The crossbar-board 60 comprises a pin 490 arranged upright at a predetermined position on the surface thereof. The shelf 419 comprises a scale board 491 arranged perpendicular to the surface of the first back panel 70.

When the crossbar-board 60 is connected to the first back panel 70, the connection of the jack-connector 64 to the plug-connector 74 can be confirmed indirectly by judging from a position of the pin 490 on the scale board 491.

8. Eighth Variation

Figure 40:
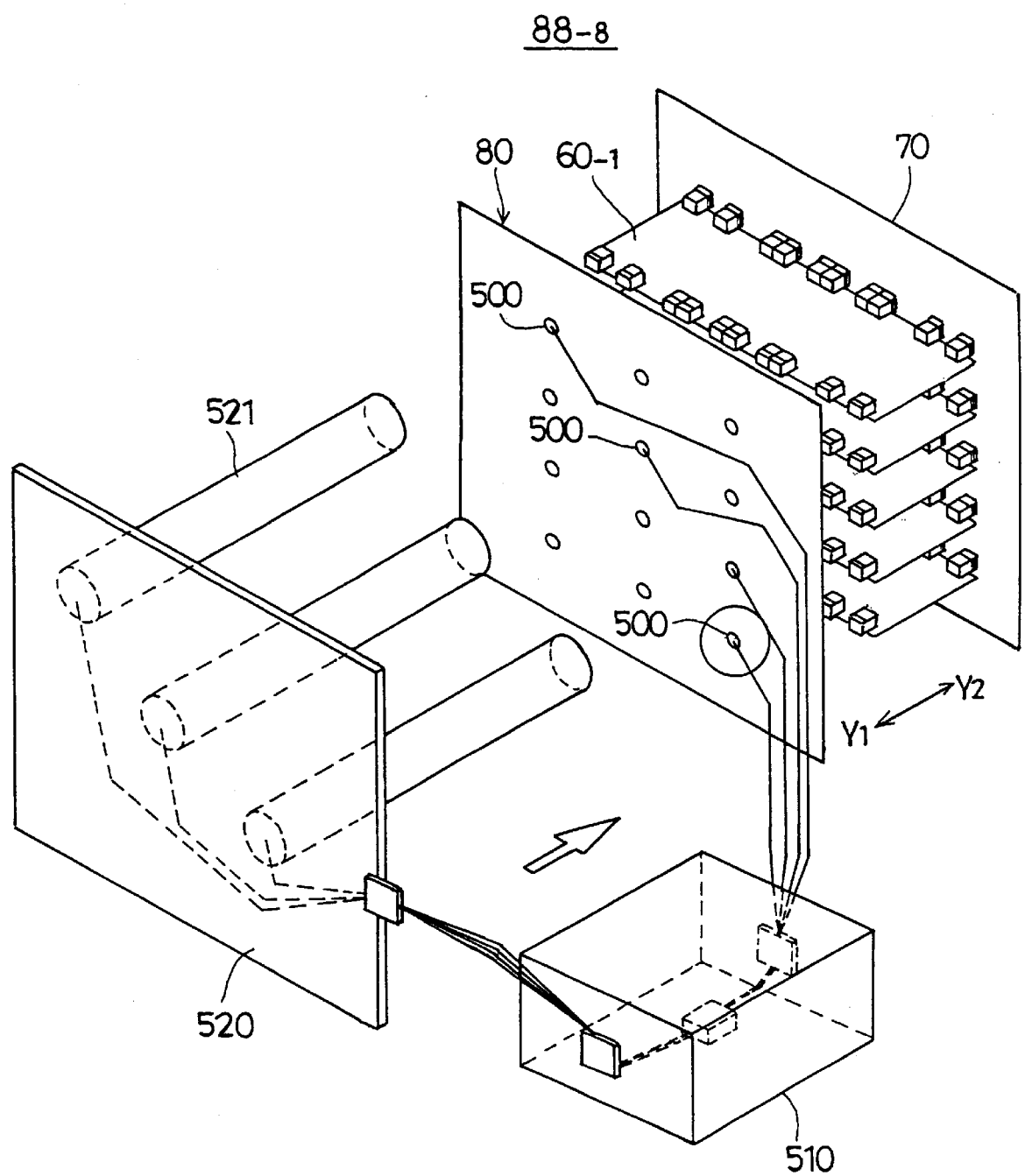
FIG. 40 is an illustration of an eighth variation of the crossbar board-back panel assembly shown in FIG. 2.

FIG. 40 is an illustration of a crossbar board-back panel assembly 88-8, which is an eighth variation of the above-mentioned crossbar board-back panel assembly 88. The crossbar board-back panel assembly 88-8 comprises: the first back panel 70; the crossbar-boards 60-1 to 60-5 connected thereto; and the second back panel 80 connected to the crossbar-boards 60-1 to 60-5.

The second back panel 80 comprises a plurality of load cells 500 dispersed in a matrix on the whole surface of the second back panel 80. Each of the load cells 500 detects a resistance that acts thereon when the second back panel 80 is connected to the crossbar-boards 60-1 to 60-5. Each of the load cells 500 is connected to a load-controlling device 510.

A pressurizing device 520 comprises a plurality of hydraulic pushers 521. These hydraulic pushers 521 of the pressurizing device 520 are individually under control of the load-controlling device 510.

When the crossbar board-back panel assembly 88-8 is assembled, the plurality of hydraulic pushers 521 push a plurality of parts of the second back panel 80 so that the second back panel 80 is connected to the crossbar-boards 60-1 to 60-5. The load-controlling device 510 controls the pressurizing device 520 to operate so that the hydraulic pushers 521 pushing the parts near the load cells 500 detecting a high resistance (the central parts of the second back panel 80, for example) provide more pressure than the other hydraulic pushers 521. Thereby, all of the plug-connectors 84 of the second back panel 80 are properly connected to the jack-connectors 64 of the crossbar-boards 60-1 to 60-5.

It is noted that the hydraulic pushers 521 may be replaced by pneumatic pushers.

9. Ninth Variation

Figure 41:
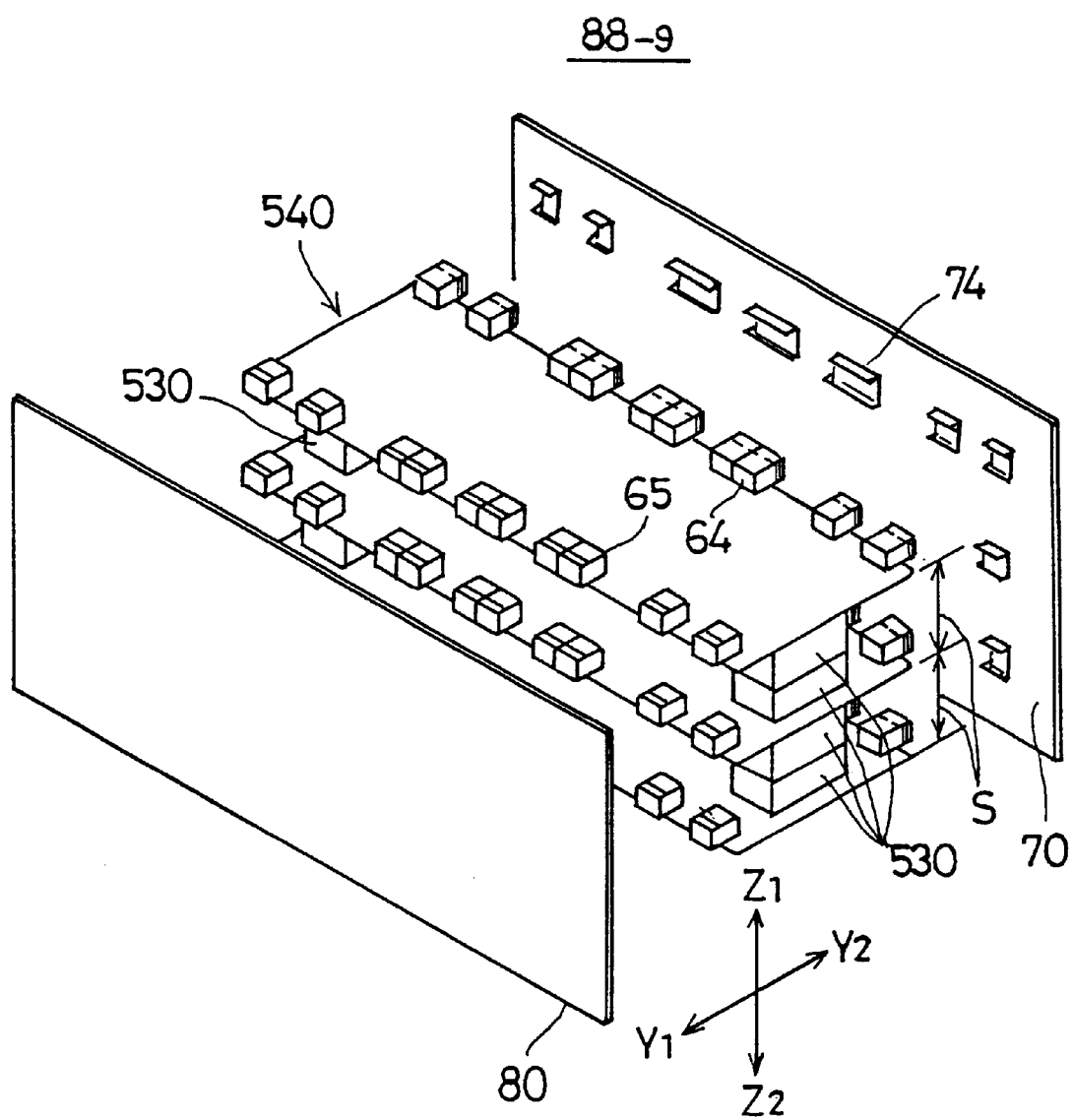
FIG. 41 is an illustration of a ninth variation of the crossbar board-back panel assembly shown in FIG. 2.

FIG. 41 is an illustration of a crossbar board-back panel assembly 88-9, which is a ninth variation of the above-mentioned crossbar board-back panel assembly 88. The crossbar board-back panel assembly 88-9 comprises: the first back panel 70; the crossbar-boards 60-1 to 60-3 connected thereto; and the second back panel 80 connected to the crossbar-boards 60-1 to 60-3.

Each of the crossbar-boards 60-1 to 60-3 comprises aligning connectors 530 on the upper and under surfaces thereof near both edges in the longitudinal directions. A crossbar-board assembly 540 is composed of the crossbar-boards 60-1 to 60-3 with the aligning connectors 530 thereof being placed on and connected to each other. Thus, the crossbar-boards 60-1 to 60-3 are connected to each other by the aligning connectors 530 near both edges in the longitudinal directions so as to be placed accurately to each other with a predetermined distance in between in the direction Z1-Z2.

The crossbar board-back panel assembly 88-9, in other words, comprises: the crossbar-board assembly 540; and the first back panel 70 and the second back panel 80 respectively connected to both sides thereof.

The crossbar-board assembly 540 also has the jack-connectors 64 and the jack-connectors 65 arranged with precision. Therefore, when the first back panel 70 is connected to the crossbar-board assembly 540, the plug-connectors 74 of the first back panel 70 are connected to the jack-connectors 64 smoothly. Likewise, when the second back panel 70 is connected to the crossbar-board assembly 540, the plug-connectors 84 of the second back panel 80 are connected to the jack-connectors 65 smoothly.

The present invention is not limited to the specifically disclosed embodiments, and variations and modifications may be made without departing from the scope of the present invention.

The present application is based on Japanese priority application No. 2000-246007 filed on Aug. 14, 2000, the entire contents of which are hereby incorporated by reference.

What is claimed is:

1. An information-processing device comprising:
   at least one crossbar-board having a switching element mounted thereon and having a square or a polygonal shape and excluding a circular shape;
   a plurality of back panels detachably connected electrically and mechanically to different sides of said crossbar-board; and
   at least one motherboard detachably connected electrically and mechanically to each of said back panels, the at least one motherboard having an information-processing semiconductor element mounted thereon, which is connected to the switching element at an equal length with respect to another information-processing semiconductor element, through said crossbar boards, said back panels, and said motherboard.

2. The information-processing device as claimed in claim 1, wherein said at least one crossbar-board is arranged perpendicular to a surface of each of said back panels.

3. The information-processing device as claimed in claim 1, wherein said at least one motherboard is arranged crosswise to said at least one crossbar-board.

4. The information-processing device as claimed in claim 1, wherein said back panels are connected to the different sides of said at least one crossbar-board by connectors.

5. The information-processing device as claimed in claim 4, wherein said at least one crossbar-board further comprises wiring patterns connecting said switching element and said connectors, the wiring patterns being formed to have an equal length.

6. The information-processing device as claimed in claim 1, wherein said at least one motherboard is connected to each of said back panels by connectors.

7. The information-processing device as claimed in claim 6, wherein said at least one crossbar-board further comprises wiring patterns connecting said switching element and said connectors, the wiring patterns being formed to have an equal length.

8. The information-processing device as claimed in claim 1, wherein lengths of wirings formed on the at least one crossbar-board from the switching element mounted thereon to each connection point of each of the plurality of back panels are equal to or longer than a distance between the switching element and a furthest connection point.

9. An information-processing device comprising:
- a crossbar board-back panel assembly comprising a plurality of crossbar-boards each having a switching element mounted thereon and having a square or a polygonal shape and excluding a circular shape;
- a plurality of back panels detachably connected electrically and mechanically to different sides of each of said crossbar-boards; and
- a plurality of motherboards detachably connected electrically and mechanically to each of said back panels, each of the plurality of the motherboards having an information-processing semiconductor element mounted thereon, which is connected to the switching element at an equal length with respect to other information-processing semiconductor elements, through said crossbar boards, said back panels, and said motherboard.

10. The information-processing device as claimed in claim 9, wherein lengths of wirings formed on the plurality of crossbar-boards from the switching element mounted thereon to each connection point of each of the plurality of back panels are equal to or longer than a distance between the switching element and a furthest connection point.

11. An information-processing device comprising:
- a switching element;
- a crossbar-board having the switching element mounted thereon and having a square or a polygonal shape and excluding a circular shape;
- a first back panel detachably connected electrically and mechanically to one side of said crossbar-board;
- a second back panel detachably connected electrically and mechanically to another side of said crossbar-board;
- connectors mounted along longitudinal sides of the crossbar-board; and
- a motherboard detachably connected using the connectors to said first and second back panels; and
- wiring patterns formed over said crossbar board, one of said first and second back panels and said mother board comprising equal length to connect said switching element and said connectors.

12. The information-processing device as claimed in claim 11, wherein lengths of wirings formed on the crossbar-board from the switching element mounted thereon to each connection point of each of the first and second back panels are equal to or longer than a distance between the switching element and a furthest connection point.

* * * * *